United States Patent [19]
Jekal

[11] Patent Number: 6,088,404
[45] Date of Patent: Jul. 11, 2000

[54] METHOD AND APPARATUS FOR DECODING TRELLIS CODE DATA

[75] Inventor: Heon Jekal, Seoul, Rep. of Korea

[73] Assignee: Daewoo Electronics Co., Ltd., Seoul, Rep. of Korea

[21] Appl. No.: 09/064,931

[22] Filed: Apr. 22, 1998

[30] Foreign Application Priority Data

Apr. 30, 1997 [KR] Rep. of Korea ............. 97-16788

[51] Int. Cl.[7] ............. H03D 1/00; H04L 27/06
[52] U.S. Cl. ............. 375/341; 375/262; 714/794; 714/796
[58] Field of Search ............. 375/262, 263, 375/264, 265, 286, 290, 341, 346, 285, 259, 260; 714/792, 794, 795, 796

[56] References Cited

U.S. PATENT DOCUMENTS

| | | | |
|---|---|---|---|
| 5,717,471 | 2/1998 | Stewart | 348/726 |
| 5,838,729 | 11/1998 | Hu et al. | 375/265 |
| 5,841,819 | 11/1998 | Hu et al. | 375/341 |

FOREIGN PATENT DOCUMENTS

| | | |
|---|---|---|
| 0677967 | 10/1995 | European Pat. Off. . |
| 0801501 | 10/1997 | European Pat. Off. . |
| 9319418 | 9/1993 | WIPO . |
| 9602100 | 1/1996 | WIPO . |
| 9836500 | 8/1998 | WIPO . |

*Primary Examiner*—Chi H. Pham
*Assistant Examiner*—Jean B. Corrielus
*Attorney, Agent, or Firm*—Andersson Kill & Olick, P.C.

[57] ABSTRACT

A method for decoding a trellis encoded stream $d_k$ by the use of either an 8 state maximum likelihood response decoding mode through a Gaussian channel or a 16 state partial response decoding mode through a partial response channel is disclosed. In response to a mode selection signal FENA, after passing off the trellis encoded stream for the 8 state mode and removing the influence of a segment synchronization signal from the trellis encoded stream for the 16 state mode, all branch metrics with different values in parallel for either the 8 or the 16 state mode. After selecting a predetermined number of branch metrics required for each state among all the branch metrics of either the 8 or the 16 state mode determined based on the FENA and finding the predetermined number of candidate path metrics and determining a survivor metric and a determination vector thereof, a decoded symbol is determined by tracing back for a decoding depth in response to the FENA based on the determination vector of each state.

49 Claims, 31 Drawing Sheets

METHOD AND APPARATUS FOR DECODING TRELLIS CODE DATA

FIELD OF THE INVENTION

The present invention relates to a TCM decoder for decoding signals encoded by a trellis-coded modulation (TCM) and, more particularly, to a method and an apparatus capable of decoding trellis code data in both 8 state Gaussian channel mode and 16 state partial response channel mode in a forward error correction decoder for HDTV.

DESCRIPTION OF THE PRIOR ART

Recently, there has been increasing interest in some types of combined modulation and coding schemes, called trellis-coded modulation(TCM), that achieve coding gain without any bandwidth expansion in a bandwidth-limited channel. The TCM includes a finite-state encoder and a non-binary modulator. Therefore, as compared with a conventional modulation, the TCM can achieve net coding gains of 3 to 6 dB, relative to uncoded case, in the presence of an additive white Gaussian noise(AWGN).

In a concatenated coding technique implementing a concatenated coding by connecting two different coders, e.g., an inner and an outer coders, so as to advance data reliability, a well known convolutional encoder or a TCM encoder is used as the inner coder and data encoded by the inner coder are decoded by a trellis decoder employing a Viterbi algorithm. A Reed-Solomon coder can be used as the outer coder. The outer coder corrects errors which have not been corrected at the inner coder to thereby minimize the rate of errors. This concatenated coding technique achieves more advanced implementation with less complex hardware than a coding technique having one coding method.

At a receiving end, the TCM data are decoded through the use of the trellis decoder. The trellis decoder is a maximum likelihood decoder that provides a forward error correction. Trellis decoding is used in decoding a sequence of encoded symbols, such as a bit stream. The bit stream can represent encoded information in telecommunication transmission through various media with each set of bits representing a symbol instant. In the decoding process, the trellis decoder works back through a sequence of possible bit sequences at each symbol instant to determine which bit sequence could most likely have been transmitted. The possible transitions from a bit at one symbol instant, or state, to a bit at a next, subsequent, symbol instant or state are limited. Each possible transition from one state to a next state can be shown graphically and defined as a branch. A sequence of interconnected branches defines a path. Each state can transit only to a limited number of next states upon receiving a next bit in the bit stream. Thus, some paths survive during the decoding process and the other paths do not. By eliminating those transition paths that are not permissible, computational efficiency can be improved in determining those paths most likely to survive. The trellis decoder typically defines and calculates a branch metric associated with each branch and employs this branch metric to determine which paths will survive and which paths will not.

A branch metric is calculated at each symbol instant for each possible branch. Each path has an associated metric, an accumulated value, that is updated at each symbol instant. For each possible transition, the accumulated value for the next state is obtained by selecting the smallest of the sums of the branch metrics for different possible transitions and the path metrics from the previous states.

While several paths may survive at the transition from one symbol instant to a next symbol instant, there is only one path accumulated with a minimum value. A sequence of symbol instants is referred to as a trace-back. The number of symbol instants tracing back through the trellis that extends a path with the minimum accumulated value defines the length, or decoding depth D, of a trace-back. The individual state in the trellis associated with the minimum accumulated value in a trace-back is translated into most likely bits that could have been transmitted in that symbol instant. The bits are referred to as a decoded symbol.

Referring to FIG. 1, there is shown a schematic block diagram of a conventional trellis decoder including a branch metric calculation unit(BMU) 11, an add-compare-select unit(ACS) 12, a path metric network(PMN) 13, and a survivor memory unit(SMU) 14.

The branch metric calculation unit 11 receives a sequence of transmitted symbols and calculates branch metrics, i.e., distances between branches associated with each state and the transmitted symbol. The branch metrics are provided to the add-compare-select unit 12. The add-compare-select unit 12 chooses a path having a minimum path metric among paths corresponding to each state. Specifically, the add-compare-select unit 12 adds the branch metrics provided from the branch metric calculation unit 11 to corresponding previous path metrics from the path metric network 13; and compares candidate path metrics, i.e., the sums of the branch metrics and the corresponding previous path metrics with one another to thereby choose a new path metric having a smallest value. The selected path metric is provided to the path metric network 13 as a new path metric for each state and information for tracing back on the selected path is coupled to the survivor memory unit 14. The survivor memory unit 14 stores the information from the add-compare-select unit 12 as the length of a survivor path, i.e., a decoding depth in order to decode the transmitted symbols and outputs decoded data by tracing back to the survivor path based on a trace-back algorithm.

One example of trellis decoders having the above structure is a decoder used in a GA HDTV receiving system proposed by a Grand Alliance(GA). The GA HDTV transmission system encodes data in an 8-level vestigial sideband modulation (VSB) mode and transmits the coded data on a frame-by-frame basis.

Referring to FIG. 2 representing a data frame structure used in the GA HDTV transmission system, a frame consists of two fields and each field is divided into 313 segments. Each segment includes a segment synchronization signal of 4 symbols and 828 (data+forward error correction symbol (FEC))'s and a first segment of each field is allotted to a field synchronization signal.

In order to produce a transmission signal, a randomized signal is coded by using Reed-Solomon coding; interleaved; and trellis-coded. The trellis coded signal is incorporated with the segment synchronization and the field synchronization signals and the incorporated signal is combined with a pilot signal. The combined signal is modulated through the VSB and transmitted by a carrier.

Referring to FIG. 3, there is provided a convolutional trellis coding block for 8-level VSB mode, which includes a pre-coder 30, a trellis encoder 32, and an 8-level symbol mapper 34.

A higher input bit X1 is exclusive-ORed with a 12 symbol delayed previous bit at the pre-coder 30 and, then, the exclusive-ORed signal is outputted as a middle output bit Y1. The middle output bit Y1 is directly inputted to the 8-level symbol mapper 34 as an input bit Z2 without being coded at the trellis encoder 32. A lower input bit X0 is convolutionally encoded in a coding rate of 1/2 at the trellis encoder 32 so that two output bits Z1 and Z0 are generated and, then, the convolutionally encoded bits Z1 and Z0 are provided as input bits to the 8-level symbol mapper 34. The input bits Z2, Z1 and Z0 provided from the trellis encoder 32 of a coding rate 2/3 are converted to 8-level symbols(R: −7, −5, −3, −1, 1, 3, 5, 7) at the 8-level symbol mapper 34 so that an 8-level VSB modulation signal can be transmitted.

In the meantime, the trellis coding has a strong characteristic against the AWGN but a weak characteristic against a group error and, therefore, input symbols may be sequentially inputted to 12 trellis coding blocks which are connected in parallel so that the input symbols may be 12 symbol intra-segment interleaved as can be shown in FIG. 4.

Referring to FIG. 4, a trellis code interleaver comprises an input switch 40, 12 trellis encoders E1 to E12 and an output switch 42, wherein the input switch 40 converts interleaved data transmitted on a packet-by-packet basis to a symbol-by-symbol basis, each symbol having two bits, i.e., X1 and X0; each trellis encoder containing the pre-coder 30 and the trellis encoder 32 as shown in FIG. 3 sequentially receives the interleaved symbols connected to each of the 12 outputs of the input switch 40; and the output switch 42 sequentially transfers the outputs of the trellis encoders E1 to E12 to the 8-level symbol mapper 34. It is noted that the input switch 40 and the output switch 42 are synchronized with each other.

In FIG. 5, there is provided a block diagram of a trellis code deinterleaver in a GA HDTV receiving system. Since TCM codes have been interleaved by a unit of 12 symbols at the trellis code interleaver, the trellis code deinterleaver must involve 12 number of trellis decoders D1 to D12 connected in parallel in order to deinterleave transmitted data. Accordingly, each of the trellis decoders deinterleaves to decode every 12th symbol sequentially inputted.

The TCM decoding path has two different paths depending on whether an NTSC interference rejection filter is used or not as shown in FIG. 6. Referring to FIG. 6, in case the NTSC interference rejection filter is not used, an optimal response trellis decoder 65 which performs 8-state mode decoding for a real channel with the AWGN is only utilized in order to restore input symbols. On the other hand, in the event the NTSC interference rejection filter 61 is used, the output signals of the filter 61 is changed from 8 to 15 levels according to the transfer function of the filter and, therefore, a partial response trellis decoder 63 which performs 16 state mode decoding should be utilized.

As can be seen above, the conventional trellis decoder contains either only the 8-state mode optimal trellis decoder 65 or both the 8-state mode optimal trellis decoder 65 and the 16-state mode partial response trellis decoder 63, depending on whether the NTSC interference rejection filter 61 is used or not. Therefore, there is a problem that an area occupied by a number of trellis decoders increases.

SUMMARY OF THE INVENTION

It is, therefore, a primary object of the present invention to provide an apparatus capable of decoding trellis code data in both 8 state mode and 16 state mode in a smallest area with complexity of only 16 state mode.

In accordance with the present invention, there is provided a method for decoding a trellis encoded stream $d_k$ by the use of either an 8 state maximum likelihood response decoding mode, in short, an 8 state mode, through a Gaussian channel or a 16 state partial response decoding mode, in short, a 16 state mode, through a partial response channel, wherein the trellis encoded stream $d_k$ is obtained by an M symbol intra-segment interleaving technique using M number of trellis encoders and an index k for identifying a trellis encoded stream generated from a kth trellis encoder among total M trellis encoders is equal to or greater than 1 and equal to or smaller than M, M being a positive integer representing the number of the trellis encoders, the method comprising the steps of:

(a) in response to a mode selection signal FENA, passing off the trellis encoded stream for the 8 state mode and removing the influence of a segment synchronization signal from the trellis encoded stream for the 16 state mode;

(b) calculating all branch metrics with different values in parallel for either the 8 or the 16 state mode determined based on the FENA;

(c) selecting a predetermined number of branch metrics required for each state among all the branch metrics of either the 8 or the 16 state mode determined based on the FENA, thereby finding the predetermined number of candidate path metrics and determining a survivor metric and a determination vector thereof, wherein the survivor metric represents a candidate path metric with a maximum likelihood among all the candidate path metrics;

(d) providing the survivor metric for said each state determined in step (c) as a previous path metric for a previous state;

(e) tracing back for a decoding depth of the 8 or the 16 state mode in response to the FENA based on the determination vector of said each state determined in step (c), thereby finding a decoded symbol; and (f) intra-segment deinterleaving the decoded symbol and converting the intra-segment deinterleaved decoded symbol in the unit of a predetermined size of packet.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

An embodiment of the present invention is illustrated to design a trellis decoder, which may decodes trellis code data encoded according to a transmission specification of the Grand Alliance high definition television (GA HDTV).

Figure 4:
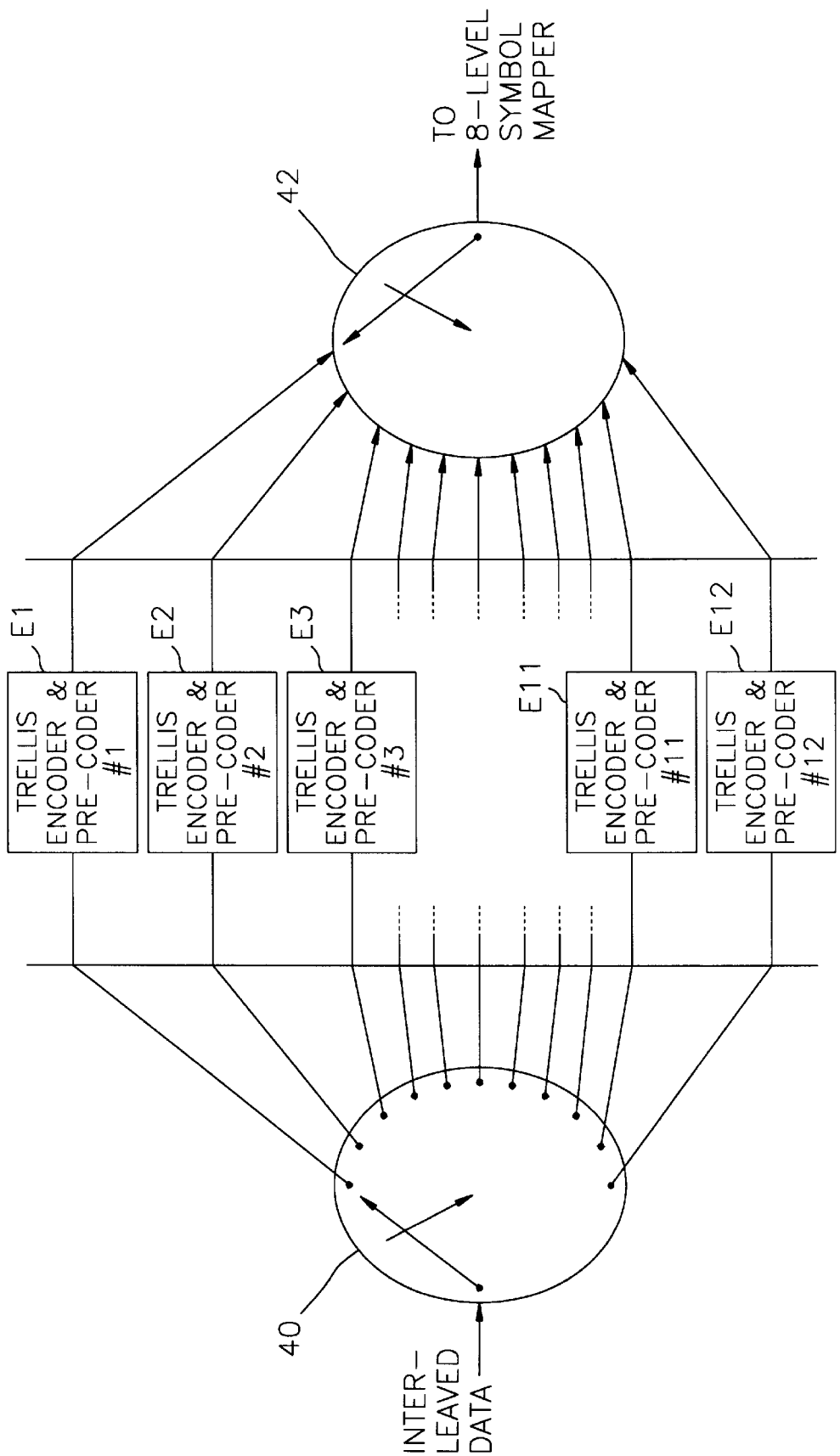
FIG. 4 depicts a block diagram of a trellis code interleaver for carrying out an intra-segment interleaving.

Referring to Table 1, there is illustrated coded streams in the unit of a segment, wherein each coded stream is provided through a trellis code interleaver, shown in FIG. 4, employed in GA HDTV.

TABLE 1

| segment | group 1 | group 2 | ... group 69 |
| --- | --- | --- | --- |
| #1 | d1, d2 ... d12 | d1, d2 ... d12 | ... d1, d2 ... d12 |
| #2 | d5, d6 ... d4 | d5, d6 ... d4 | ... d5, d6 ... d4 |
| #3 | d9, d10 ... d8 | d9, d10 ... d8 | ... d9, d10 ... d8 |

In Table 1, since each group is carried out by a 12 symbol intra-segment interleaving, it is classified in the unit of 12 symbols and an index attached to each data is identical to that of a corresponding trellis encoder shown in FIG. 4. That is, d1 is data fed from a first trellis encoder(E1), d2 is data fed from a second trellis encoder(E2) and so on. The data stream fed from each trellis encoder is periodically repeated with a period of 3 segments. For example, the first segment #1 starts with the data d1 fed from the first trellis encoder (E1) and includes d2, d3, d4, . . . and d12 in sequence; the second segment #2 starts with the data d5 fed from the 5th trellis encoder(E5) and includes d6, d7, d8, . . . and d4 in sequence; and the third segment #3 starts with the data d9 fed from the 9th trellis encoder(E9) and includes d9, d10, d11, . . . and d8 in sequence. The above sequence results from a switching operation of the interleaver during the receipt of 4 symbols of segment synchronization signal. Therefore, the data stream di with an index i shown in Table 1 should be applied to a trellis decoder Di with the same index i. That is, d1 is available to a first trellis decoder(D1), d2 is available to a second trellis decoder(D2) and so on.

Figure 1:
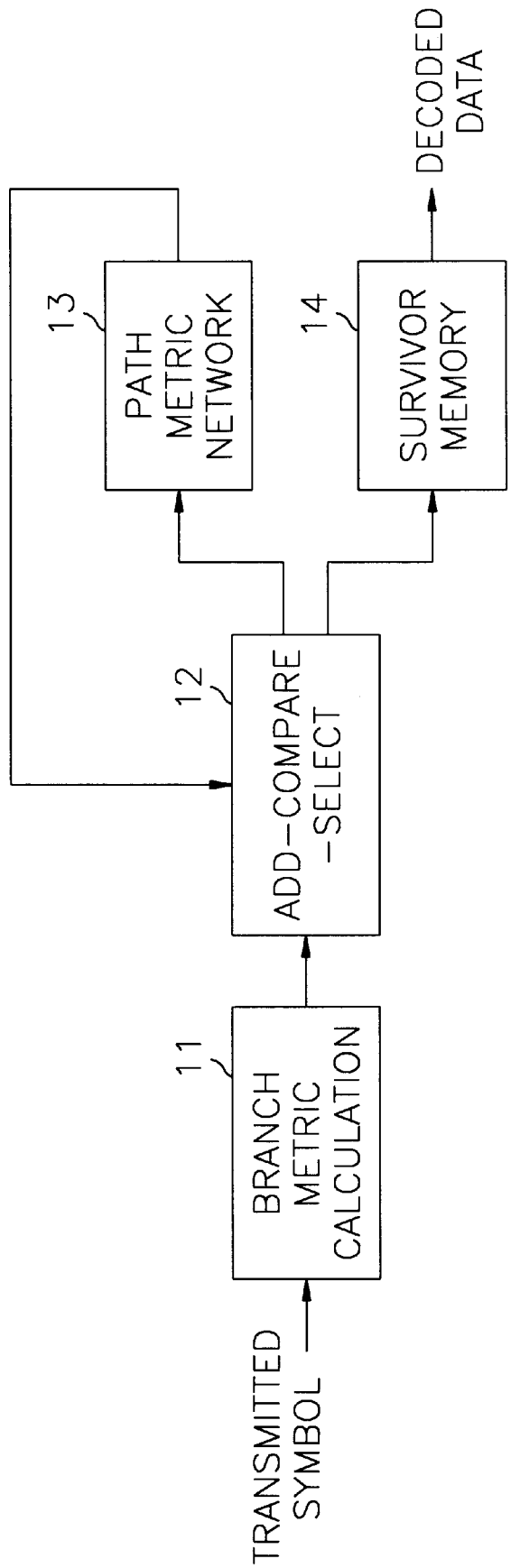
FIG. 1 shows a block diagram of a conventional trellis decoder applied with a Viterbi algorithm.
Figure 2:
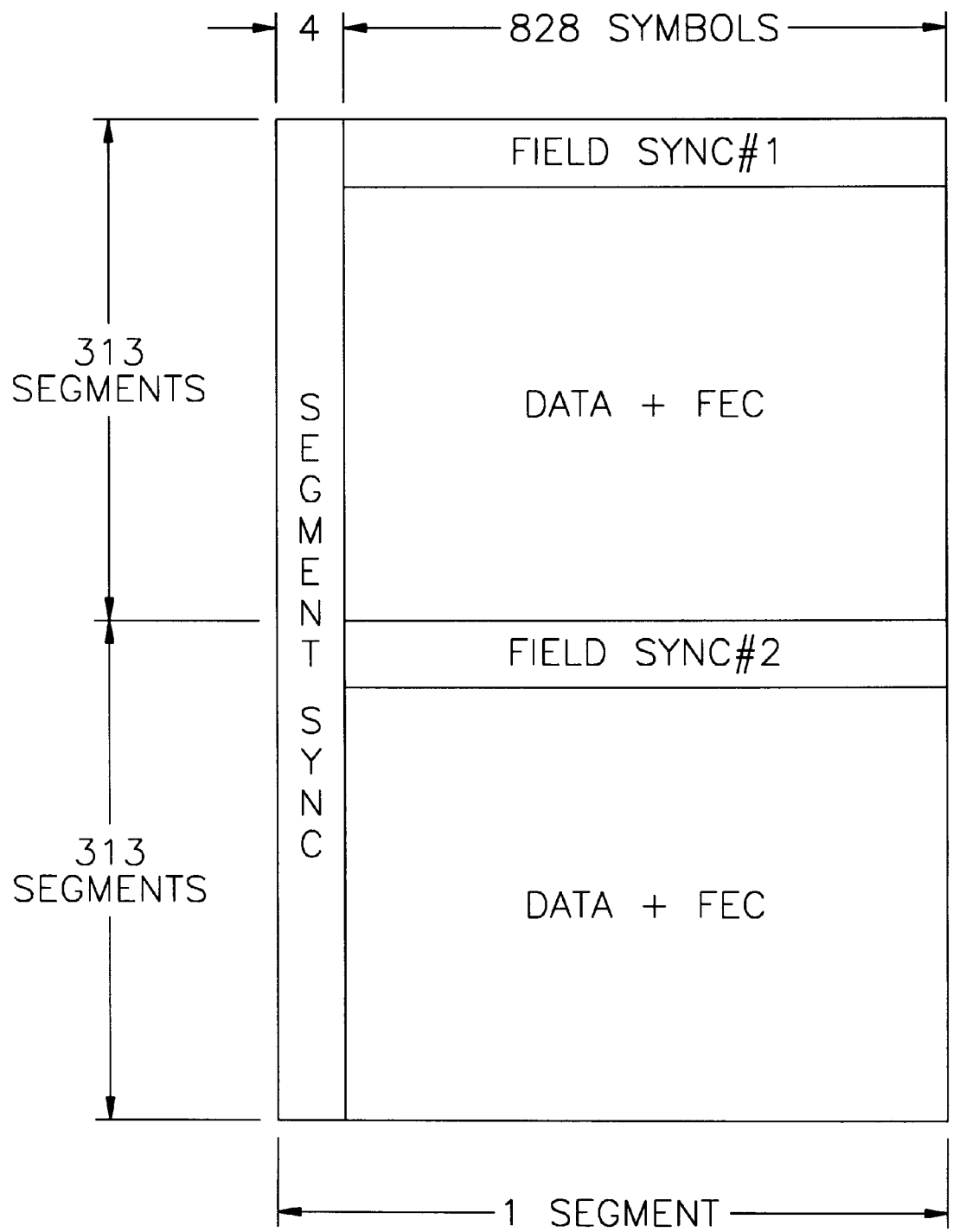
FIG. 2 presents a data frame in a transmission system of Grand Alliance high definition television (GA HDTV)

Since a conventional GA HDTV receiver employs 12 trellis decoders as shown in FIG. 1 to perform 12 symbol intra-segment deinterleaving and decoding at the same time, only one decoder operates every 12th symbol and the remaining 11 decoders do not operate at all. That is, the whole 12 trellis decoders used in the receiver do not operate simultaneously for every data input so that it will be possible to use only one trellis decoder by performing a time-division multiplexing technique in the unit of 12 symbols. Although 12 trellis decoders may be simply designed by duplicating the same decoding unit, a much larger space will be needed. Meanwhile, one trellis decoder by the time-division multiplexing technique has a little complex design but requires a smaller space.

The trellis decoder in the present invention is designed to include only one trellis decoder by employing the time-division multiplexing technique so as to be used in two mode, i.e., 8 and 16 state mode according to the characteristics of channels. The specification for a trellis coded modulation(TCM) decoder in the present embodiment is defined as follows:

TABLE 2

|  | 16 state mode TCM | 8 state mode TCM |
| --- | --- | --- |
| decoding depth | 15 | 10 |
| branch metric | 9 bits | 8 bits |
| path metric | 10 bits | 9 bits |
| state | 4 bits | 3 bits |

A larger bit number and a higher decoding depth are required in order to design the 16 state mode TCM as shown in Table 2. This means that much more registers are needed in the path metric network (PMN) and the survivor memory unit (SMU). The trellis decoder in accordance with the present invention does not include both the 8 state mode and the 16 state mode separately, but is designed basically with the specification of the 16 state mode which can also be used in the 8 state mode.

Figure 7:
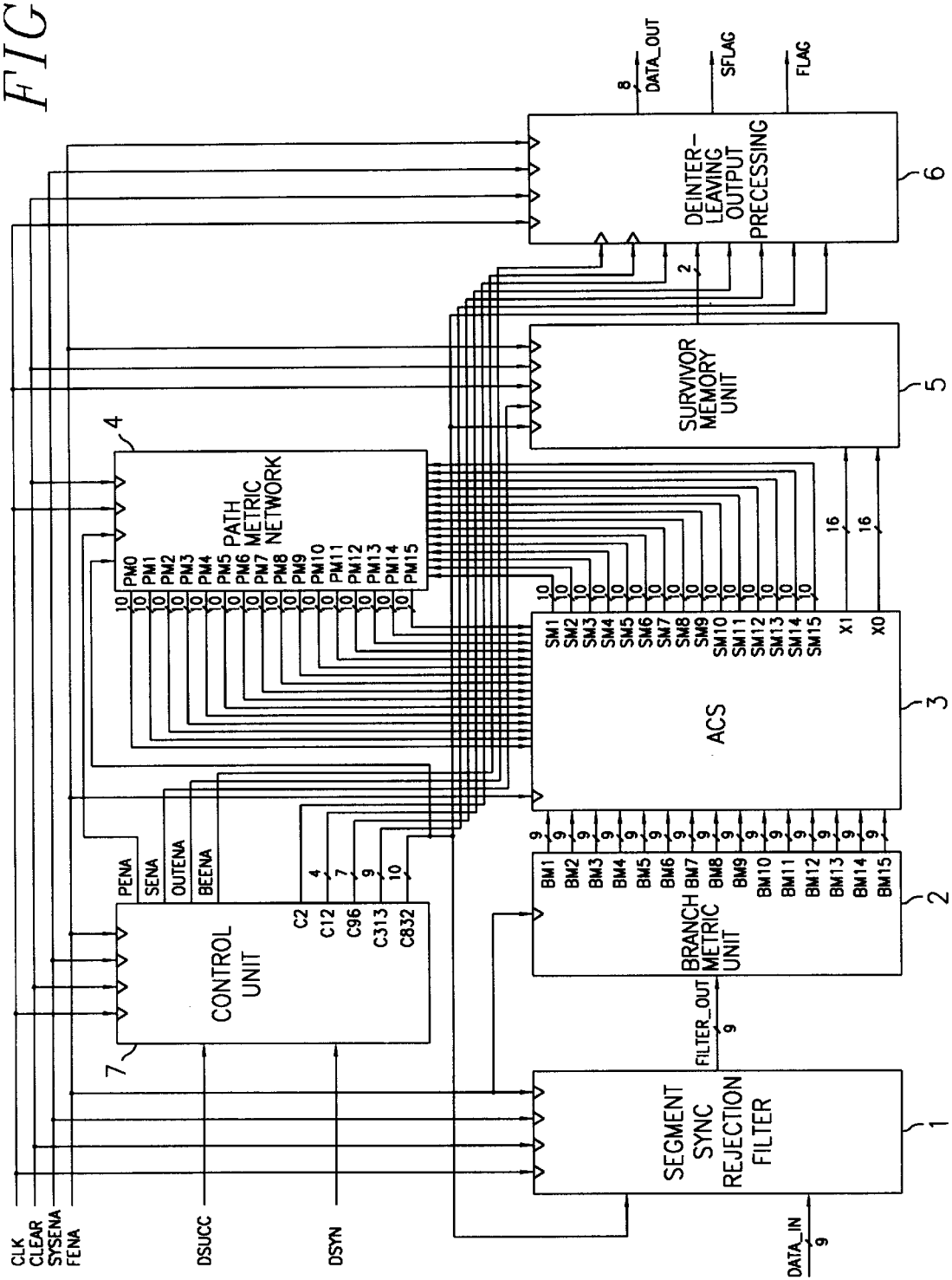
FIG. 7 describes a block diagram of a trellis decoder in accordance with the present invention.

Referring to FIG. 7, there is a block diagram of a trellis decoder in accordance with the present invention, which comprises a segment synchronization rejection filter 1, a branch metric calculation unit (BMU) 2, an add-compare-select unit(ACS) 3, a path metric network(PMN) 4, a survivor memory unit (SMU) 5, a deinterleaving and output processing unit (DOUT) 6 and a control unit 7.

As illustrated above, the trellis decoder basically comprises the BMU 2, the ACS 3 and the SMU 5. Further, the PMN 4 is required for providing previous path metrics in order to calculate new path metrics for each new state. Since input symbols in the 16 state mode should pass through an NTSC interference rejection filter, the segment synchronization rejection filter 1 precedes the BMU 2 in order to remove the influence of the segment synchronization signals. In order to carry out an intra-segment deinterleaving process in the unit of byte on decoded data, which is provided from the SMU 5 in the unit of symbol (2-bits), the DOUT 6 follows the SMU 5. The control unit 7 is added in order to generate control signals needed to control the respective elements.

If trellis code data received corresponds to the 8 state mode, the segment synchronization rejection filter 1 passes the trellis code data based on a mode selection signal (FENA) and, otherwise, i.e., if the trellis code data corresponds to the 16 state mode, the segment synchronization rejection filter 1 removes the influence of the segment synchronization signal to generate a to-be-decoded symbol. The BMU 2 receives the to-be-decoded symbol from the segment synchronization rejection filter 1 and calculates all branch metrics which can be generated for each of two modes based on the FENA as follows: 7 branch metrics BM1 to BM7 are generated in the 8 state mode, while 15 branch metrics BM1 to BM1 are calculated in the 16 state mode. The ACS 3 receives the FENA and all the branch metrics from the BMU 2; selects several branch metrics $BM_{i,1}$ to $BM_{i,4}$ required for each state $S_i(t)$, which can be generated in each of two state modes; accumulates the branch metrics for each state and previous path metrics $PM_{i,1}$ to $PM_{i,4}$, fed from the PMN 4, for the previous states associated with the selected branch metrics to determine new candidate path metrics; and provides a most likely path metric as a survivor metric $SM_i$ for each state with a determination vector $DV_i$ for the survivor metric. The PMN 4 temporally stores the survivor metric $SM_i$ for each state from the ACS 3 and provides the stored survivor metric $SM_i$ to the ACS 3 as a previous path metric $PM_i$ for a next state. The SMU 5 receives the determination vector $DV_i$=(X1, X0) for each state from the ACS 3 based on the FENA; and tracing back a previous state for each of the two modes as far as a decoding depth based on the determination vectors $DV_i$'s by a traceback algorithm to generate a decoded symbol (decoded_out) with 2 bits. The DOUT 6 carries out an intra-segment deinterleaving process for the decoded symbol fed from the SMU 5 based on the FENA and, then, converts the 2 bit decoded symbol into the unit of packet, i.e., 8 bits in order to be adapted to a next unit.

Figure 8:
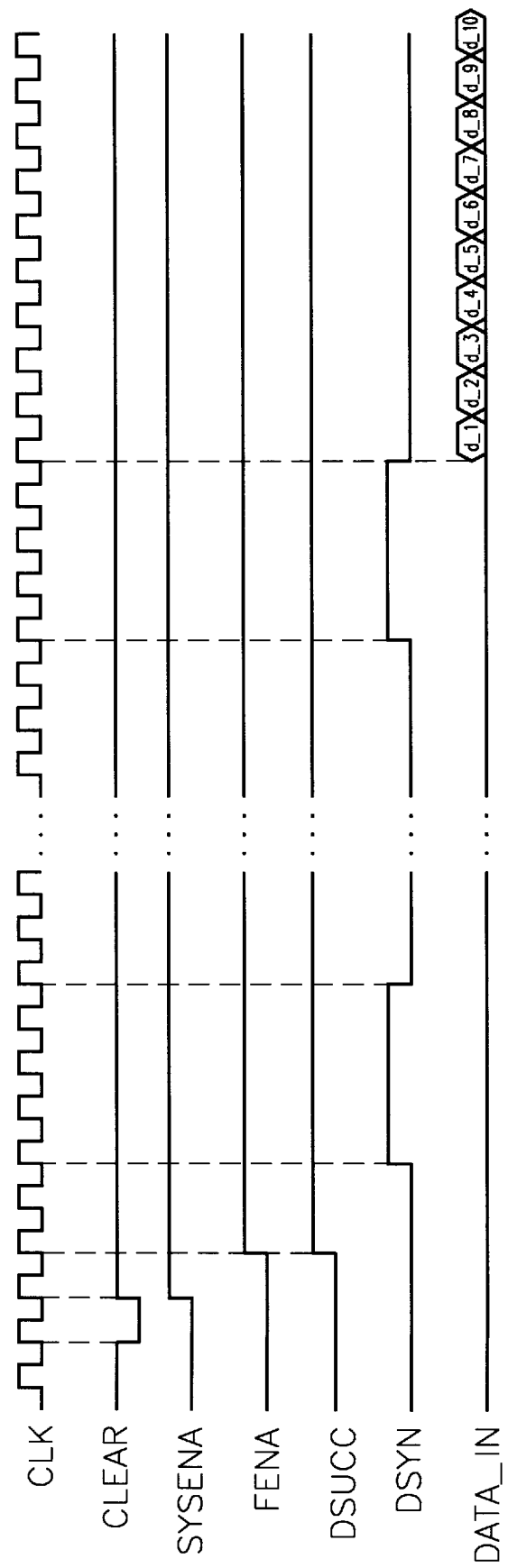
FIG. 8 portrays a timing diagram of input signals inputted into the trellis decoder shown in FIG. 7.

Referring to FIG. 8, a timing diagram of input signals into the TCM decoder and the function of the input signals will be described as follows:

1. CLK: a clock signal in which an ascending edge represents an enable state;
2. CLEAR: a clear signal to reset the system;
3. SYSENA: a system enable signal to make the entire system enable;
4. DSUCC: a demodulation success signal to indicate that VSB modulation signals at the front end of the TCM decoder are successfully decoded, wherein, if the VSB modulation signals are successfully decoded, the TCM decoder may be operated while the DSUCC remains '1';
5. DSYN: a signal to represent whether a segment synchronization signal is received or not, wherein the segment synchronization signal with 4 symbols may be received while the DSYN remains '1';
6. FSYN: a signal to show whether a field synchronization signal is received or not, wherein the field synchronization signal with 828 symbols is received while the FSYN remains '1';
7. FENA: a signal to indicate whether or not the NTSC interference rejection filter is used according to the channel characteristics, wherein a FENA signal value '1' represents the TCM decoder is operated in the 16 state mode, while a FENA signal value '0' represents the TCM decoder is operated in the 8 state mode; and
8. DATA_IN: an input of the trellis encoded data, wherein the trellis encoded data is received in the unit of symbol each clock.

Figure 9:
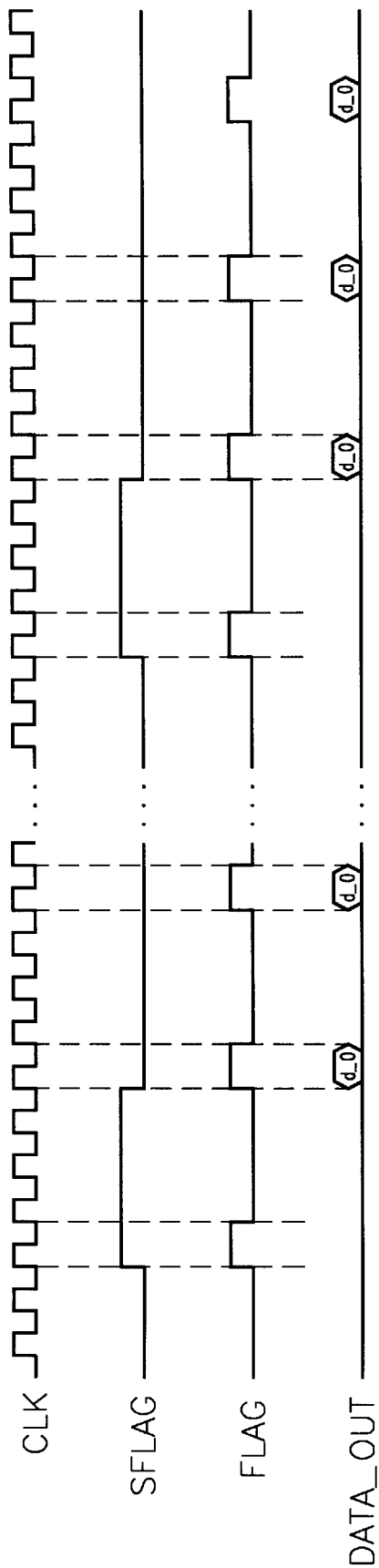
FIG. 9 delineates a timing diagram of output signals fed from the trellis decoder shown in FIG. 7.

Referring to FIG. 9, there is illustrated a timing diagram of output signals fed from the TCM decoder shown in FIG. 7 and the function of the output signals will be described as follows:

1. SFLAG: a signal to indicate whether the segment synchronization signal is provided or not, wherein the segment synchronization signal with 4 symbols may be generated while the SFLAG remains '1';
2. FLAG: a signal to show whether valid decoded data is generated or not, wherein the valid decoded data is provided while the FLAG remains '1'.
3. DATA_OUT: an output of the decoded data from the TCM decoder, wherein the decoded data is provided in the unit of packet with 8 bits at every 4th clock.

While the field synchronization signal is received, the trellis decoded data must not be outputted and the FLAG signal remains '0'. Since both the FLAG signal and the SFLAG signal at the first clock of 4 clocks, during which the segment synchronization signal is outputted, remain '1', output data provided during the first clock must not be valid.

While, input data in the encoding process is transmitted in the unit of frame as described above, wherein each frame consists of 2 fields and each field consists of 313 segments. The first segment (segment #1) is for the field segment synchronization signal and the remaining 312 segments are for valid data. Each segment has 208 packets, i.e., 832 symbols (=208×4 symbols) so that each packet has 8 bits and the first packet, i.e., the first 4 symbols of each segment is for the segment synchronization signal. All data is received in the unit of packet so that one packet is received at every 4th clock.

Also, decoded data at every 4th clock may be provided in the decoding process. The decoded data has a size of a packet, i.e., 4 symbols and, only when the synchronization signals such as the segment synchronization signal and the field synchronization signal are received in the TCM decoder, no decoded data can be provided. If the FLAG remains '1', 4 symbols, each symbol having 2 bits, are packaged to be outputted in the unit of a packet.

Figure 10:
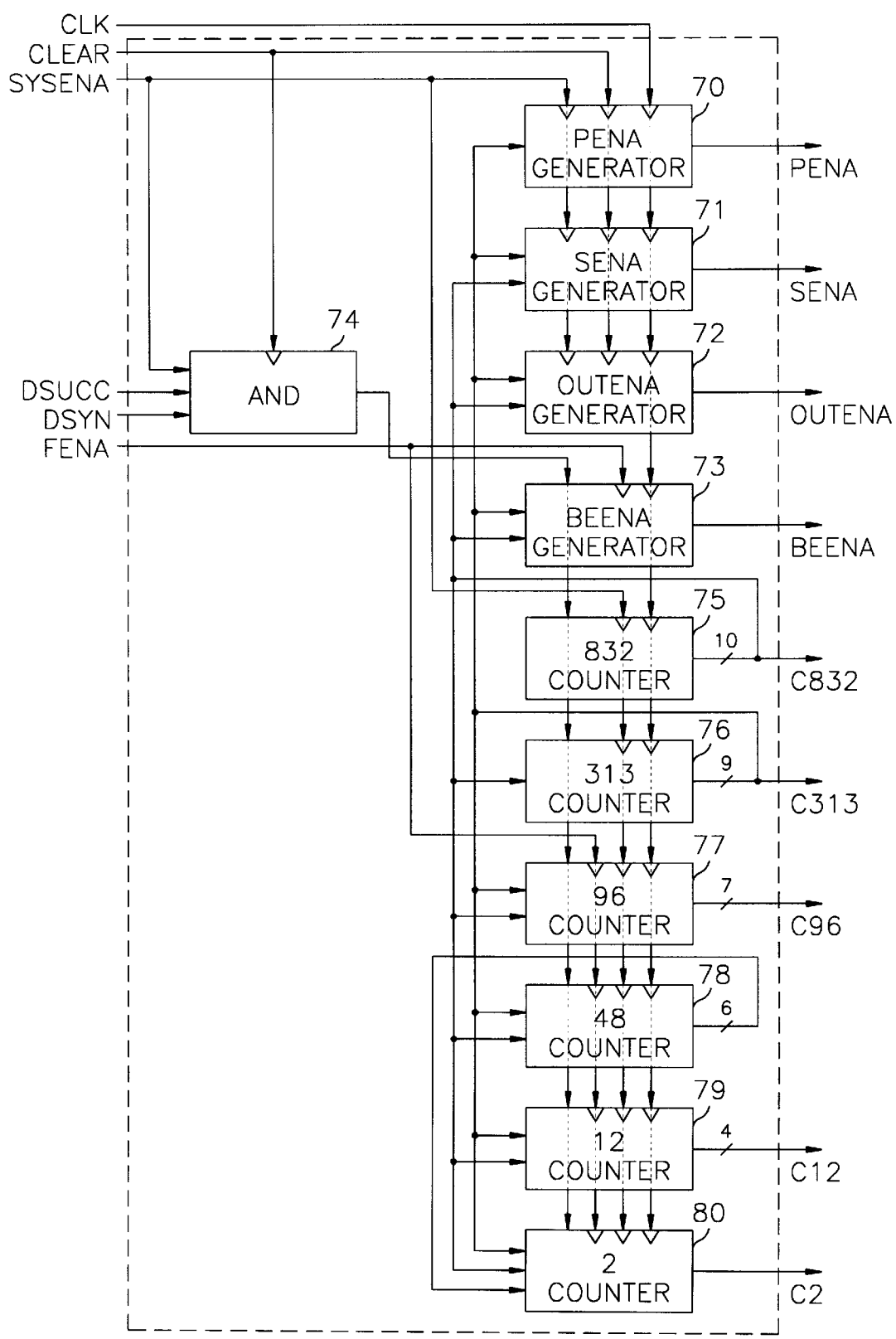
FIG. 10 pictures a detailed circuit of a control unit shown in FIG. 7.

Referring to FIG. 10, there is illustrated a detailed circuit of the control unit 7 shown in FIG. 7, wherein the control unit 7 includes a PENA generator 70, a SENA generator 71, an OUTENA generator 72, a BEENA generator 73, a logic AND gate 74, an 832 counter 75, a 313 counter 76, a 96 counter 77, a 48 counter 78, a 12 counter 79 and a 2 counter 80.

The PENA generator 70 generates a PMN enable signal (PENA) that enables the PMN 4. The SENA generator 71 generates a SMU enable signal(SENA) that enables the SMU 5. The OUTENA generator 72 generates a DOUT enable signal(OUTENA) that enables the DOUT 6. The BEENA generator 73 generates a BEENA signal required to generate the FLAG signal, which is an indication signal to indicate that valid decoded data is outputted. The BEENA signal remains '0' until the first output from the TCM is provided and turns to be '1' after the first output.

The logic AND gate 74 generates a START UP signal by processing an AND operation on DSYN(segment synchronization signal), DSCUU(demodulation success signal), CLEAR, SYSENA(system enable signal), wherein the START UP signal tells whether the TCM decoder can be operated or not. When the START UP signal turns to be '1', the BEENA generator 73, the 832 counter 75, the 313 counter 76, the 96 counter 77, the 48 counter 78, the 12 counter 79 and the 2 counter 80 start to operate.

Since each segment has 832 symbols, the 832 counter 75 generates a c832 counting signal for identifying segments by counting the number of symbols and the c832 counting signal is provided to the SENA generator 71, the OUTENA generator 72, the BEENA generator 73, the 313 counter 76, the 96 counter 77, the 48 counter 78, the 12 counter 79 and the 2 counter 80 within the control unit 7 and is also provided to the segment synchronization rejection filter 1, the PMN 4, the SMU 5 and the DOUT 6 for their respective controls.

Since each field has 313 segments, the 313 counter 76 generates a c313 counting signal for identifying fields by counting the number of segments and the c313 counting signal is provided to the PENA generator 70, the SENA generator 71, the OUTENA generator 72, the BEENA generator 73, the 96 counter 77, the 48 counter 78, the 12 counter 79 and the 2 counter 80 within the control unit 7 and is also provided to the DOUT 6.

The 96 counter 77, the 48 counter 78, the 12 counter 79 and the 2 counter 80 are used in order that the DOUT 6 carries out an intra-segment deinterleaving for decoded symbols and converts the size of the intra-segment deinterleaved data so as to control the output timing of the decoded data.

If the first output is provided from the DOUT 6, the 96 counter for data output starts to count the byte number of data so that it may output one byte of data at every 4th clock and, if necessary, stops to count during the output of the segment synchronization signal. According to the 48 counter 78, the 12 counter 79 and the 2 counter 80 for data input, each input data is assigned to an 8-bit register within one of two register groups of the DOUT 6, each register group having 12 number of 8-bit registers.

That is, as soon as first 2 bit data from the SMU 5 is provided to the DOUT 6 to be stored therein, the 48 counter 78 starts to count, but is controlled in such a way that it does not count during 4 clocks while the segment synchronization signal being received. If a register group is filled up with 48 symbol data, it is controlled for the 2 counter 80 to start to count.

The 2 counter 80 selects one of two register groups alternatively, wherein one of the two register groups provides the data stored therein while the other register group receives another input data so that the receiving and providing the data can be carried out continuously by two register groups.

The 12 counter 79 determines which 8-bit register among 12 8-bit registers of the selected register group receives the input data; as soon as first data from the SMU 5 is provided to the DOUT 6 to be stored therein, the 12 counter 79 starts to count, but is controlled in such a way that it does not count during 4 clocks while the segment synchronization signal being received. Data received in the unit of symbol at each clock is shifted to be stored in a next 8-bit register at each clock and in turn is stored in the same 8-bit register at every 12th clock.

Figure 11:
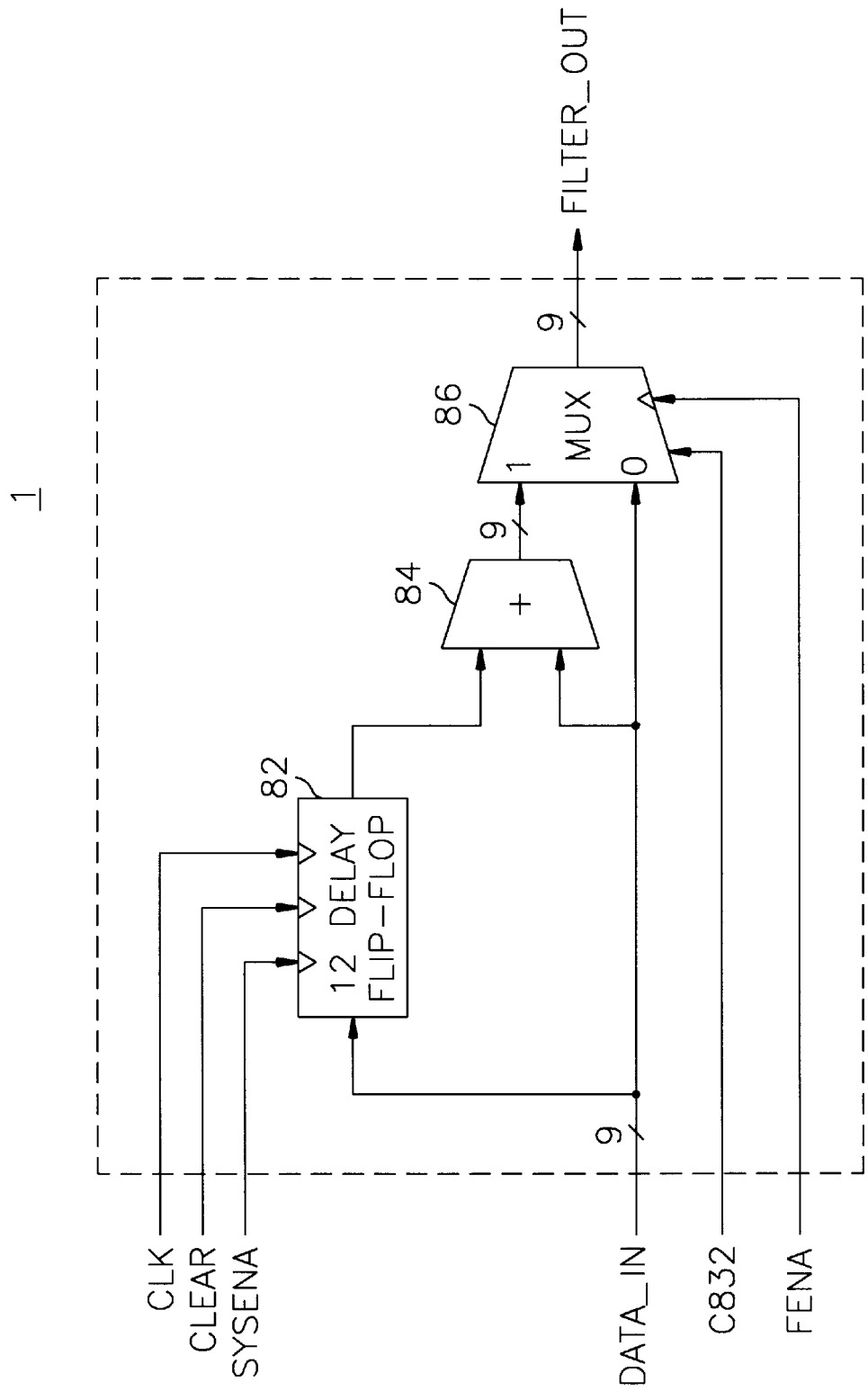
FIG. 11 shows a detailed circuit of a segment synchronization rejection filter shown in FIG. 7.

Referring to FIG. 11, there is a detailed circuit for the segment synchronization rejection filter 1 shown in FIG. 7. In the 16 state mode, the segment synchronization rejection filter 1 eliminates the influence of the segment synchronization signal in input data DATA_IN so that only valid data, i.e., FILTER_OUT can be provided to the next unit, i.e., the BMU 2. While, in the 8 state mode, the segment synchronization rejection filter 1 receives input data simply for providing to the next BMU 2.

Figure 5:
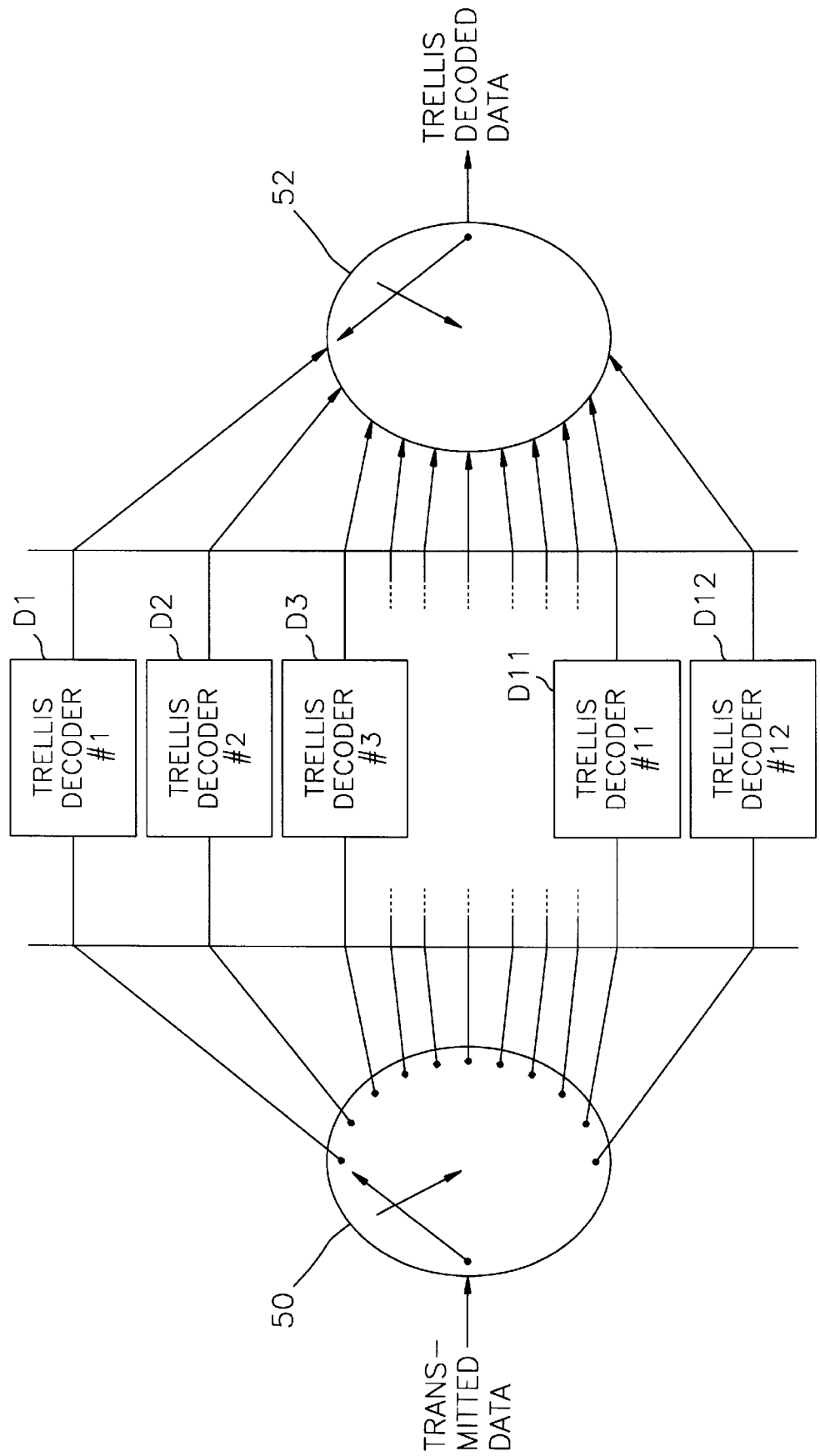
FIG. 5 represents a block diagram of a trellis code deinterleaver in a GA HDTV receiving system.
Figure 6:
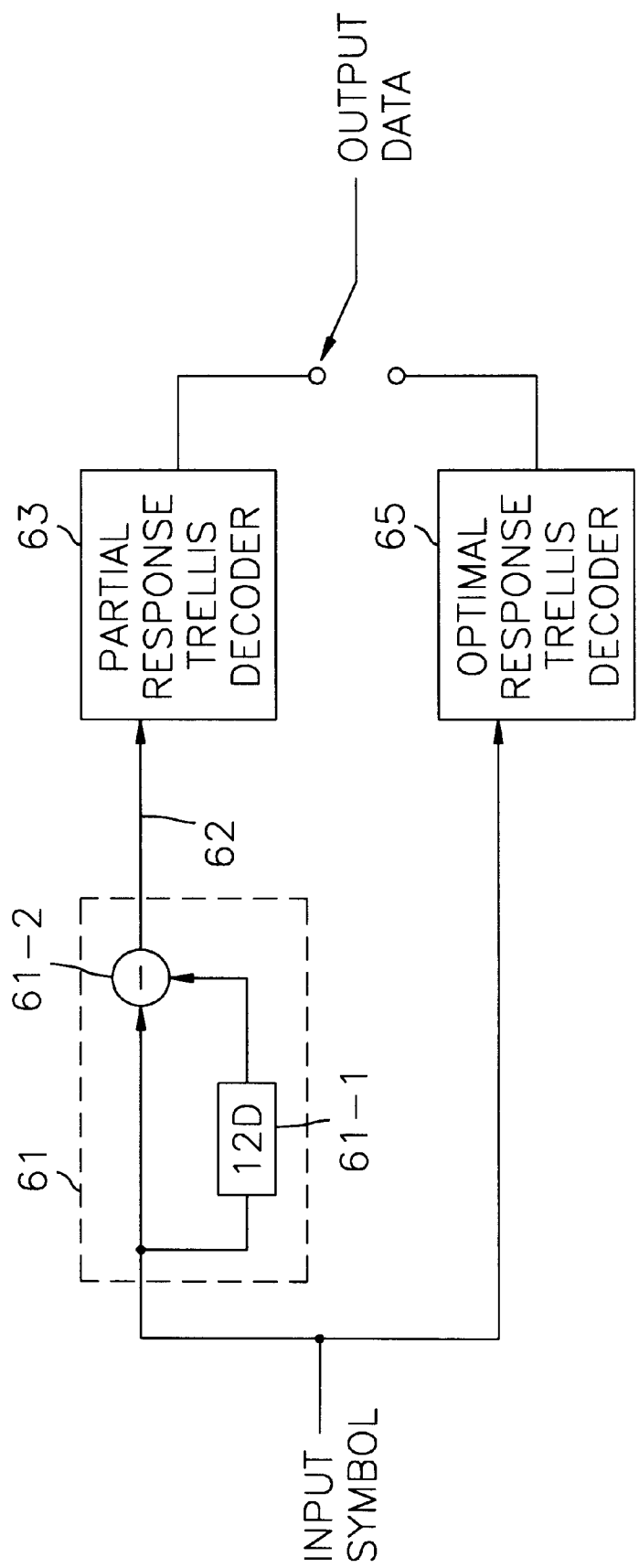
FIG. 6 illustrates a block diagram of a trellis decoder with and without a NTSC interference rejection filter.

As described above, if transmitted data shown in FIG. 5 passes through the NTSC interference rejection filter, a current input signal is subtracted from a previous signal delayed by as long as 12 symbols so that the 8 level symbol may be converted into a 15 level symbol. Table 3 represents the memory states of 12 symbol delay memories in a conventional NTSC interference rejection filter, input signals and output signals. The input signals shown in Table 3 represent signals from the trellis encoders based on the second segment #2 shown in Table 1 and, therefore, correspond to the output of the NTSC interference rejection filter after the receipt of the 4 symbols of the segment synchronization signals S1 to S4.

TABLE 3

| clock | input | 12 symbol delay memory | | | | output signal (=input signal − |
|---|---|---|---|---|---|---|
| CLK | signal | m1 | m2 | ... | m12 | m12) |
| 1 | S1 | $d12_{(t-1)}$ | $d11_{(t-1)}$ | ... | $d1_{(t-1)}$ | $S1-d1_{(t-1)}$ |
| 2 | S2 | S1 | $d12_{(t-1)}$ | ... | $d2_{(t-1)}$ | $S2-d2_{(t-1)}$ |
| 3 | S3 | S2 | S1 | ... | $d3_{(t-1)}$ | $S3-d3_{(t-1)}$ |
| 4 | S4 | S3 | S2 | ... | $d4_{(t-1)}$ | $S4-d4_{(t-1)}$ |
| 5 | $d5_{(t)}$ | S4 | S3 | ... | $d5_{(t-1)}$ | $d5_{(t)}-d5_{(t-1)}$ |
| 6 | $d6_{(t)}$ | $d5_{(t)}$ | S4 | ... | $d6_{(t-1)}$ | $d6_{(t)}-d6_{(t-1)}$ |
| 7 | $d7_{(t)}$ | $d6_{(t)}$ | $d5_{(t)}$ | ... | $d7_{(t-1)}$ | $d7_{(t)}-d7_{(t-1)}$ |
| 8 | $d8_{(t)}$ | $d7_{(t)}$ | $d6_{(t)}$ | ... | $d8_{(t-1)}$ | $d8_{(t)}-d8_{(t-1)}$ |
| 9 | $d9_{(t)}$ | $d8_{(t)}$ | $d7_{(t)}$ | ... | $d9_{(t-1)}$ | $d9_{(t)}-d9_{(t-1)}$ |
| 10 | $d10_{(t)}$ | $d9_{(t)}$ | $d8_{(t)}$ | ... | $d10_{(t-1)}$ | $d10_{(t)}-d10_{(t-1)}$ |
| 11 | $d11_{(t)}$ | $d10_{(t)}$ | $d9_{(t)}$ | ... | $d11_{(t-1)}$ | $d11_{(t)}-d11_{(t-1)}$ |
| 12 | $d12_{(t)}$ | $d11_{(t)}$ | $d10_{(t)}$ | ... | $d12_{(t-1)}$ | $d12_{(t)}-d12_{(t-1)}$ |
| 13 | $d1_{(t)}$ | $d12_{(t)}$ | $d11_{(t)}$ | ... | S1 | $d1_{(t)}-S1$ |
| 14 | $d2_{(t)}$ | $d1_{(t)}$ | $d12_{(t)}$ | ... | S2 | $d2_{(t)}-S2$ |
| 15 | $d3_{(t)}$ | $d2_{(t)}$ | $d1_{(t)}$ | ... | S3 | $d3_{(t)}-S3$ |
| 16 | $d4_{(t)}$ | $d3_{(t)}$ | $d2_{(t)}$ | ... | S4 | $d4_{(t)}-S4$ |
| 17 | $d5_{(t+1)}$ | $d4_{(t)}$ | $d3_{(t)}$ | ... | $d5_{(t)}$ | $d5_{(t+1)}-d5_{(t)}$ |

As shown in Table 3, the NTSC interference rejection filter first receives 4 symbols of the segment synchronization signal and continues to receive trellis data, i.e., 12 symbol intra-segment interleaved data from 12 trellis encoders so that a difference signal between a current signal and a corresponding 12 symbol delayed previous signal is provided as an output signal. The difference signal corresponds to a difference between two data generated in the same encoder. The difference signals during CLK13 to CLK16, however, do not represent trellis coded data but are influenced by the segment synchronization signal.

In order to process 12 symbol intra-segment interleaved data by using only one decoder, therefore, the segment synchronization signal must be eliminated from the output signal during 4 clocks after the instance delayed by as long as 12 symbols clocks from the receipt of the segment synchronization signal.

To overcome the above drawback, the segment synchronization rejection filter 1 shown in FIG. 11 includes a 12 delay flip-flop 82 for delaying input data DATA_IN, an adder 84 and a multiplexor MUX 86. The 12 delay flip-flop 82 enabled by the SYSENA and synchronized by the CLK receives the input data DATA_IN in sequence and shifts it by as much as 12 symbols so that the DATA_IN delayed by as much as 12 symbols is provided to the adder 84 as delayed data. The adder 84 adds the DATA_IN to the delayed data of the 12 delay flip-flop 82 to provide the adding result to the MUX 86 as an adder output. The MUX 86 receives the DATA_IN at an input end '0' and the adder output of the adder 84 at another input end '1' and generates as a FILTER_OUT either the DATA_IN or the adder output based on the combination of the FENA and the c832 counting signal. Either the 16 state mode or the 8 state mode is determined based on the FENA, while a section at which the segment synchronization signal must be eliminated in the 16 state mode is determined based on the c832 counting signal for identifying each segment by counting the number of symbols (1 segment=832 symbols). That is, based on the combination of the FENA and the c832 counting signal, the MUX 86 selects the input end '1' within only 4 clocks after the instance delayed by as much as 12 clocks from the first receipt of the segment synchronization signal Si while it selects the other input end '0' during the remaining time.

The Table 4 demonstrates the elimination of the segment synchronization signal by the use of the segment synchronization rejection filter 1 according to the above operation.

Referring back to FIG. 7, the BMU 2 receives the FILTER_OUT from the segment synchronization rejection filter 1; calculates branch metrics BM's; and provides them to the ACS 3. If a branch from a previous state to a current state is built up through an accurate path, a branch metric '0'

TABLE 4

| clock | | 12 symbol delay flip-flop | | adder output | MUX output |
|---|---|---|---|---|---|
| CLK | DATA_IN | m1 | ... m12 | (DATA_IN + m12) | (FILTER_OUT) |
| 1 | $S1-d1_{(t-1)}$ | $d12_{(t-1)}$-$d12_{(t-2)}$ | ... $d1_{(t-1)}$-$d1_{(t-2)}$ | $S1-d1_{(t-1)}$ | X |
| 2 | $S2-d2_{(t-1)}$ | $S1-d1_{(t-1)}$ | ... $d2_{(t-1)}$-$d2_{(t-2)}$ | $S2-d2_{(t-1)}$ | X |
| 3 | $S3-d3_{(t-1)}$ | $S2-d2_{(t-1)}$ | ... $d3_{(t-1)}$-$d3_{(t-2)}$ | $S3-d3_{(t-1)}$ | X |
| 4 | $S4-d4_{(t-1)}$ | $S3-d3_{(t-1)}$ | ... $d4_{(t-1)}$-$d4_{(t-2)}$ | $S4-d4_{(t-1)}$ | X |
| 5 | $d5_{(t)}-d5_{(t-1)}$ | $S4-d4_{(t-1)}$ | ... $d5_{(t-1)}$-$d5_{(t-2)}$ | $d5_{(t)}-d5_{(t-2)}$ | $d5_{(t)}-d5_{(t-1)}$ |
| 6 | $d6_{(t)}-d6_{(t-1)}$ | $d5_{(t)}-d5_{(t-1)}$ | ... $d6_{(t-1)}$-$d6_{(t-2)}$ | $d6_{(t)}-d6_{(t-2)}$ | $d6_{(t)}-d6_{(t-1)}$ |
| 7 | $d7_{(t)}-d7_{(t-1)}$ | $d6_{(t)}-d6_{(t-1)}$ | ... $d7_{(t-1)}$-$d7_{(t-2)}$ | $d7_{(t)}-d7_{(t-2)}$ | $d7_{(t)}-d7_{(t-1)}$ |
| 8 | $d8_{(t)}-d8_{(t-1)}$ | $d7_{(t)}-d7_{(t-1)}$ | ... $d8_{(t-1)}$-$d8_{(t-2)}$ | $d8_{(t)}-d8_{(t-2)}$ | $d8_{(t)}-d8_{(t-1)}$ |
| 9 | $d9_{(t)}-d9_{(t-1)}$ | $d8_{(t)}-d8_{(t-1)}$ | ... $d9_{(t-1)}$-$d9_{(t-2)}$ | $d9_{(t)}-d9_{(t-2)}$ | $d9_{(t)}-d9_{(t-1)}$ |
| 10 | $d10_{(t)}-d10_{(t-1)}$ | $d9_{(t)}-d9_{(t-1)}$ | ... $d10_{(t-1)}$-$d10_{(t-2)}$ | $d10_{(t)}-d10_{(t-2)}$ | $d10_{(t)}-d10_{(t-1)}$ |
| 11 | $d11_{(t)}-d11_{(t-1)}$ | $d10_{(t)}-d10_{(t-1)}$ | ... $d11_{(t-1)}$-$d11_{(t-2)}$ | $d11_{(t)}-d11_{(t-2)}$ | $d11_{(t)}-d11_{(t-1)}$ |
| 12 | $d12_{(t)}-d12_{(t-1)}$ | $d11_{(t)}-d11_{(t-1)}$ | ... $d12_{(t-1)}$-$d12_{(t-2)}$ | $d12_{(t)}-d12_{(t-2)}$ | $d12_{(t)}-d12_{(t-1)}$ |
| 13 | $d1_{(t)}-S1$ | $d12_{(t)}-d12_{(t-1)}$ | ... $S1-d1_{(t-1)}$ | $d1_{(t)}-d1_{(t-1)}$ | $d1_{(t)}-d1_{(t-1)}$ |
| 14 | $d2_{(t)}-S2$ | $d1_{(t)}-S1$ | ... $S2-d2_{(t-1)}$ | $d2_{(t)}-d2_{(t-1)}$ | $d2_{(t)}-d2_{(t-1)}$ |
| 15 | $d3_{(t)}-S3$ | $d2_{(t)}-S2$ | ... $S3-d3_{(t-1)}$ | $d3_{(t)}-d3_{(t-1)}$ | $d3_{(t)}-d3_{(t-1)}$ |
| 16 | $d4_{(t)}-S4$ | $d3_{(t)}-S3$ | ... $S4-d4_{(t-1)}$ | $d4_{(t)}-d4_{(t-1)}$ | $d4_{(t)}-d4_{(t-1)}$ |
| 17 | $d5_{(t+1)}-d5_{(t)}$ | $d4_{(t)}-S4$ | ... $d5_{(t)}-d5_{(t-1)}$ | $d5_{(t+1)}-d5_{(t-1)}$ | $d5_{(t)}-d5_{(t-1)}$ |

As shown in Table 4, the adder output from the adder 84 equals a sum of a current input data DATA_IN, i.e., the output signal of the NTSC rejection filter and a 12 symbol delayed previous signal through the 12 symbol delay flip-flop. Since the segment synchronization signal Si in the DATA_IN is, therefore, offset by the Si in the 12 symbol delayed previous signal during the time interval from CLK13 to CLK16, the adder output of the adder 84 naturally corresponds to a difference between two trellis coded data encoded at the same trellis encoder. As a result, the segment synchronization signal(Si) generated within the time interval from CLK13 to CLK16 is eliminated by the use of the adder 84 and the eliminated result, i.e., the adder output selected by the MUX 86 is provided to the BMU 2. Any output of the MUX 86 will do within 4 clocks CLK1 to CLK4 from the initial instant of a segment, because the TCM decoder does not operate during 4 clocks CLK1 to CLK4.

As described above, the segment synchronization rejection filter 1 in the 8 state mode provides the input data DATA_IN directly. In the meantime, the segment synchronization filter 1 in 16 the state mode selects the adder output of the adder 84 during the 4 clocks while the segment synchronization signal(Si) being included in the DATA_IN, but selects the DATA_IN directly during the remaining clocks except the above 4 clocks.

is generated. Any noise may be included in a real signal transmitted through a real channel with the additive white Gaussian noise(AWGN), not an ideal communication environment with no noise. The AWGN, therefore, is really added to the trellis encoded data for transmitting and a TCM decoder of the receiver calculates a difference between the real data with noise and the reference value of each branch, wherein the difference is hardly equal to '0' and approximates to '0'. Each difference corresponds to a branch metric(BM).

Each transfer between two states in each mode and a corresponding input and output signals will be illustrated and, then, a rule for calculating a branch metric in each state mode will be described.

(1) The 16 State Mode

Figure 3:
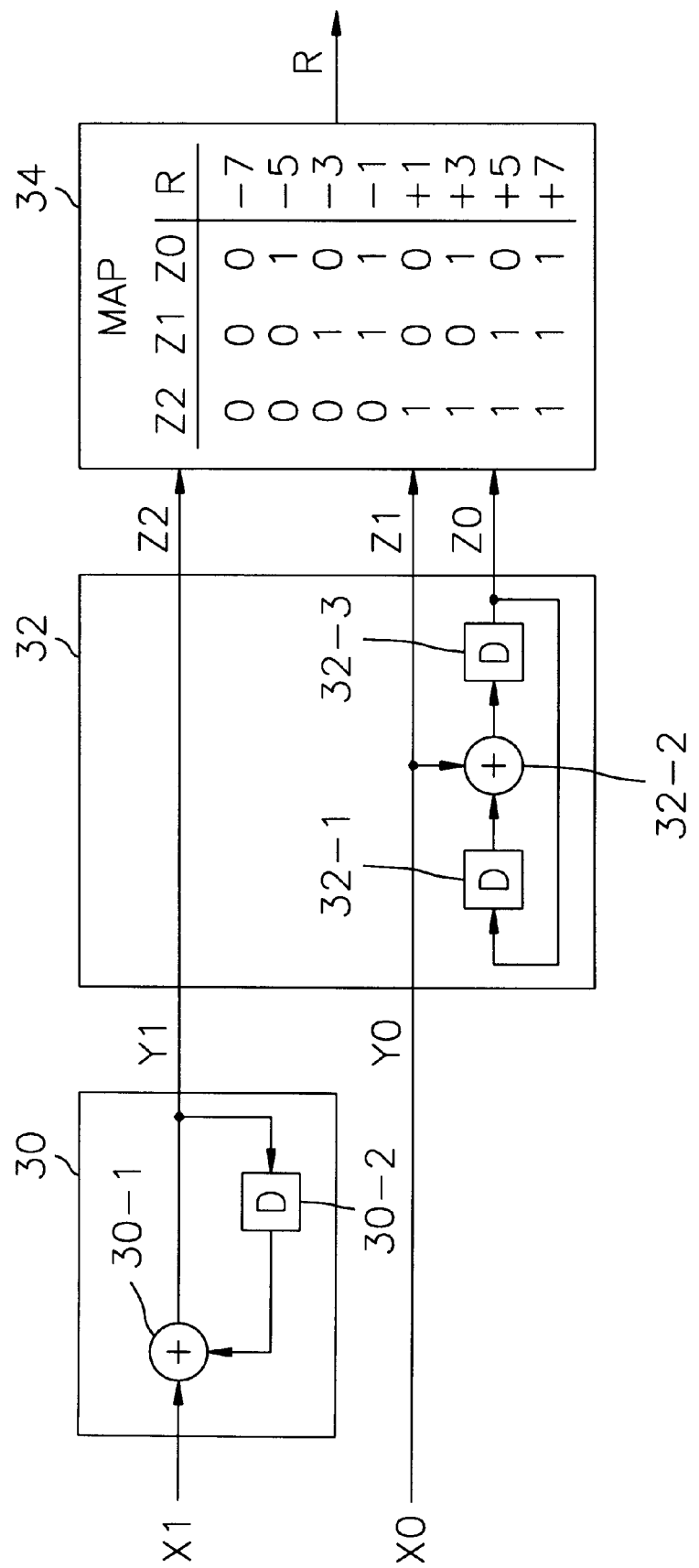
FIG. 3 provides a block diagram of an 8-level vestigial sideband modulation (VSB) trellis coding block in a GA HDTV transmission system.

In Table 5, input bits (X1,X0) are provided to the trellis coding block shown in FIG. 3; previous output (Z2', Z1', Z0') and current output (Z2, Z1, Z0) correspond to 8-level values to be provided to the 8-level symbol mapper 34 shown in FIG. 3. Each channel symbol is the difference between a current output(Z) and a previous output(Z') so that the channel symbol is really transmitted.

TABLE 5

| previous state (S3'S2'S1'S0') | previous output (Z2'Z1'Z0') | input bits (X1X0) | current output (Z2Z1Z0) | channel symbol | current state (S3S2S1S0) | decoded symbol |
|---|---|---|---|---|---|---|
| 0000 | 000(−7) | 00 | 000(−7) | 0 | 0000 | 00 |
| 0001 | 010(−3) | 00 | | −4 | | 00 |
| 1000 | 100(+1) | 10 | | −8 | | 10 |
| 1001 | 110(+5) | 10 | | −12 | | 10 |
| 0100 | 001(−5) | 01 | 010(−3) | +2 | 0001 | 01 |
| 0110 | 011(−1) | 01 | | −2 | | 01 |
| 1100 | 101(+3) | 11 | | −6 | | 11 |
| 1101 | 111(+7) | 11 | | −10 | | 11 |
| 0100 | 001(−5) | 00 | 000(−7) | −2 | 0010 | 00 |
| 0101 | 011(−1) | 00 | | −6 | | 00 |
| 1100 | 101(+3) | 10 | | −10 | | 10 |
| 1101 | 111(+7) | 10 | | −14 | | 10 |
| 0000 | 000(−7) | 01 | 010(−3) | +4 | 0011 | 01 |
| 0001 | 010(−3) | 01 | | 0 | | 01 |
| 1000 | 100(+1) | 11 | | −4 | | 11 |
| 1001 | 110(+5) | 11 | | −8 | | 11 |
| 0010 | 000(−7) | 00 | 001(−5) | +2 | 0100 | 00 |
| 0011 | 010(−3) | 00 | | −2 | | 00 |
| 1010 | 100(+1) | 10 | | −6 | | 10 |
| 1011 | 110(+5) | 10 | | −10 | | 10 |
| 0110 | 001(−5) | 01 | 011(−1) | +4 | 0101 | 01 |
| 0111 | 011(−1) | 01 | | 0 | | 01 |
| 1110 | 101(+3) | 11 | | −4 | | 11 |
| 1111 | 111(+7) | 11 | | −8 | | 11 |
| 0110 | 001(−5) | 00 | 001(−5) | 0 | 0110 | 00 |
| 0111 | 011(−1) | 00 | | −4 | | 00 |
| 1110 | 101(+3) | 10 | | −8 | | 10 |
| 1111 | 111(+7) | 10 | | −12 | | 10 |
| 0010 | 000(−7) | 01 | 011(−1) | +6 | 0111 | 01 |
| 0011 | 010(−3) | 01 | | +2 | | 01 |
| 1010 | 100(+1) | 11 | | −2 | | 11 |
| 1011 | 110(+5) | 11 | | −6 | | 11 |
| 0000 | 000(−7) | 10 | 100(+1) | +8 | 1000 | 10 |
| 0001 | 010(−3) | 10 | | +4 | | 10 |
| 1000 | 100(+1) | 00 | | 0 | | 00 |
| 1001 | 110(+5) | 00 | | −4 | | 00 |
| 0100 | 001(−5) | 11 | 110(+5) | +10 | 1001 | 11 |
| 0110 | 011(−1) | 11 | | +6 | | 11 |
| 1100 | 101(+3) | 01 | | +2 | | 01 |
| 1101 | 111(+7) | 01 | | −2 | | 01 |
| 0100 | 001(−5) | 10 | 100(+1) | +6 | 1010 | 10 |
| 0101 | 011(−1) | 10 | | +2 | | 10 |
| 1100 | 101(+3) | 00 | | −2 | | 00 |
| 1101 | 111(+7) | 00 | | −6 | | 00 |
| 0000 | 000(−7) | 11 | 110(+5) | +12 | 1011 | 11 |
| 0001 | 010(−3) | 11 | | +8 | | 11 |
| 1000 | 100(+1) | 01 | | +4 | | 01 |
| 1001 | 110(+5) | 01 | | 0 | | 01 |
| 0010 | 000(−7) | 10 | 101(+3) | +10 | 1100 | 10 |
| 0011 | 010(−3) | 10 | | +6 | | 10 |
| 1010 | 100(+1) | 00 | | +2 | | 00 |
| 1011 | 110(+5) | 00 | | −2 | | 00 |
| 0110 | 001(−5) | 11 | 111(+7) | +12 | 1101 | 11 |
| 0111 | 011(−1) | 11 | | +8 | | 11 |
| 1110 | 101(+3) | 01 | | +4 | | 01 |
| 1111 | 111(+7) | 10 | | 0 | | 01 |
| 0110 | 001(−5) | 10 | 101(+3) | +8 | 1110 | 10 |
| 0111 | 011(−1) | 10 | | +4 | | 10 |
| 1110 | 101(+3) | 00 | | 0 | | 00 |
| 1111 | 111(+7) | 00 | | −4 | | 00 |
| 0010 | 000(−7) | 11 | 111(+7) | +14 | 1111 | 11 |
| 0011 | 010(−3) | 11 | | +10 | | 11 |
| 1010 | 100(+1) | 01 | | +6 | | 01 |
| 1011 | 110(+5) | 01 | | +2 | | 01 |

As shown in Table 5, if an 8 level modulated signal is converted into a 15 level signal by the NTSC rejection filter so that 16 state trellis diagram for the input signal continues to be drawn, 4 branches from 4 previous states S' for each current state S are generated based on the input bits (X1, X0).

In order to calculate branch metrics for each current state (S3, S2, S1, S0) as shown in Table 5, the input bits (X1, X0) as well as the current state itself must be used. A higher input bit X1 is used as information on 4 paths transferred to the current state. That is, the higher input bit X1 of the previous states 0 to 7 is '0' and that of the previous states 8 to 15 is '1'. Since the 4 branch metrics are different from each other by a predetermined value, only the first branch metric is calculated and, then, the remaining 3 branch metrics are simply obtained by adding 4, 8 and 12 to the first branch metric, respectively. The branch metric BM for the first path of each current state shown in Table 5 in the 16 state mode is calculated as follows:

$$BM=|NTSCoutput+Pout-Cout|$$

$$Pout=|-7+2(S1\oplus S0)+8(S3\oplus X1_i)| \quad \text{Eq. 1}$$

$$Cout=|-7+8S3+2S2+4S0|$$

wherein the NTSC output is an output of the NTSC interference rejection filter; the Pout represents the previous output Z'; and the Cout represents the current output Z. The previous and the current outputs are determined based on the current state (S3, S2, S1, S0) and the higher input bit X1. Each branch metric is an absolute difference between the NTSCoutput and (Cout−Pout). The remaining 3 branch metrics of said each current state can be calculated by increasing only the Pout by 4, 8 and 12, respectively. That is, a second previous output Pout2 of the second branch metric is equal to Pout+4; a third previous output Pout3 of the third branch metric is equal to Pout+8; and a fourth previous output Pout4 of the fourth branch metric is equal to Pout+12. According to a simple rule illustrated above, 4 branch metrics for 4 paths of each current state can be calculated as follows:

$$BM=|NTSCoutput+2(S1\oplus S0)+8(S3\oplus X1_i)-8S3-2S2-4S0[+4, +8, +12]| \quad \text{Eq. 2}$$

Since a difference Pout−Cout for each branch is a constant as described above, the difference has been preassigned to every branch so that the branch metric may be calculated by adding the difference to the NTSCoutput just after the receipt of the NTSCoutput. Table 6 shows differences Pout−Cout assigned to 4 branches for each state.

Since the differences Pout−Cout for all states can be varied from −14 to +14 as shown in Table 6, the branch metrics after adding the NTSCoutput to the differences can be roughly changed from −30 to +30 by taking account of the AWGN.

TABLE 6

| current state S3S2S1S0 | first branch (Pout1-Cout) | second branch (Pout2-Cout) | third branch (Pout3-Cout) | fourth branch (Pout4-Cout) |
|---|---|---|---|---|
| 0000 | 0 | 4 | 8 | 12 |
| 0001 | −2 | 2 | 6 | 10 |
| 0010 | 2 | 6 | 10 | 14 |
| 0011 | −4 | 0 | 4 | 8 |
| 0100 | −2 | 2 | 6 | 10 |
| 0101 | −4 | 0 | 4 | 8 |
| 0110 | 0 | 4 | 8 | 12 |
| 0111 | −6 | −2 | 2 | 6 |
| 1000 | −8 | −4 | 0 | 4 |
| 1001 | −10 | −6 | −2 | 2 |
| 1010 | −6 | −2 | 2 | 6 |
| 1011 | −12 | −8 | −4 | 0 |
| 1100 | −10 | −6 | −2 | 2 |
| 1101 | −12 | −8 | −4 | 0 |
| 1110 | −8 | −4 | 0 | 4 |
| 1111 | −14 | −10 | −6 | −2 |

(2) The 8 State Mode

In Table 7, input bits (X1,X0) are provided to the trellis coding block shown in FIG. 3; previous output (Z2', Z1', Z0') and current output (Z2, Z1, Z0) correspond to 8-level values to be provided to the 8-level symbol mapper shown in FIG. 3. Each channel symbol is a difference between a current output(Z) and a previous output(Z') so that the channel symbol is really transmitted.

TABLE 7

| previous state (S2'S1'S0') | input bits (X1 X0) | current output (Z2Z1Z0) | channel symbol | decoded symbol | current state (S2S1S0) |
|---|---|---|---|---|---|
| 000 | 00 | 000 | −7 | 00 | 000 |
| 010 | 01 | 010 | −3 | 01 | |
| 100 | 10 | 000 | −7 | 10 | |
| 110 | 11 | 010 | −3 | 11 | |
| 000 | 01 | 010 | −3 | 01 | 001 |
| 010 | 00 | 000 | −7 | 00 | |
| 100 | 11 | 010 | −3 | 11 | |
| 110 | 10 | 000 | −7 | 10 | |
| 001 | 00 | 001 | −5 | 00 | 010 |
| 011 | 01 | 011 | −1 | 01 | |
| 101 | 10 | 001 | −5 | 10 | |
| 111 | 11 | 011 | −1 | 11 | |
| 001 | 01 | 011 | −1 | 01 | 011 |
| 011 | 00 | 001 | −5 | 00 | |
| 101 | 11 | 011 | −1 | 11 | |
| 111 | 10 | 001 | −5 | 10 | |
| 000 | 10 | 100 | +1 | 10 | 100 |
| 010 | 11 | 110 | +5 | 11 | |
| 100 | 00 | 100 | +1 | 00 | |
| 110 | 01 | 110 | +5 | 01 | |
| 000 | 11 | 110 | +5 | 11 | 101 |
| 010 | 10 | 100 | +1 | 10 | |
| 100 | 01 | 110 | +5 | 01 | |
| 110 | 00 | 100 | +1 | 00 | |
| 001 | 10 | 101 | +3 | 10 | 110 |
| 011 | 11 | 111 | +7 | 11 | |
| 101 | 00 | 101 | +3 | 00 | |
| 111 | 01 | 111 | +7 | 01 | |
| 001 | 11 | 111 | +7 | 11 | 111 |
| 011 | 10 | 101 | +3 | 10 | |
| 101 | 01 | 111 | +7 | 01 | |
| 111 | 00 | 101 | +3 | 00 | |

As shown in Table 7, if an 8 state trellis diagram for an 8 level modulated signal continues to be drawn, a previous state S' is associated with 4 current states through 4 branches based on the input bits (X1, X0). The branch metrics for the first path of each current state shown in Table 7 in the 8 state mode is calculated as follows:

$$Branchmetric=|NTSCoutput-Dout|$$

$$Dout=-7+2\times S1+8\times S2 \quad \text{Eq. 3}$$

wherein the NTSCoutput is an output signal of the NTSC interference rejection filter; and the Dout represents a desired output determined with constant weights on the higher two bits (S2, S1) of the current state (S2, S1, S0). Each branch metric may be an absolute difference between the NTSCoutput and the DCout. The remaining 3 branch metrics can be calculated by modifying only the Dout. That is, a second desired output Dout2 of the second branch metric is equal to Dout+4; a third desired output Dout3 of the third branch metric is equal to Dout; and a fourth desired output Dout4 of the fourth branch metric is equal to Dout+4. According to a simple rule illustrated above, 4 branch metrics for 4 paths of each current state can be calculated as follows:

$$BM=|NTSCoutput+7-2*S1-8*S2[+4]| \quad \text{Eq. 4}$$

Since the Dout for each branch is a constant as described above, the Dout has been preassigned to every branch so that the branch metric may be calculated by adding the Dout to the NTSCoutput just after the receipt of the NTSCoutput. Table 8 shows the Dout's assigned to 4 branches for each state, respectively.

TABLE 8

| current state S2S1S0 | first branch (Dout) | second branch (Dout2) | third branch (Dout3) | fourth branch (Dout4) |
|---|---|---|---|---|
| 000 | −7 | −3 | −7 | −3 |
| 001 | −3 | −7 | −3 | −7 |
| 010 | −5 | −1 | −5 | −1 |
| 011 | −1 | −5 | −1 | −5 |
| 100 | 1 | 5 | 1 | 5 |
| 101 | 5 | 1 | 5 | 1 |
| 110 | 3 | 7 | 3 | 7 |
| 111 | 7 | 3 | 7 | 3 |

Since all the Dout's for all states can be varied from −7 to +7 as shown in Table 8, the branch metrics after adding the NTSCoutput to the Dout's can be roughly changed from −16 to +16 by taking account of AWGN.

The rule for calculating branch metrics for each state in two separate state modes, i.e., the 16 state mode and the 8 state mode, has been described in detail. In accordance with the present invention, the 8 and the 16 state modes in the BMU 2 are not divided in separate layouts but joined in one layout. That is, the BMU is operated based on the FENA notifying either the 8 state mode or the 16 state mode. In order to simplify the calculation and to reduce unnecessary signals, all branch metrics are not calculated but only branch metrics with different values are provided to the ACS 3. That is, total 32(=8×4) branch metrics must be calculated for all states in the 8 state mode, while only 8 different branch metrics are required for 8 reference levels. Similarly, total 64(=16×4) branch metrics must be calculated for all states in the 16 state mode, while only 15 different branch metrics are required for 15 reference levels. It is, therefore, ineffective to calculate all branch metrics for all states independently.

Accordingly, the BMU 2 provides only branch metrics with different values each other to the ACS 3, and the ACS 3 selects to use only 4 branch metrics required for each state. Output pins of the BMU 2 is defined as follows in order to accomplish the above method. Table 9 shows branch metrics in the 16 state mode while Table 10 illustrates branch metrics in the 8 state mode based on reference levels.

TABLE 9

| 16 state TCM branch metric | |
|---|---|
| reference level | branch metric (BM) |
| 0 | BM1 = \| input \| |
| −4 | BM2 = \| input + 4 \| |
| −8 | BM3 = \| input + 8 \| |
| −12 | BM4 = \| input + 12 \| |
| +2 | BM5 = \| input − 2 \| |
| −2 | BM6 = \| input + 2 \| |
| −6 | BM7 = \| input + 6 \| |
| −10 | BM8 = \| input + 10 \| |
| −14 | BM9 = \| input + 14 \| |
| +4 | BM10 = \| input − 4 \| |
| +6 | BM11 = \| input − 6 \| |
| +8 | BM12 = \| input − 8 \| |
| +10 | BM13 = \| input − 10 \| |
| +12 | BM14 = \| input − 12 \| |
| +14 | BM15 = \| input − 14 \| |

As shown in Tables 9 and 10, each branch metric is equal to an absolute difference between the input signal and a reference level, wherein the reference level depends on whether the input signal is in either the 8 state mode or the 16 state mode.

TABLE 10

| 8 state TCM branch metric | |
|---|---|
| reference level | branch metric (BM) |
| −7 | BM1 = \| input + 7 \| |
| −3 | BM2 = \| input + 3 \| |
| −5 | BM3 = \| input + 5 \| |
| −1 | BM4 = \| input + 1 \| |
| +1 | BM5 = \| input − 1 \| |
| +5 | BM6 = \| input − 5 \| |
| +3 | BM7 = \| input − 3 \| |
| +7 | BM8 = \| input − 7 \| |

Figure 12:
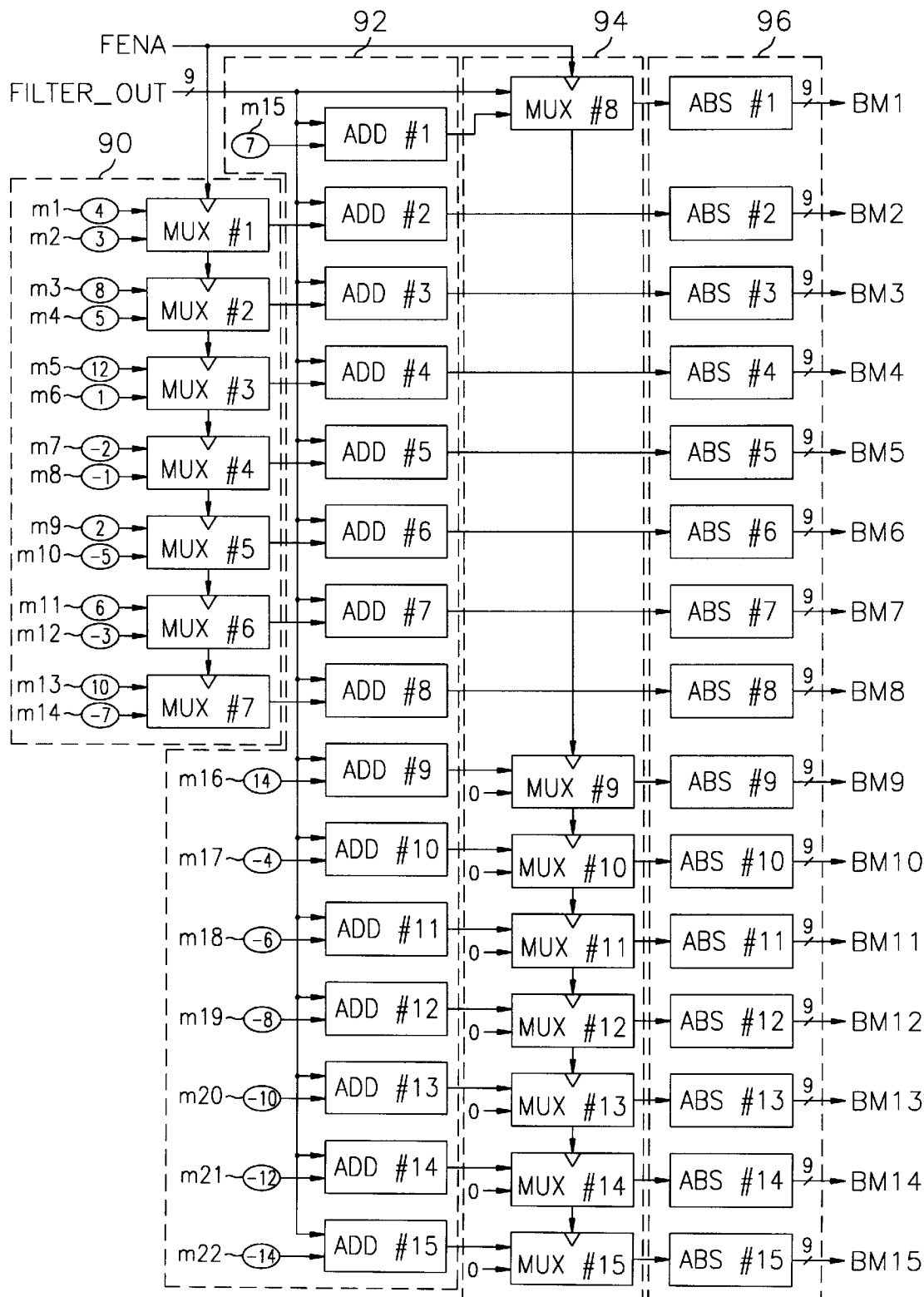
FIG. 12 presents a detailed circuit of a branch metric unit (BMU) shown in FIG. 7.

As shown in FIG. 12, the BMU 2 in accordance with the present invention includes a reference level selection module 90, an adding module 92, a branch selection module 94 and an absolute value calculation module 96. The reference level selection module 92 selects a reference level for each branch based on the FENA. The adding module 92 calculates an error between the FILTER_OUT fed from the segment synchronization rejection filter 1 and the reference level. The branch selection module 94 selects either the error fed from the adding module 92 or '0' based on the FENA so that the selected result is provided to the absolute value calculation module 96. The absolute value calculation module 96 obtains an absolute value of the selected result fed from the branch selection module 94 to provide the absolute value as a corresponding branch metric(BM).

The reference level selection module 90 contains a plurality of memories m1 to m14 (not shown) and a multiplicity of multiplexors(MUX) MUX#1 to MUX#7, wherein each memory stores a reference level based on either the 8 or the 16 state mode and each MUX selects one of reference levels stored in the memories m1 to m14. The memories m1 to m14 for obtaining the 2nd branch metric BM2 to the 8th branch metric BM8 are divided into two groups, wherein one group of memories m2, m4, . . . m14 for the 8 state mode has 7 reference levels values 3, 5, 1, −1, −5, −3 and −7, respectively, and the other group of memories m1, m3, . . . m13 for the 16 state mode has 7 reference levels values 4, 8, 12, −2, 2, 6 and 10, respectively. The memories m1 and m2 are connected to the MUX#1, the m3 and m4 are connected to the MUX#2, and so on. If the FENA is '0', each of the MUX#1 to the MUX#7 selects a reference level corresponding to the 8 state mode and, if otherwise, i.e., if the FENA is '1', each MUX corresponds to a reference level corresponding to the 16 state mode. The MUX#1 is connected to a second adder ADD#2 of the adding module 92, the MUX#2 is connected to a third adder ADD#3 of the adding module 92, and so on.

The adding module 92 includes memories m15 to m22 for storing reference levels, respectively, and a plurality of adders ADD#1 to ADD#15 for receiving the FILTER_OUT fed from the segment synchronization rejection filter 1 and adding the FILTER_OUT to the respective reference level of the branch metric. The memory m15 stores a first reference level '7' for calculating the a first branch metric BM1 of the 8 state mode and the remaining memories m16 to m22 store a 9th to a 15th reference levels 14, −4, −6, −8, −10, −12 and −14 for obtaining a 9th to a 15th branch metrics BM9 to BM15 of the 16 state mode, respectively. A first adder ADD#1 adds the FILTER_OUT to the first reference level '7' of the 8 state mode. The 2nd to an 8th adders ADD#2 to ADD#8 add the FILTER_OUT to the selected reference levels fed from the MUX#1 to a MUX#7 of the reference level selection module 90, respectively. A 9th to a 15th adders ADD#9 to ADD#15 add the FILTER_OUT to the 9th to the 15th reference levels 14, −4, −6, −8, −10, −12 and −14 of the 16 state mode, respectively.

The branch selection module 94 contains a plurality of multiplexors MUX#8 to MUX#15 to select either the 8 state mode or the 16 state mode based on the FENA. The 8th multiplexor MUX#8 selects either an adding result of the first adder ADD#1 for the 8 state mode or the FILTER_OUT for the 16 state mode based on the FENA to provide the selected result to the absolute value calculation module 96. The 9th to the 15th multiplexors MUX#9 to MUX#15 select either '0' for the 8 state mode or adding results fed from the 9th to the 15th adders for the 16 state mode based on the FENA, respectively, to provide the selected result to the absolute value calculation module 96.

The absolute calculation module 96 contains a plurality of absolute calculators ABS#1 to ABS#15 connected in parallel, wherein each absolute calculator calculates an absolute value of either the selected result of the corresponding multiplexor among the MUX#8 to the MUX#15 or an adding result of the corresponding adder among the ADD#2 to the ADD#8. That is, 8 branch metrics in the 8 state mode are provided in parallel while 15 branch metrics in the 16 state mode are provided in parallel.

The BMU 2 can generate all sorts of branch metrics which can be generated by the input data as described above. Since branch metrics are characterized for each state, the ACS 3 can select branch metrics required.

Figure 13:
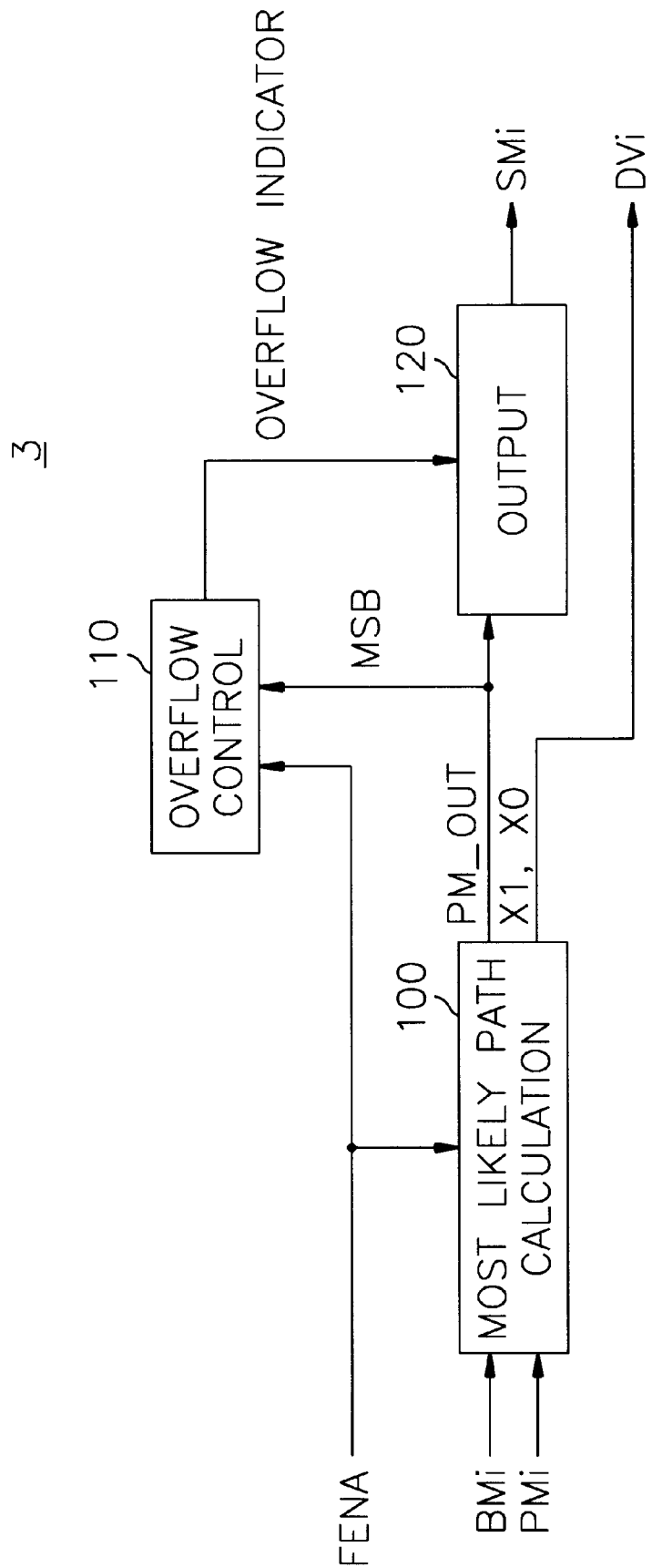
FIG. 13 provides a block diagram of an add-compare-select (ACS) shown in FIG. 7.

FIG. 13 shows a block diagram of the ACS 3, which includes a most likely path calculation module 100, an overflow control module 110 and an output module 120. The mostly likely path calculation module 110 receives 4 branch metrics BMi's and 4 previous path metrics PMi's for each state of the 8 or the 16 state mode based on the FENA; selects a most likely path metric PM_OUT determined by a maximum likelihood decoding algorithm; and provides the PM_OUT with a determination vector DVi thereof, wherein the DVi represents input bits (X1, X0) of a branch leading into the most likely path.

The overflow control module 110 receives the FENA; and detects if there is an overflow state based on a most significant bit(MSB) of the PM_OUT to generate an overflow indicator signal.

The output module 120 modifies the PM_OUT based on the overflow indicator signal to provide the modified PM_OUT as a survivor metric SMi to the PMN 4.

Figure 14:
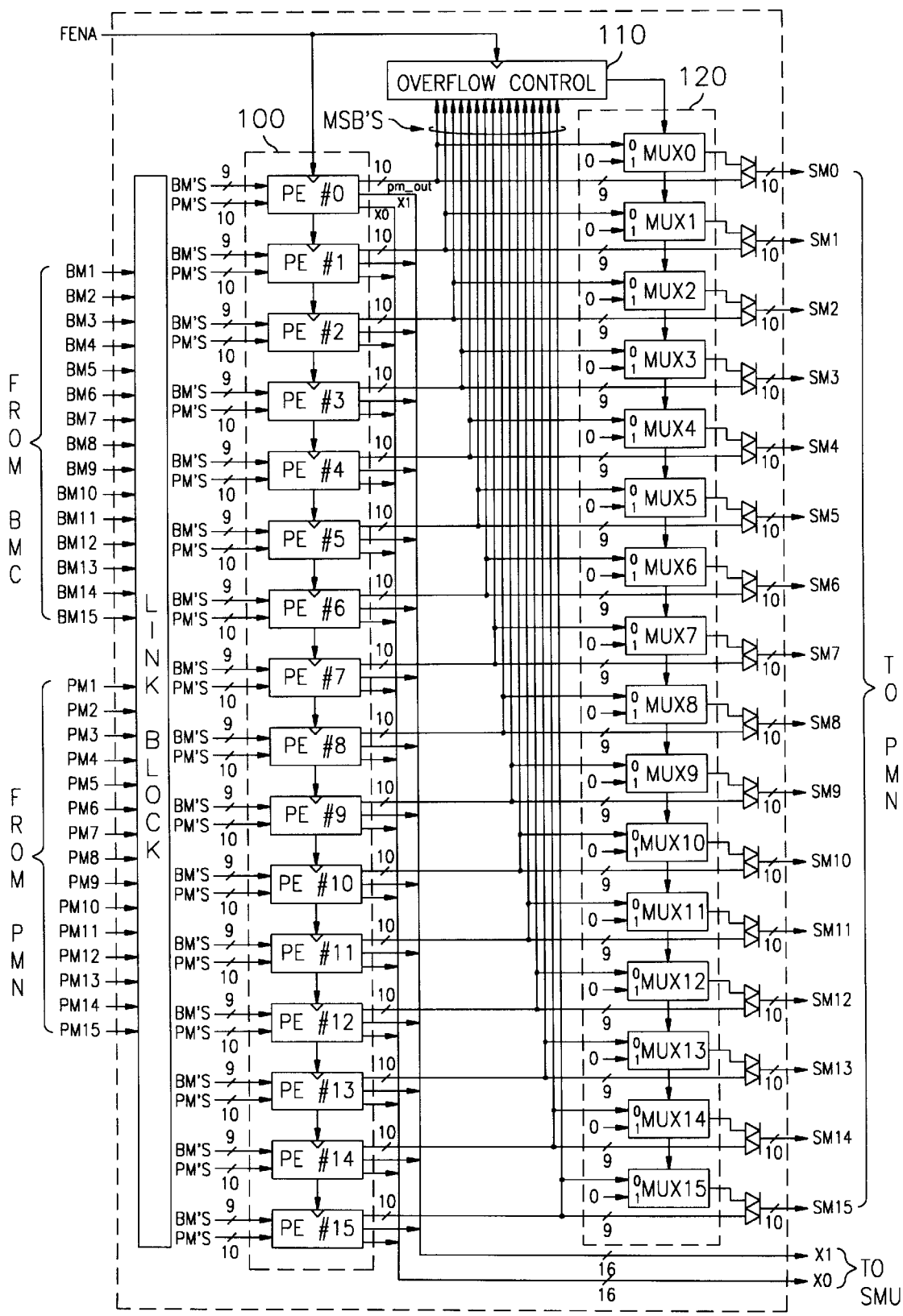
FIG. 14 depicts a exemplary circuit for the ACS shown in FIG. 13.

FIG. 14 illustrates an exemplary circuit of the ACS 3 shown in FIG. 13.

The most likely path calculation module 100 contains 16 processing elements PE#0 to PE#15 connected in parallel with each other, wherein each processing element selects 4 branch metrics BM's and 4 path metrics PM's for each state based on the FENA to generate 4 candidate path metrics; and selects one path metric with a minimum distance by comparing the 4 candidate path metrics from each other. The selected path metric is provided as the PM_OUT. The input bits (X1, X0) of the most likely path are provided as the determination vector DVi thereof.

The overflow control module 110 generates the overflow indicator by carrying out an adding operation on all MSB's of all PM_OUT's fed from all the processing elements PE#0 to PE#15 based on the FENA. For example, in case all the MSB's of the PM_OUT's are '1', the overflow indicator may indicate the generation of an overflow.

The output module 120 contains 16 multiplexors MUX0 to MUX15 arranged in parallel, wherein each multiplexor provides either the MSB of the PM_OUT fed from each processing element or '0' based on the overflow indicator.

That is, if there is no overflow in the PM_OUT, the MSB of the PM_OUT is provided and, if otherwise, '0' is provided.

Since the PM_OUT can be adjusted against the overflow of the PM_OUT as described above, the size of the register can be reduced. The adjusted PM_OUT is determined as a survivor metric $SM_i$, which has either the MSB or '0', i.e., the 1-bit output fed from each of the multiplexors MUX0 to MUX15 and the remaining 9 bits except the MSB among the PM_OUT fed from each of the processing elements PE#0 to PE#15. The $SM_i$ is provided to the PMN 4 to be used as a previous path metric $PM_i$ in the next step.

Figure 15A:
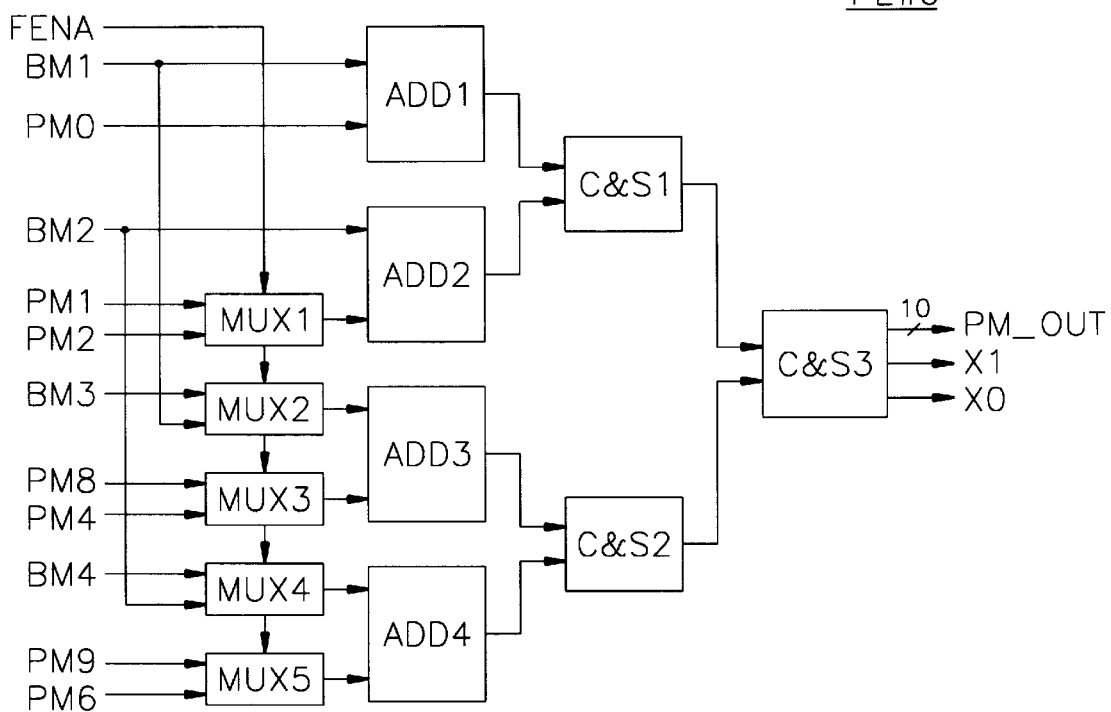
FIGS. 15A to 15P represent detailed circuits of processing elements shown in FIG. 14, respectively.
Figure 15B:
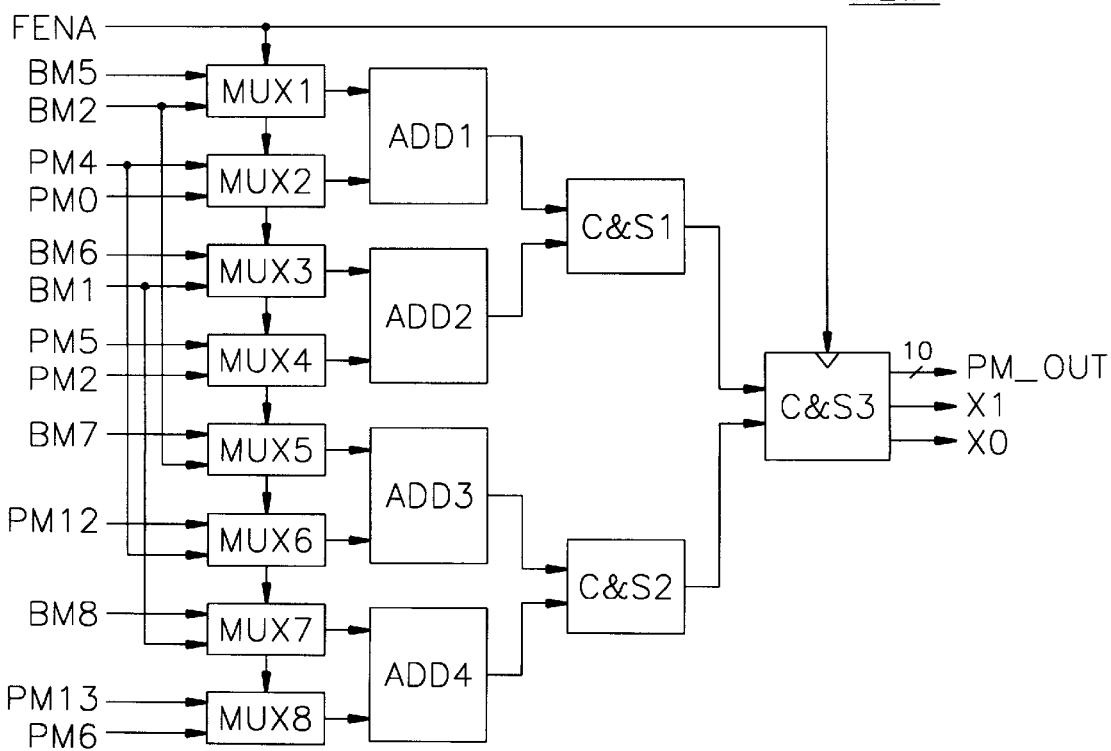
Figure 15C:
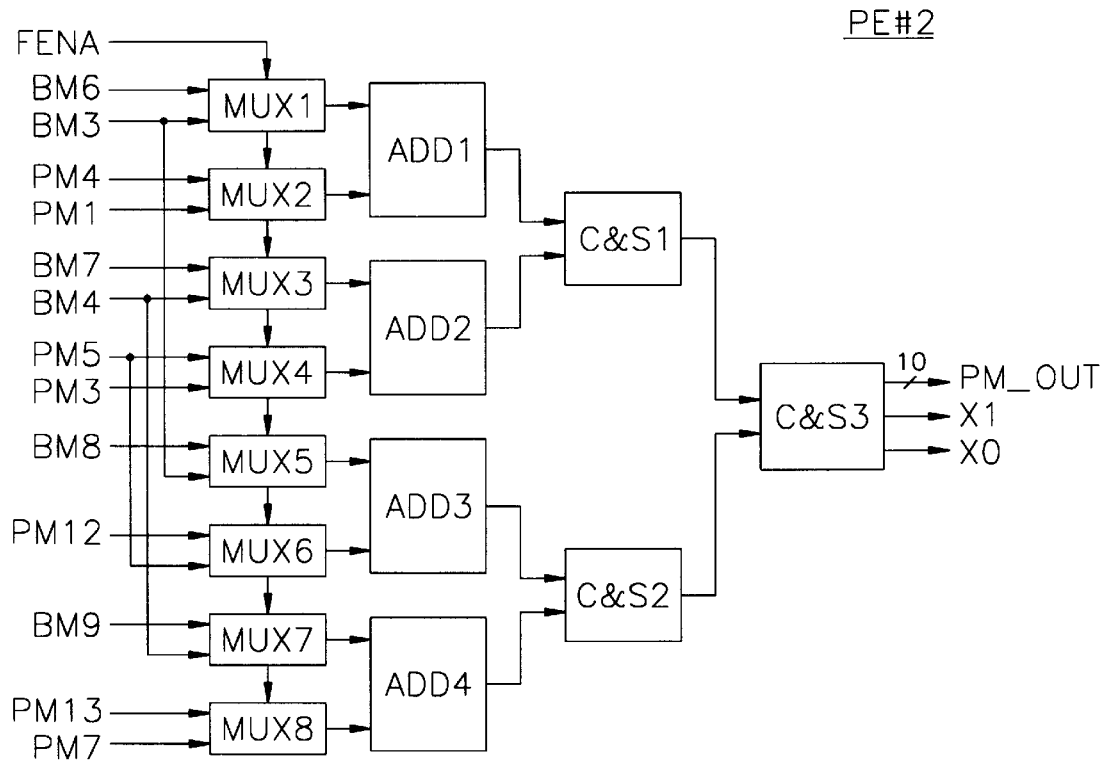
Figure 15D:
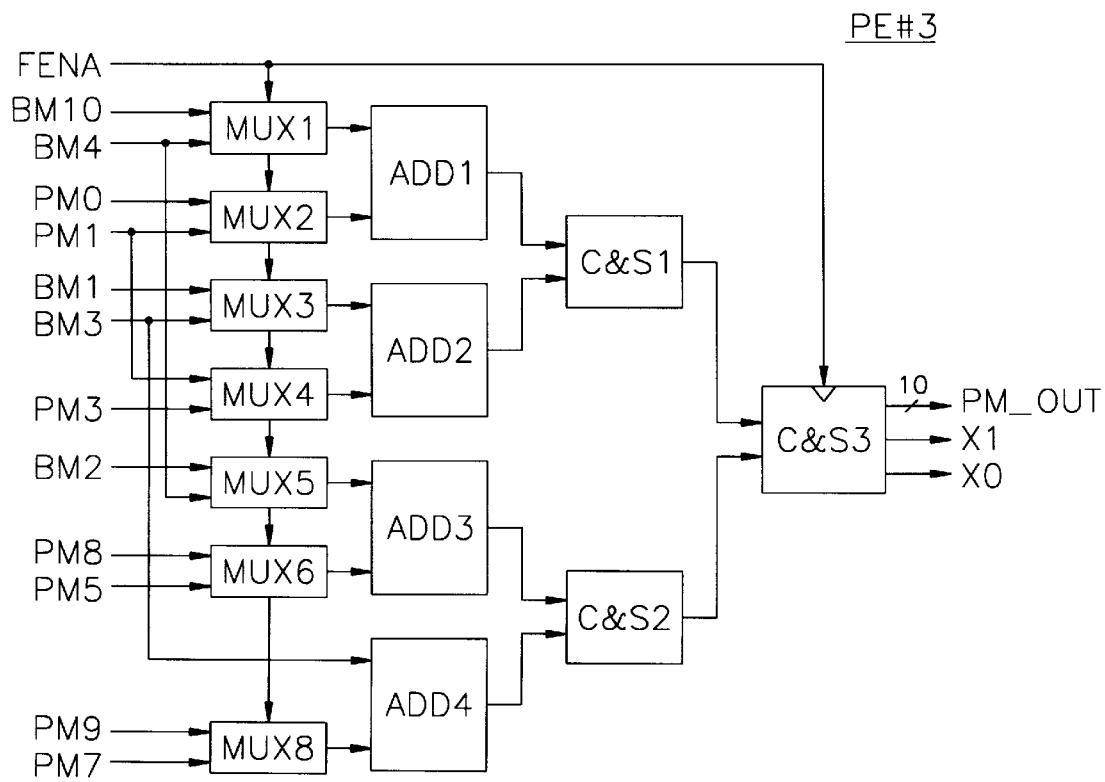
Figure 15E:
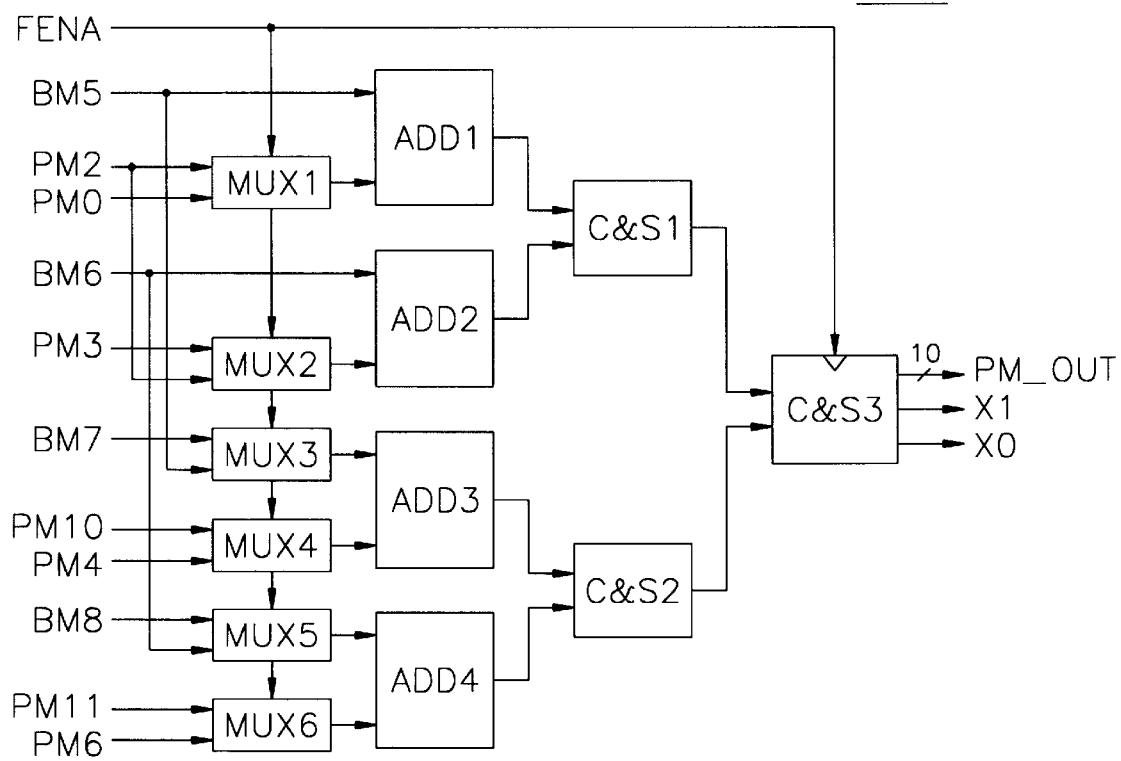
Figure 15F:
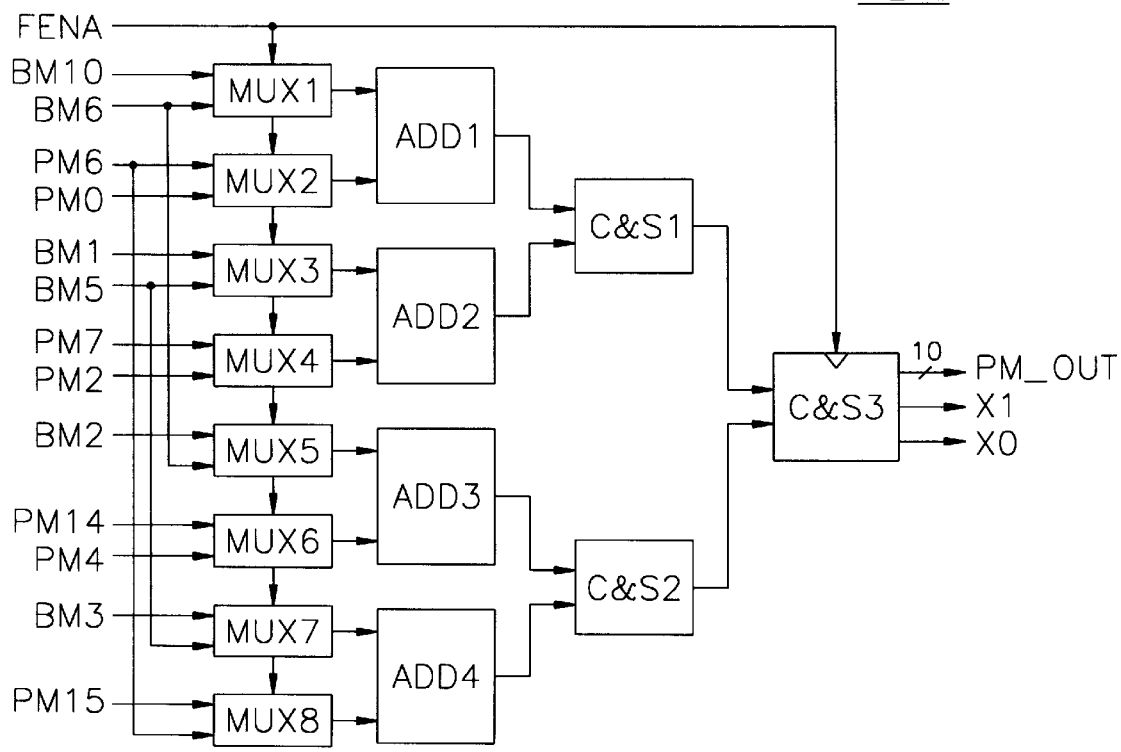
Figure 15G:
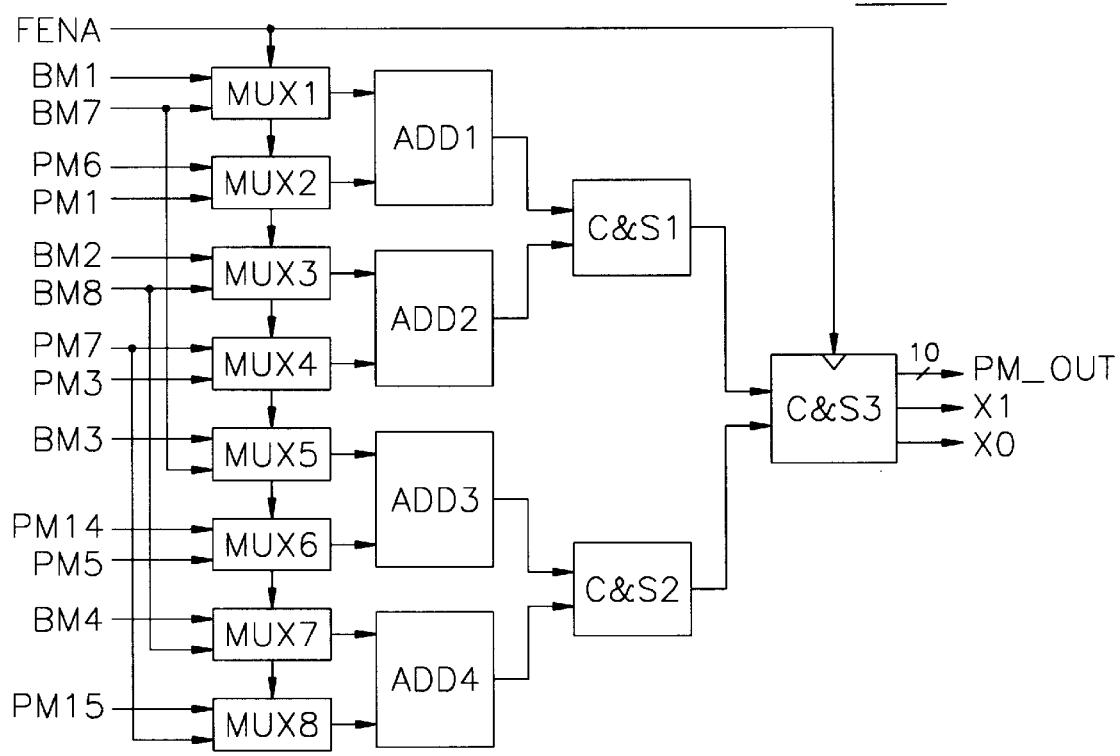
Figure 15H:
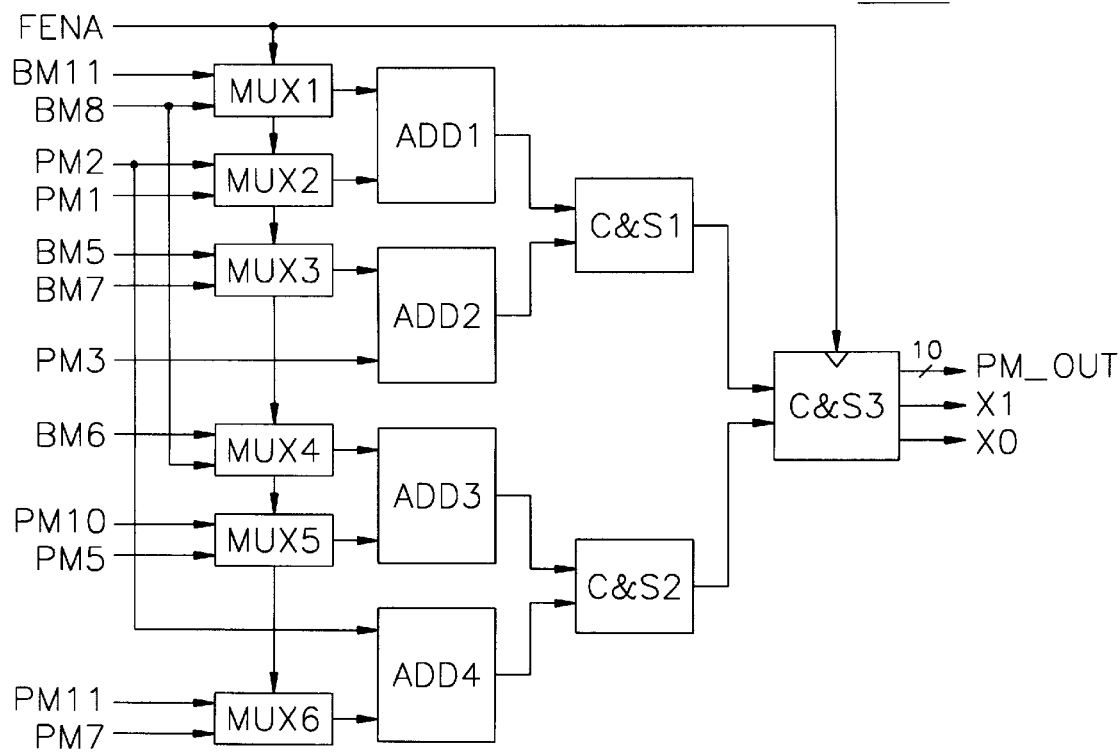

A link block shown in FIG. 14 is for connecting to all the 16 processing elements PE#0 to PE#15 the branch metrics $BM_i$'s from the BMU 2 and the previous path metrics $PM_i$'s from the PMN 4. Referring to FIGS. 15A to 15P, there are shown detailed blocks for simply illustrating branch metric connection lines and path metric connection lines connected to the 16 processing elements PE#0 to PE#15, respectively.

(1) The 16 State Mode

A determination vector $DV_i$ (X1, S'0) for the PM_OUT selected in the ACS 3 and S'0 is provided to the SMU 5, wherein the bit X1 represents the higher bit of the input bits $(X_1, X_0)$ calculated by shifting from the previous state $(S'_3, S'_2, S'_1, S'_0)$ to the current state $(S_3, S_2, S_1, S_0)$ and the bit S'0 represents the last bit of the previous state $(S'_3, S'_2, S'_1, S'_0)$. The bits X1 and S'0 are required in order to decode in accordance with a traceback algorithm in the SMU. That is, the bits X1 and S'0 for each state are stored as far as a decoding depth and, then, the current state are traced back based on any state and the bits X1 and S'0 to decode the original symbol (X1, X0), wherein, since the bit X0 is equal to the last bit of a state, the bit X0 need not be stored if the state may be known.

(2) The 8 State Mode

Similarly to the 16 state mode, the input bits (X1, X0) for the PM_OUT selected in the ACS 3 are provided to the SMU to be stored and the SMU carries out the traceback algorithm based on the input bits (X1, X0).

There is illustrated a method for extracting the determination vector (X1, S0) for the most likely path determined in each state hereinafter.

TABLE 11

| 16 state (i) | most likely path (PM_OUT) | determination vector (DVi = (X1, S0)) |
|---|---|---|
| 0(0000)~7(0111) | $PM_{i,1} + BM_{i,1}$ | X1 = 0, S0 = 0 |
| | $PM_{i,2} + BM_{i,2}$ | X1 = 0, S0 = 1 |
| | $PM_{i,3} + BM_{i,3}$ | X1 = 1, S0 = 0 |
| | $PM_{i,4} + BM_{i,4}$ | X1 = 1, S0 = 1 |
| 8(1000)~15(111) | $PM_{i,1} + BM_{i,1}$ | X1 = 1, S0 = 0 |
| | $PM_{i,2} + BM_{i,2}$ | X1 = 1, S0 = 1 |
| | $PM_{i,3} + BM_{i,3}$ | X1 = 0, S0 = 0 |
| | $PM_{i,4} + BM_{i,4}$ | X1 = 0, S0 = 1 |

Table 11 shows determination vectors in the 16 state mode, wherein each determination vector corresponds to the most likely path metric PM_OUT with a minimum metric among 4 candidate path metrics in the 16 state mode. For the higher 0 to 7 states in the 16 state mode, a first candidate metric $PM_{i,1}+BM_{i,1}$ corresponds to the determination vector (X1, S0)=(0, 0); a second candidate metric $PM_{i,2}+BM_{i,2}$ to the determination vector (X1, S0)=(0, 1); a third candidate metric $PM_{i,3}+BM_{i,3}$, to the determination vector (X1, S0)= (1, 0); and a fourth candidate metric $PM_{i,4}+BM_{i,4}$ to the determination vector (X1, S0)=(1, 1).

For the lower 8 to 15 states in the 16 state mode, a first candidate metric $PM_{i,1}+BM_{i,1}$ corresponds to the determination vector (X1, S0)=(1, 0); a second candidate metric $PM_{i,2}+BM_{i,2}$ to the determination vector (X1, S0)=(1, 1); a third candidate metric $PM_{i,3}+BM_{i,3}$ to the determination vector (X0, S0)=(1, 0); and a fourth candidate metric $PM_{i,4}+BM_{i,4}$ to the determination vector (X1, S0)=(0, 1).

Table 12 shows determination vectors in the 8 state mode, wherein each determination vector corresponds to the most likely path metric PM_OUT with a minimum metric among 4 candidate path metrics in the 8 state mode.

TABLE 12

| 8 state (i) | most likely path (PM_OUT) | determination vector (DVi = (X1, X0)) |
|---|---|---|
| 0(000), 2(010) | $PM_{i,1} + BM_{i,1}$ | X1 = 0, X0 = 0 |
|  | $PM_{i,2} + BM_{i,2}$ | X1 = 0, X0 = 1 |
|  | $PM_{i,3} + BM_{i,3}$ | X1 = 1, X0 = 0 |
|  | $PM_{i,4} + BM_{i,4}$ | X1 = 1, X0 = 1 |
| 1(001), 3(011) | $PM_{i,1} + BM_{i,1}$ | X1 = 0, X0 = 1 |
|  | $PM_{i,2} + BM_{i,2}$ | X1 = 0, X0 = 0 |
|  | $PM_{i,3} + BM_{i,3}$ | X1 = 1, X0 = 1 |
|  | $PM_{i,4} + BM_{i,4}$ | X1 = 1, X0 = 0 |
| 4(100), 6(110) | $PM_{i,1} + BM_{i,1}$ | X1 = 1, X0 = 0 |
|  | $PM_{i,2} + BM_{i,2}$ | X1 = 1, X0 = 1 |
|  | $PM_{i,3} + BM_{i,3}$ | X1 = 0, X0 = 0 |
|  | $PM_{i,4} + BM_{i,4}$ | X1 = 0, X0 = 1 |
| 5(101), 7(111) | $PM_{i,1} + BM_{i,1}$ | X1 = 1, X0 = 1 |
|  | $PM_{i,2} + BM_{i,2}$ | X1 = 1, X0 = 0 |
|  | $PM_{i,3} + BM_{i,3}$ | X1 = 0, X0 = 1 |
|  | $PM_{i,4} + BM_{i,4}$ | X1 = 0, X0 = 0 |

Referring to Tables 13 and 14, it is illustrated a new rule for calculating candidate path metrics ADD's based on the rule for calculating branch metrics shown in Tables 9 and 10 and the rule extracting for determination vectors for candidate path metrics shown in Tables 11 and 12.

TABLE 13 candidate path metrics in 16 state mode

| state(i) | candidate path metric ($ADD_{i,j}$ = BMu + PMi) | state(i) | candidate path metric ($ADD_{i,j}$ = BMu + PMi) |
|---|---|---|---|
| 0 (=0000) | $ADD_{0,1}$ = BM1 + PM0 | 8 (=1000) | $ADD_{8,1}$ = BM12 + PM0 |
|  | $ADD_{0,2}$ = BM2 + PM1 |  | $ADD_{8,2}$ = BM10 + PM1 |
|  | $ADD_{0,3}$ = BM3 + PM8 |  | $ADD_{8,3}$ = BM1 + PM8 |
|  | $ADD_{0,4}$ = BM4 + PM9 |  | $ADD_{8,4}$ = BM2 + PM9 |
| 1 (=0001) | $ADD_{1,1}$ = BM5 + PM4 | 9 (=1001) | $ADD_{9,1}$ = BM13 + PM4 |
|  | $ADD_{1,2}$ = BM6 + PM5 |  | $ADD_{9,2}$ = BM11 + PM5 |
|  | $ADD_{1,3}$ = BM7 + PM12 |  | $ADD_{9,3}$ = BM5 + PM12 |
|  | $ADD_{1,4}$ = BM8 + PM13 |  | $ADD_{9,4}$ = BM6 + PM13 |
| 2 (=0010) | $ADD_{2,1}$ = BM6 + PM4 | a (=1010) | $ADD_{a,1}$ = BM11 + PM4 |
|  | $ADD_{2,2}$ = BM7 + PM5 |  | $ADD_{a,2}$ = BM5 + PM5 |
|  | $ADD_{2,3}$ = BM8 + PM12 |  | $ADD_{a,3}$ = BM6 + PM12 |
|  | $ADD_{2,4}$ = BM9 + PM13 |  | $ADD_{a,4}$ = BM7 + PM13 |
| 3 (=0011) | $ADD_{3,1}$ = BM10 + PM0 | b (=1011) | $ADD_{b,1}$ = BM14 + PM0 |
|  | $ADD_{3,2}$ = BM1 + PM1 |  | $ADD_{b,2}$ = BM12 + PM1 |
|  | $ADD_{3,3}$ = BM2 + PM8 |  | $ADD_{b,3}$ = BM10 + PM8 |
|  | $ADD_{3,4}$ = BM3 + PM9 |  | $ADD_{b,4}$ = BM1 + PM9 |
| 4 (=0100) | $ADD_{4,1}$ = BM5 + PM2 | c (=1100) | $ADD_{c,1}$ = BM13 + PM2 |
|  | $ADD_{4,2}$ = BM6 + PM3 |  | $ADD_{c,2}$ = BM11 + PM3 |
|  | $ADD_{4,3}$ = BM7 + PM10 |  | $ADD_{c,3}$ = BM5 + PM10 |
|  | $ADD_{4,4}$ = BM8 + PM11 |  | $ADD_{c,4}$ = BM6 + PM11 |
| 5 (=0101) | $ADD_{5,1}$ = BM10 + PM6 | d (=101) | $ADD_{d,1}$ = BM14 + PM6 |
|  | $ADD_{5,2}$ = BM1 + PM7 |  | $ADD_{d,2}$ = BM12 + PM7 |
|  | $ADD_{5,3}$ = BM2 + PM14 |  | $ADD_{d,3}$ = BM10 + PM14 |
|  | $ADD_{5,4}$ = BM3 + PM15 |  | $ADD_{d,4}$ = BM1 + PM15 |
| 6 (=0110) | $ADD_{6,1}$ = BM1 + PM6 | e (=11100) | $ADD_{e,1}$ = BM12 + PM6 |
|  | $ADD_{6,2}$ = BM2 + PM7 |  | $ADD_{e,2}$ = BM10 + PM7 |
|  | $ADD_{6,3}$ = BM3 + PM14 |  | $ADD_{e,3}$ = BM1 + PM14 |
|  | $ADD_{6,4}$ = BM4 + PM15 |  | $ADD_{e,4}$ = BM2 + PM15 |
| 7 (=0111) | $ADD_{7,1}$ = BM11 + PM2 | f (=1111) | $ADD_{f,1}$ = BM15 + PM2 |
|  | $ADD_{7,2}$ = BM5 + PM3 |  | $ADD_{f,2}$ = BM13 + PM3 |
|  | $ADD_{7,3}$ = BM6 + PM10 |  | $ADD_{f,3}$ = BM11 + PM10 |
|  | $ADD_{7,4}$ = BM7 + PM11 |  | $ADD_{f,4}$ = BM5 + PM11 |

As shown in Table 13, each state in the 16 state mode has 4 branch metrics BMu's and also 4 candidate path metrics $ADD_{i,j}$'s obtained by adding the 4 branch metrics to 4 path metrics PMi's corresponding to the previous state, respectively, wherein BMu is a uth branch metric, an index u of each branch metric being a positive integer less than or equal to 15 as shown in Table 9; PMi is a path metric corresponding to an ith state of the previous step, i being equal to either 0 or a positive integer less than or equal to 15; and $ADD_{i,j}$ is a jth candidate metric of an ith state, i being a state index and j being an index for identifying 4 candidate path metrics. If jth candidate metric is selected as the most likely path metric PM_OUT, the determination vector can be extracted according to the rule shown in Table 11.

As shown in Table 14, each state in the 8 state mode has 4 branch metrics BMu's and also 4 candidate path metrics $ADD_{i,j}$'s obtained by adding the 4 branch metrics to 4 path metrics PMi's corresponding to the previous state, respectively, wherein BMu is a uth branch metric, an index u of each branch metric being a positive integer less than or equal to 8 as shown in Table 10; PMi is a path metric corresponding to an ith state of the previous step, i being equal to either 0 or a positive integer less than or equal to 7; and $ADD_{i,j}$ is a jth candidate metric of an ith state, i being a state index and j being an index for identifying 4 candidate path metrics. If jth candidate metric is selected as a most likely path metric PM_OUT, the determination vector can be extracted according to the rule shown in Table 12.

TABLE 14 candidate path metrics in the 8 state mode

| state(i) | candidate path metric ($ADD_{i,j}$ = BMu + PMi) | state(i) | candidate path metric ($ADD_{i,j}$ = BMu + PMi) |
|---|---|---|---|
| 0 (=000) | $ADD_{0,1}$ = BM1 + PM0 | 4 (=100) | $ADD_{4,1}$ = BM5 + PM0 |
|  | $ADD_{0,2}$ = BM2 + PM2 |  | $ADD_{4,2}$ = BM6 + PM2 |
|  | $ADD_{0,3}$ = BM1 + PM4 |  | $ADD_{4,3}$ = BM5 + PM4 |
|  | $ADD_{0,4}$ = BM2 + PM6 |  | $ADD_{4,4}$ = BM6 + PM6 |
| 1 (=001) | $ADD_{1,1}$ = BM2 + PM0 | 5 (=101) | $ADD_{5,1}$ = BM6 + PM0 |
|  | $ADD_{1,2}$ = BM1 + PM2 |  | $ADD_{5,2}$ = BM5 + PM2 |
|  | $ADD_{1,3}$ = BM2 + PM4 |  | $ADD_{5,3}$ = BM6 + PM4 |
|  | $ADD_{1,4}$ = BM1 + PM6 |  | $ADD_{5,4}$ = BM5 + PM6 |
| 2 (=010) | $ADD_{2,1}$ = BM3 + PM1 | 6 (=110) | $ADD_{6,1}$ = BM7 + PM1 |
|  | $ADD_{2,2}$ = BM4 + PM3 |  | $ADD_{6,2}$ = BM8 + PM3 |
|  | $ADD_{2,3}$ = BM3 + PM5 |  | $ADD_{6,3}$ = BM7 + PM5 |
|  | $ADD_{2,4}$ = BM4 + PM7 |  | $ADD_{6,4}$ = BM8 + PM7 |
| 3 (=011) | $ADD_{3,1}$ = BM4 + PM1 | 7 (=111) | $ADD_{7,1}$ = BM8 + PM1 |
|  | $ADD_{3,2}$ = BM3 + PM3 |  | $ADD_{7,2}$ = BM7 + PM3 |
|  | $ADD_{3,3}$ = BM4 + PM5 |  | $ADD_{7,3}$ = BM8 + PM5 |
|  | $ADD_{3,4}$ = BM3 + PM7 |  | $ADD_{7,4}$ = BM7 + PM7 |

As shown in FIG. 14, each state corresponds to each of 16 processing elements arranged in parallel, wherein a 0th processing element PE#0 corresponds to state '0'; a first processing element to state '1'; and so on. All the 16 processing elements generate most likely path metrics in the 16 state mode, while only the higher 8 processing elements generate most likely path metrics in the 8 state mode.

Referring to FIGS. 15A to 15P, there are illustrated detailed circuits for processing elements, respectively. That is, FIG. 15A represents a circuit of the 0th processing element(PE#0); FIG. 15B the first processing element (PE#1); FIG. 15C the 2nd processing element(PE#2); and so on.

As described above, the 0th to a 7th processing elements PE#0 to PE#7 are in charge of all of the states 0(000) to 7(111) of the 8 state mode and the higher states 0(0000) to 7(0111) of 16 state mode, respectively, while an 8th to the 15th processing elements PE#8 to PE#15 are only in charge of the lower states 8(1000) to 15(1111) of the 16 state mode, respectively. Each processing element PE contains a multiplicity of multiplexors(MUX), 4 adders(ADD) and 3 compare-select modules(C&S).

Typically, only the 0th processing element PE#0 shown in FIG. 15A will be described in detail among the processing elements PE#0 to PE#7 for operating in both the 8 state and the 16 state modes; only the 8th processing element PE#8 shown in FIG. 15I will be described in detail among the processing elements PE#8 to PE#15 for operating only in the 16 state mode; and the other processing elements will not be described with similar elements and operation.

Referring to FIG. 15A, the 0th processing element (PE#0) contains 5 multiplexors MUX1 to MUX5, 4 adders ADD1 to ADD4 and 3 compare-select modules C&S1 to C&S3. Each of the multiplexor MUX1 to MUX5 selects the branch metric BMu and the path metric PMi for the previous state in either the 8 state mode or the 16 state mode based on the FENA. Each of the adders ADD1 to ADD4 adds the branch metric BMu to the path metric PMi so that total 4 candidate path metrics $ADD_{i,j}$'s are generated. The compare-select modules C&S1 to C&S3 compare the 4 candidate path metrics $ADD_{i,j}$'s with each other to select a candidate path metric $ADD_{i,j}$ with a minimum distance as the most likely path metric PM_OUT and provide both the PM_OUT and the determination vector $DV_i$=(X1,X0) thereof.

In the 16 state mode, the adders ADD1 to ADD4 receive the PM's and the BM's selected in the multiplexors based on the FENA '1', respectively, and provides 4 candidate path metrics, respectively. The 1st candidate path metric $ADD_{0,1}$ is equal to a total value BM1+PM0 of the 1st branch metric BM1 and the 0th path metric PM0; the 2nd candidate path metric $ADD_{0,2}$ is equal to a total value BM2+PM1 of the 2nd branch metric BM2 and the 1st path metric PM1; the 3rd candidate path metric $ADD_{0,3}$ is equal to a total value BM3+PM8 of the 3rd branch metric BM3 and the 8th path metric PM8; and the 4th candidate path metric $ADD_{0,4}$ is equal to a total value BM4+PM9 of the 4th branch metric BM4 and the 9th path metric PM9.

The 1st compare-select module C&S1 receives the 1st and the 2nd candidate path metrics $ADD_{0,1}$ and $ADD_{0,2}$ to compare with each other and provides a smaller candidate path metric to the 3rd compare-select module C&S3. The 2nd compare-select module C&S2 receives the 3rd and the 4th candidate path metrics $ADD_{0,3}$ and $ADD_{0,4}$ to compare with each other and provides a smaller candidate path metric to the 3rd compare-select module C&S3. The 3rd compare-select module C&S3 compares two candidate path metrics fed from the C&S1 and the C&S2, respectively; selects a smaller candidate path metric as the most likely path metric PM_OUT; and provides the PM_OUT and the determination vector $DV_0$ thereof, which corresponds to the input bits (X1, X0).

In the 8 state mode, the adders ADD1 to ADD4 receive the PM's and the BM's selected in the multiplexors based on the FENA '0', respectively, and calculates to provide 4 candidate path metrics, respectively. The 1st candidate path metric $ADD_{0,1}$ is equal to a total value BM1+PM0 of the 1st branch metric BM1 and the 0th path metric PM0; the 2nd candidate path metric $ADD_{0,2}$ to a total value BM2+PM2 of the 2nd branch metric BM2 and the 2nd path metric PM2; the 3rd candidate path metric $ADD_{0,3}$ to a total value BM1+PM4 of the 1st branch metric BM1 and the 4th path metric PM4; and the 4th candidate path metric $ADD_{0,4}$ to a total value BM2+PM6 of the 2nd branch metric BM2 and the 6th path metric PM6. The 1st to the 3rd compare-select modules C&S1 to C&S3 select a minimum path metric of the 4 candidate path metrics as the PM_OUT; and provides the PM_OUT and the determination vector $DV_0$ therefor to the SMU 5.

The determination vector $DV_i$ for the most likely path metric PM_OUT can be obtained through the same method in the 8 and the 16 state modes. That is, the 1st candidate path metric $ADD_{0,1}$ selected as the PM_OUT in the C&S3 corresponds to the determination vector (0,0); the 2nd candidate path metric $ADD_{0,2}$ to the determination vector (0,1); the 3rd candidate path metric $ADD_{0,3}$ to the determination vector (1,0); and the 4th candidate path metric $ADD_{0,4}$ to the determination vector (1,1).

The 1st, the 3rd, the 4th, the 5th, the 6th and the 7th processing elements PE#1, PE#3, PE#4, PE#5, PE#5, PE#6 and PE#7 select in the C&S3 the determination vectors $DV_i$'s for either the 8 or the 16 state mode based on the FENA, which are different from the remaining processing elements.

Figure 15I:
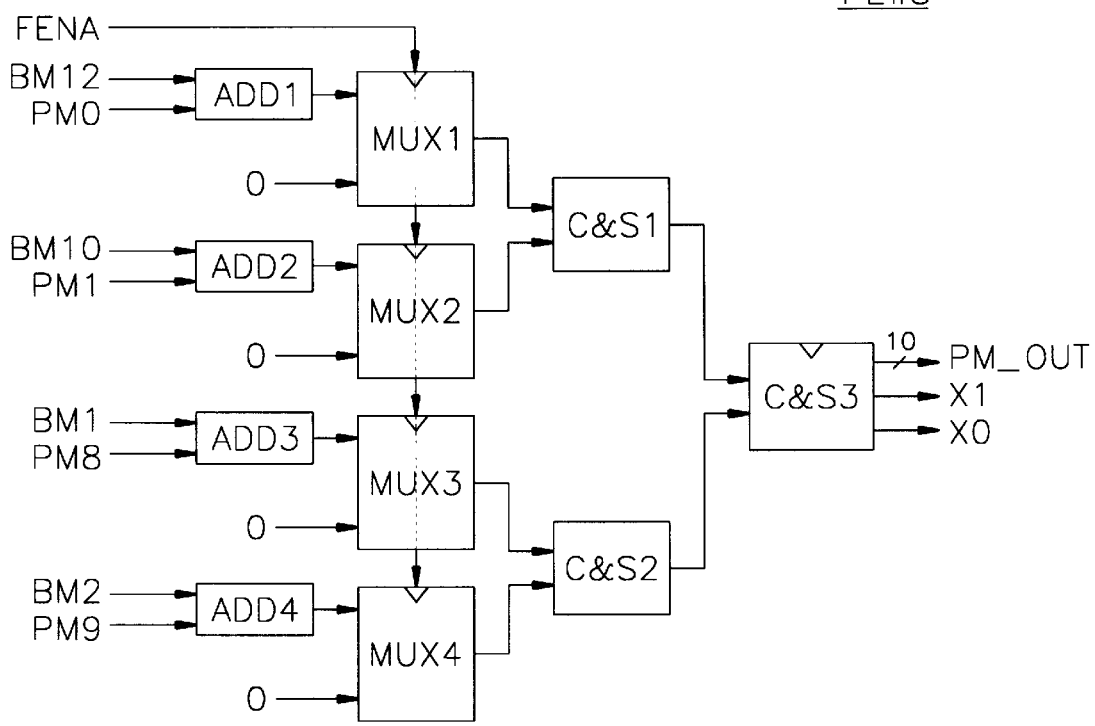
Figure 15J:
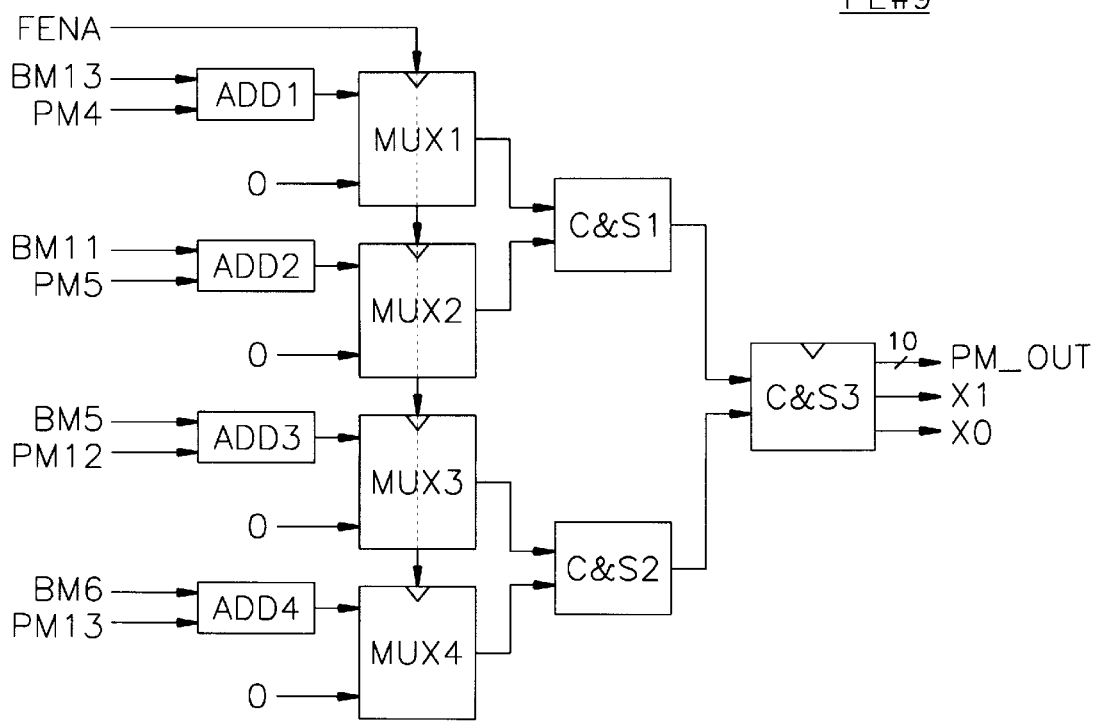
Figure 15K:
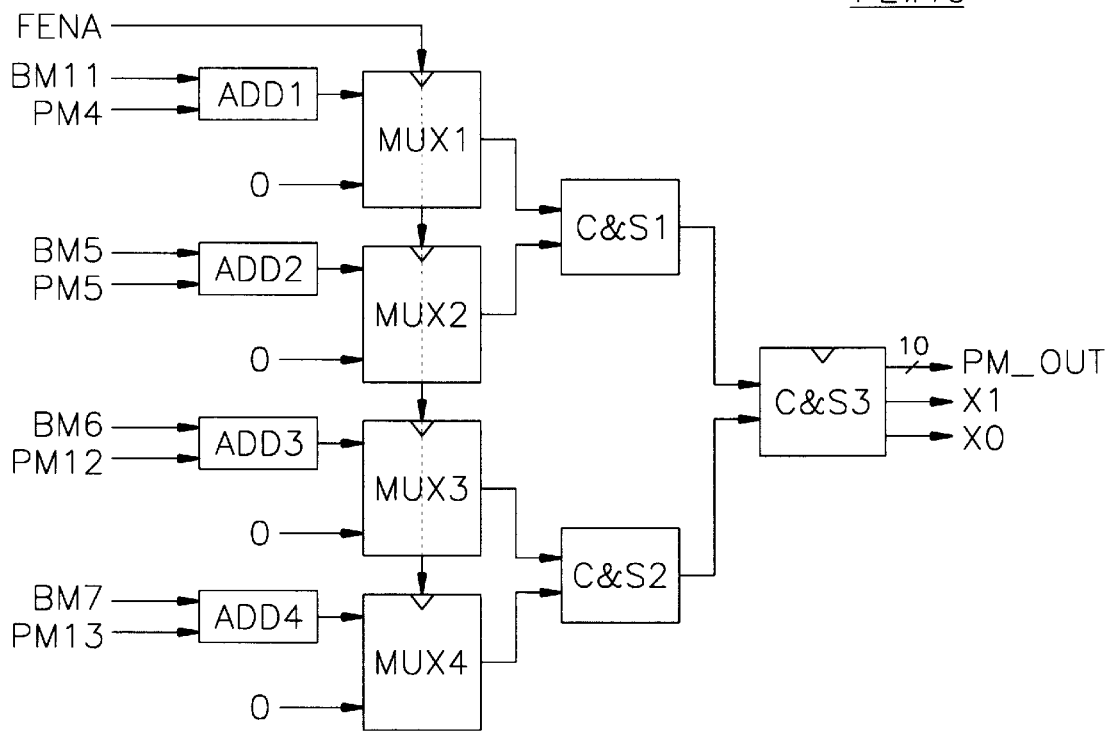
Figure 15L:
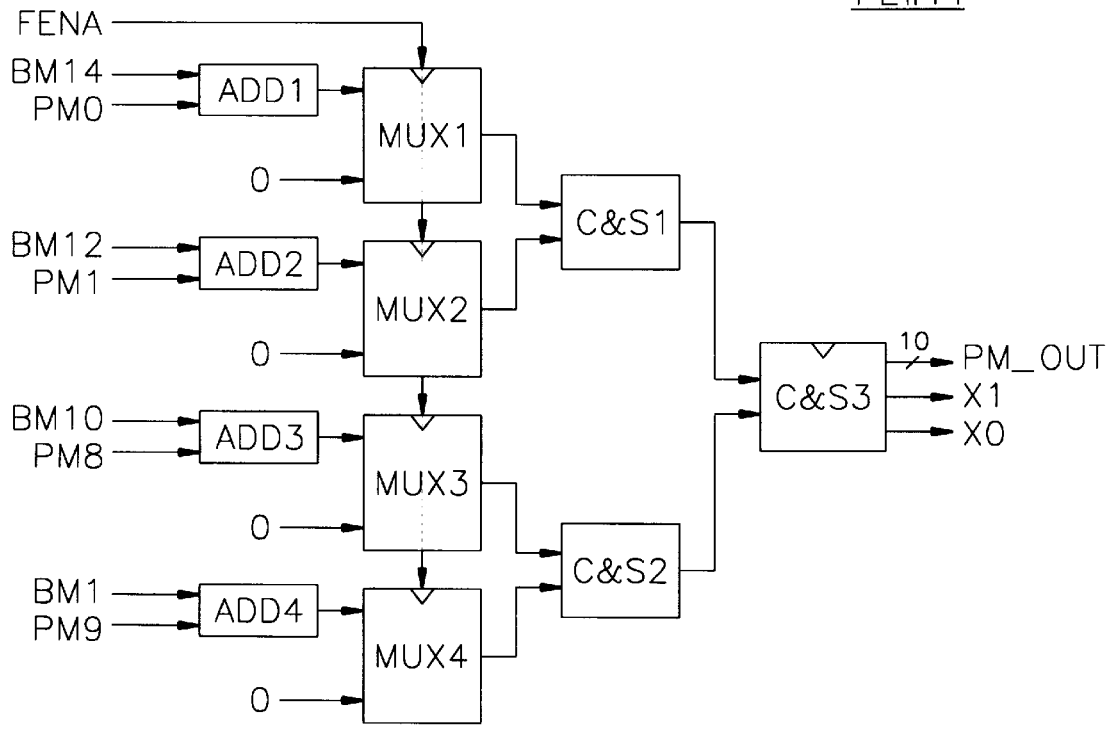
Figure 15M:
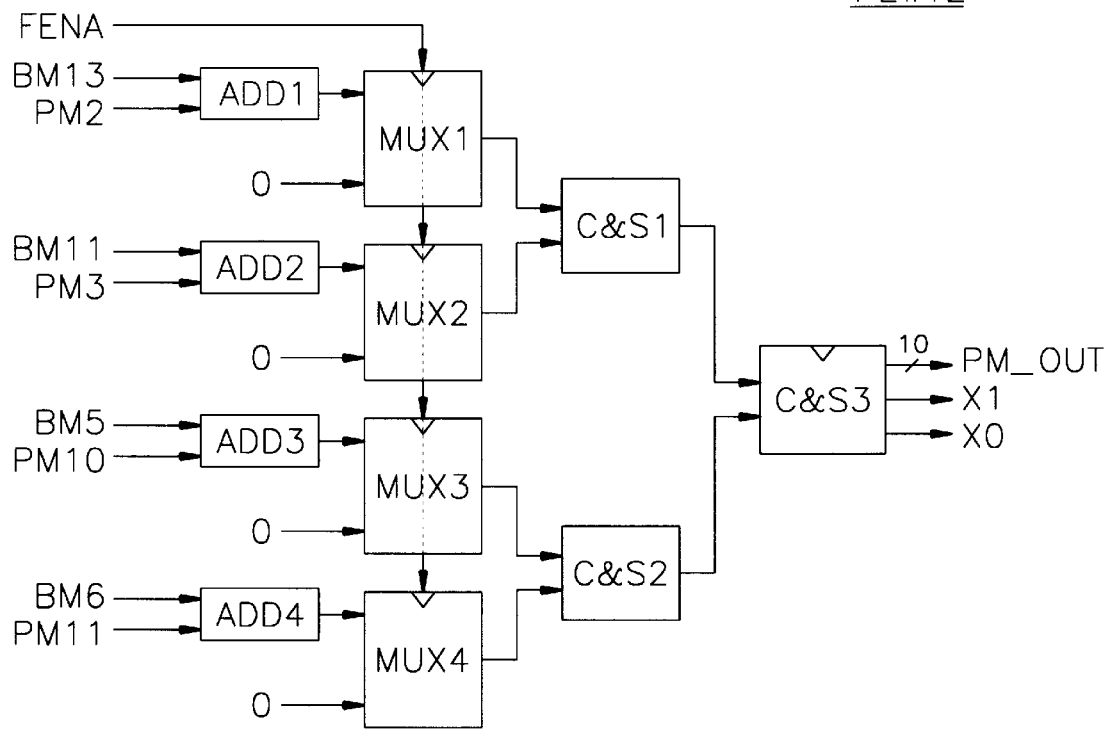
Figure 15N:
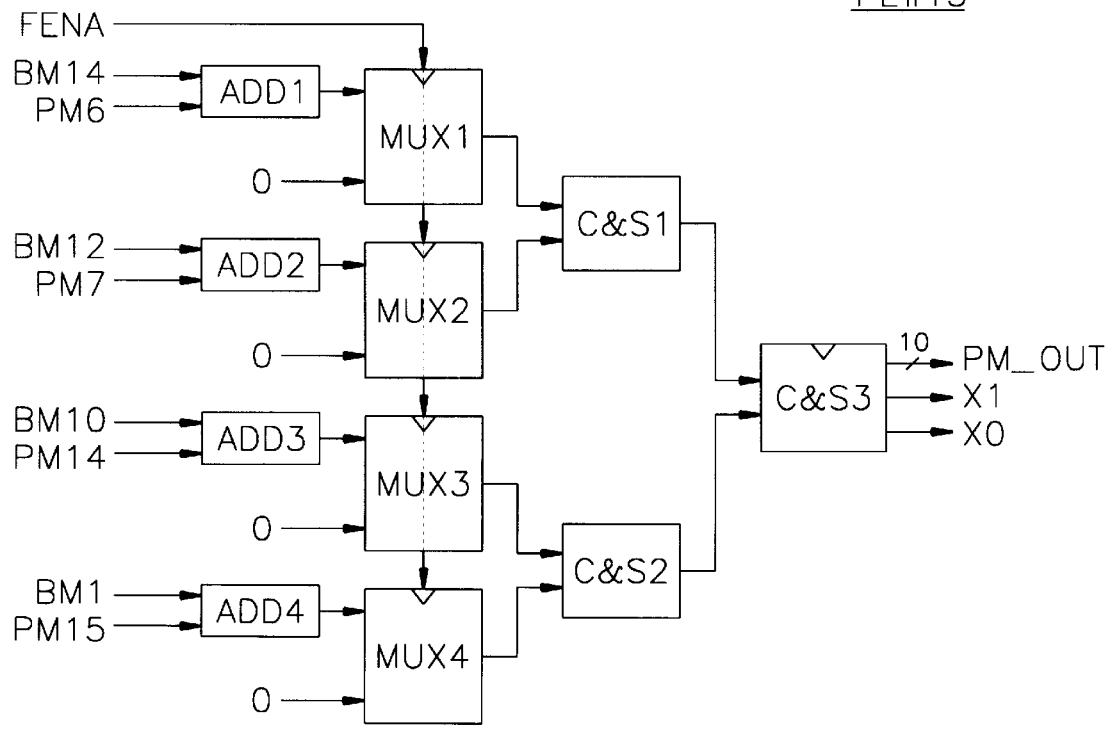
Figure 15O:
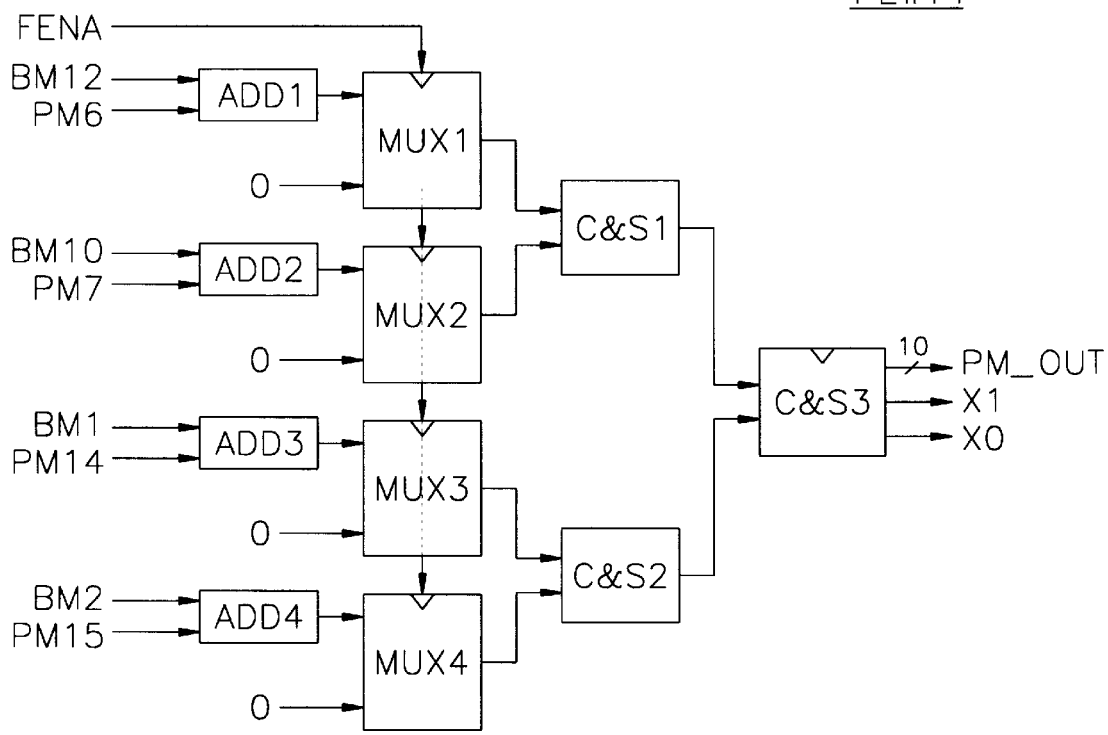
Figure 15P:
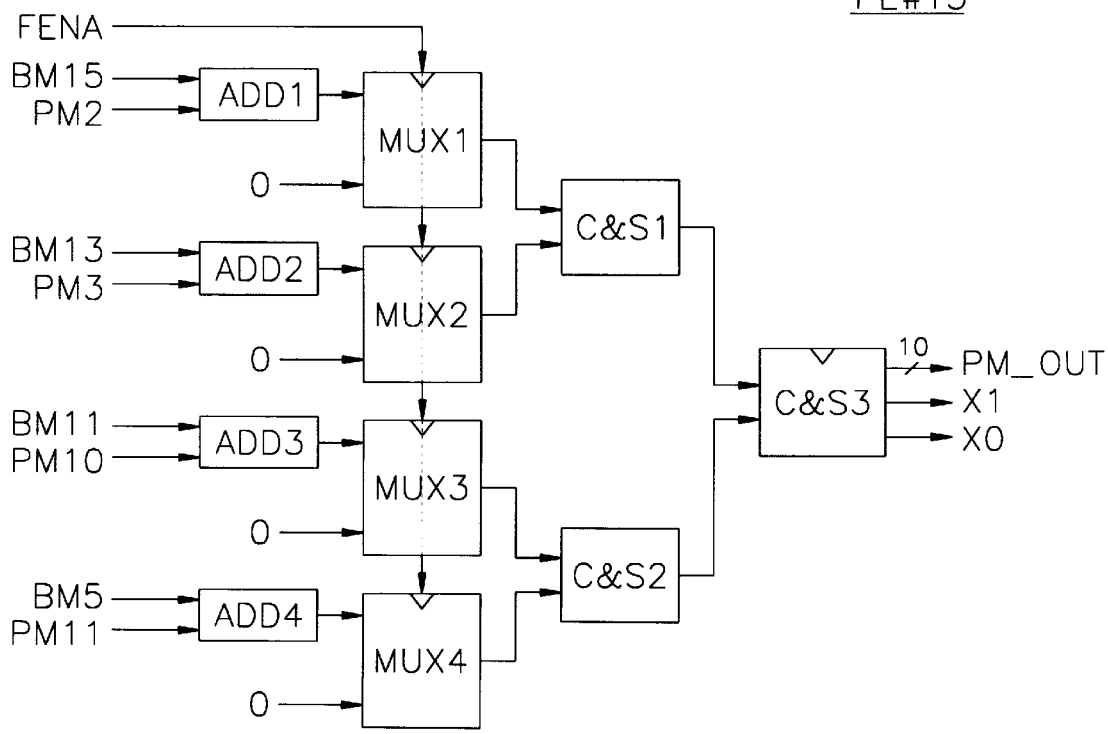

Referring to FIG. 15I, the 8th processing element PE#8 contains 4 adders ADD1 to ADD4, 4 multiplexors MUX1 to MUX4, and 3 compare-select modules C&S1 to C&S3. Each of the adders ADD1 to ADD4 adds the branch metric BMu to the path metric PMi so that total 4 candidate path metrics $ADD_{i,j}$'s are generated. Each of the multiplexors MUX1 to MUX4 selects either '0' in the 8 state mode or the candidate path metric $ADD_{i,j}$ fed from the each of the adders ADD1 to ADD4 based on the FENA. The compare-select modules C&S1 to C&S3 compare the 4 candidate path metrics $ADD_{i,j}$'s fed from the multiplexors MUX1 to MUX4 to select a candidate path metric $ADD_{i,j}$ with a minimum distance as the most likely path metric PM_OUT and provide both the PM_OUT and the determination vector $DV_i$=(X1,X0) therefor.

The 1st candidate path metric $ADD_{8,1}$ of the PE#8 is equal to a total value BM12+PM0 of the 12th branch metric BM12 and the 0th path metric PM0; the 2nd candidate path metric $ADD_{8,2}$ to a total value BM10+PM1 of the 10th branch metric BM10 and the 1st path metric PM1; the 3rd candidate path metric $ADD_{8,3}$ to a total value BM1+PM8 of the 1st branch metric BM3 and the 8th path metric PM8; and the 4th candidate path metric $ADD_{8,4}$ to a total value BM4+PM9 of the 4th branch metric BM4 and the 9th path metric PM9.

Through each of the multiplexors MUX1 to MUX4, '0' is provided based on the FENA '0' representing the 8 state mode or each of the candidate path metric $ADD_{i,j}$ is selected based on the FENA '1' representing the 16 state mode.

The 1st compare-select module C&S1 receives the 1st and the 2nd candidate path metrics $ADD_{8,1}$ and $ADD_{8,2}$ to compare with each other and provides a smaller candidate path metric to the 3rd compare-select module C&S3. The 2nd compare-select module C&S2 receives the 3rd and the 4th candidate path metrics $ADD_{8,3}$ and $ADD_{8,4}$ to compare with each other and provides a smaller candidate path metric to the 3rd compare-select module C&S3. The 3rd compare-select module C&S3 compares two candidate path metrics fed from the C&S1 and the C&S2, respectively; selects a smaller candidate path metric as the most likely path metric PM_OUT; and provides the PM_OUT and the determination vector $DV_8$ (X1, X0) thereof.

The determination vector $DV_i$ for the most likely path metric PM_OUT can be obtained as follows and provided to the SMU 5: the 1st candidate path metric $ADD_{8,1}$ selected as the PM_OUT in the C&S3 corresponds to the determination vector (1,0); the 2nd candidate path metric $ADD_{8,2}$ to the determination vector (1,1); the 3rd candidate path metric $ADD_{8,3}$ to the determination vector (0,0); and the 4th candidate path metric $ADD_{8,4}$ to the determination vector (0,1).

The PM_OUT fed from each of the processing elements PE#0 to PE#15 is adjusted by the overflow control module 110 and the output module 120 to provide the adjusted result to the PMN 4. In order to overcome the overflow, the MSB '1' of each PM_OUT must be refreshed so as to be replaced with '0'. A smallest numbers of memories may require the adjustment of the metric size. Total 10 bits, i.e., 7 bits for integer part and 3 bits for decimal part for each most likely path metric are preferable to be assigned. A simulation shows the difference between the longest path metric and the shortest path metric is either 36 in the 16 state mode or 23 in the 8 state mode. In order to overcome the difference under all circumstance, e.g., in case of all MSB's being '1', 7 bits of integer part and 3 bits of decimal part are needed.

Figure 16:
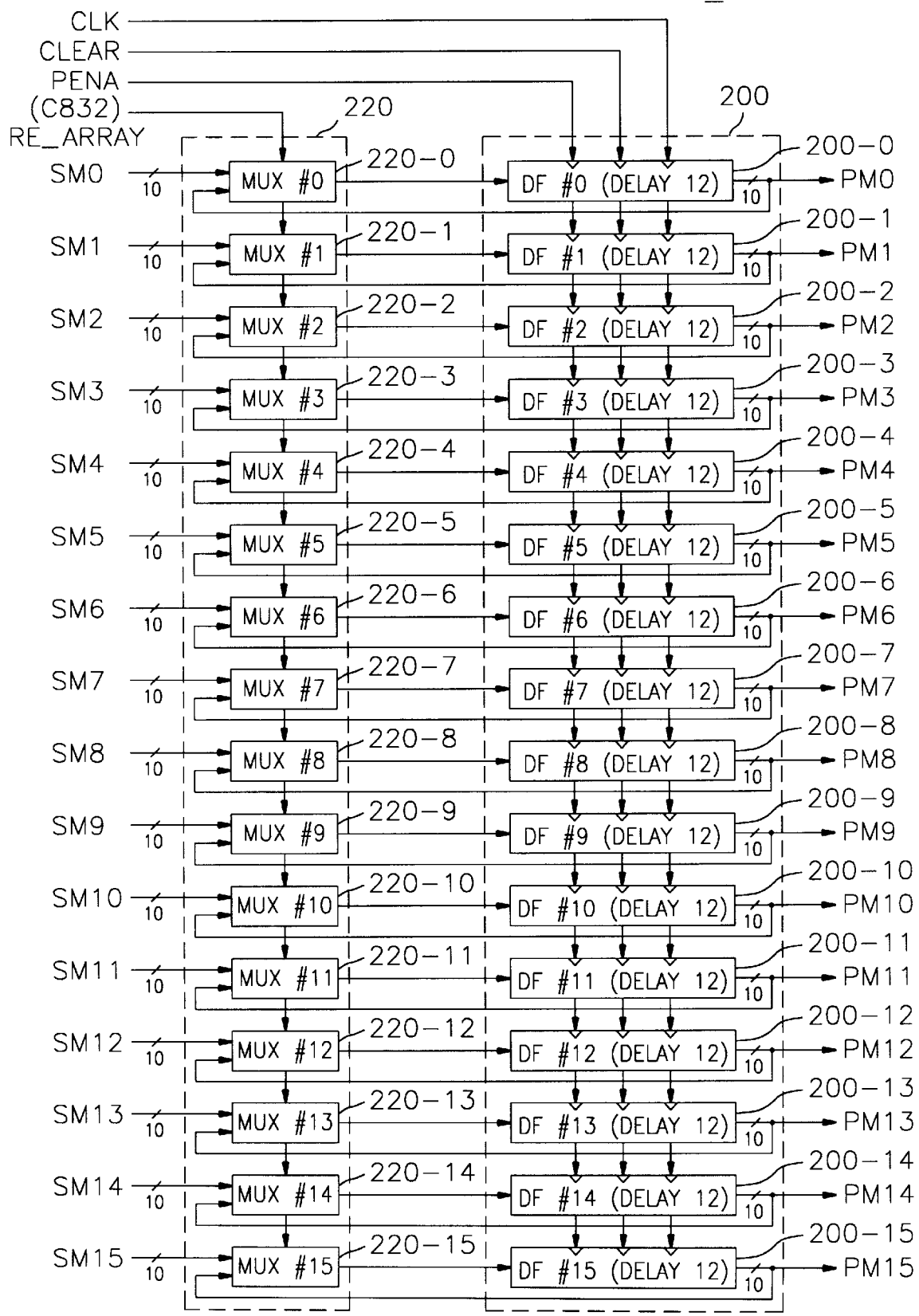
FIG. 16 illustrates a block diagram of a path metric network (PMN) shown in FIG. 7.

Referring to FIG. 16, there is illustrated a block diagram of the path metric network PMN 4 shown in FIG. 7, wherein the PMN 4 includes a delay memory module 200 and a selection module 220. The delay memory module 200 contains a 0th to a 15th delay registers 200-0 to 200-15 connected in parallel, wherein each delay register has 12 serial-input serial-output shift registers. The selection module 220 includes a 0th to a 15th multiplexors 200-0 to 200-15 connected in parallel, wherein each multiplexor selects either the survivor metric $SM_i$ or the previous path metric $PM_i$ fed from the delay memory module 200 based on a rearrangement control signal RE_ARRAY.

The PMN 4 delays for 12 clocks the survivor metric $SM_i$ for each state calculated by the ACS 3 shown in FIG. 14 and the delay result is again provided to the ACS 3. The delay for 12 clocks results from the receipt of data delayed by 12 symbols delay by the use of 12 symbol intra-segment interleaving process for a trellis encoding process. Therefore, the PMN 4 requires either 192(=16 state×12 delay) 10-bit registers for storing all the SMi's in the 16 state mode or 96(=8 state×12 delay) 10-bit registers in the 8 state mode. The PMN 4 is preferable to have 192 registers for the 16 state mode so that only 96 registers can be used in the 8 state mode.

The 1st to the 15th delay registers 200-0 to 200-15 store the survivor metric $SM_i$ of each state fed from the ACS 3 and provides 12 symbol delayed survivor metric to the ACS 3 after delaying by 12 symbol clocks. For 4 clock during which 4 symbols of segment synchronization signal are received, data stored in the delay registers of the delay memory module 200 must be rearranged without receiving a new survivor metric $SM_i$ from the ACS 3. The reason is that even though the segment synchronization signal is received, the interleaver carries out a switching operation so that a sequence of data received to the decoder may be changed. For example, the first segment starts with the data d1 fed from the first trellis encoder(E1) and includes d2, d3, d4, . . . and d12 in sequence as shown in Table 1, while the second segment starts with the data d5 fed from the 5th trellis encoder(E5) and includes d6, d7, d8, . . . and d4 in sequence. Therefore, the previous path metric fed from the PMN 4 is provided with a path metric for the data d5 after the receipt of the synchronization signal.

During 4 clocks while receiving the segment synchronization signal based on the RE_ARRAY being received, each of the 0th to the 15th multiplexors 220-0 to 220-15 of the selection module 220 returns data from the last end of each of the 0th to the 15th delay registers 200-0 to 200-15 to the first end thereof. During the remaining clocks, each of the 0th to the 15th multiplexors 220-0 to 220-15 provides the $SM_i$ fed from the ACS 3 to the first end of each of the 0th to the 15th delay registers 200-0 to 200-15.

The RE_ARRAY, which is generated by the use of the c832 signal for identifying the segment, maintains '1' only for 4 clocks during which the segment synchronization signal is received, while it maintains '2' for the remaining 828 clocks during which the valid data is received. That is, the 0th to the 15th delay registers 200-0 to 200-15 of the delay memory module 200 rearrange the data therein without exchanging supplementary data with the ACS 3 while receiving clocks of the segment synchronization signal.

Therefore, the valid previous path metric PM which corresponds to the current input data for each clock can be provided to the ACS 3. Further, the 8 state mode can also be embodied with the complexity of the 16 state mode.

Figure 17:
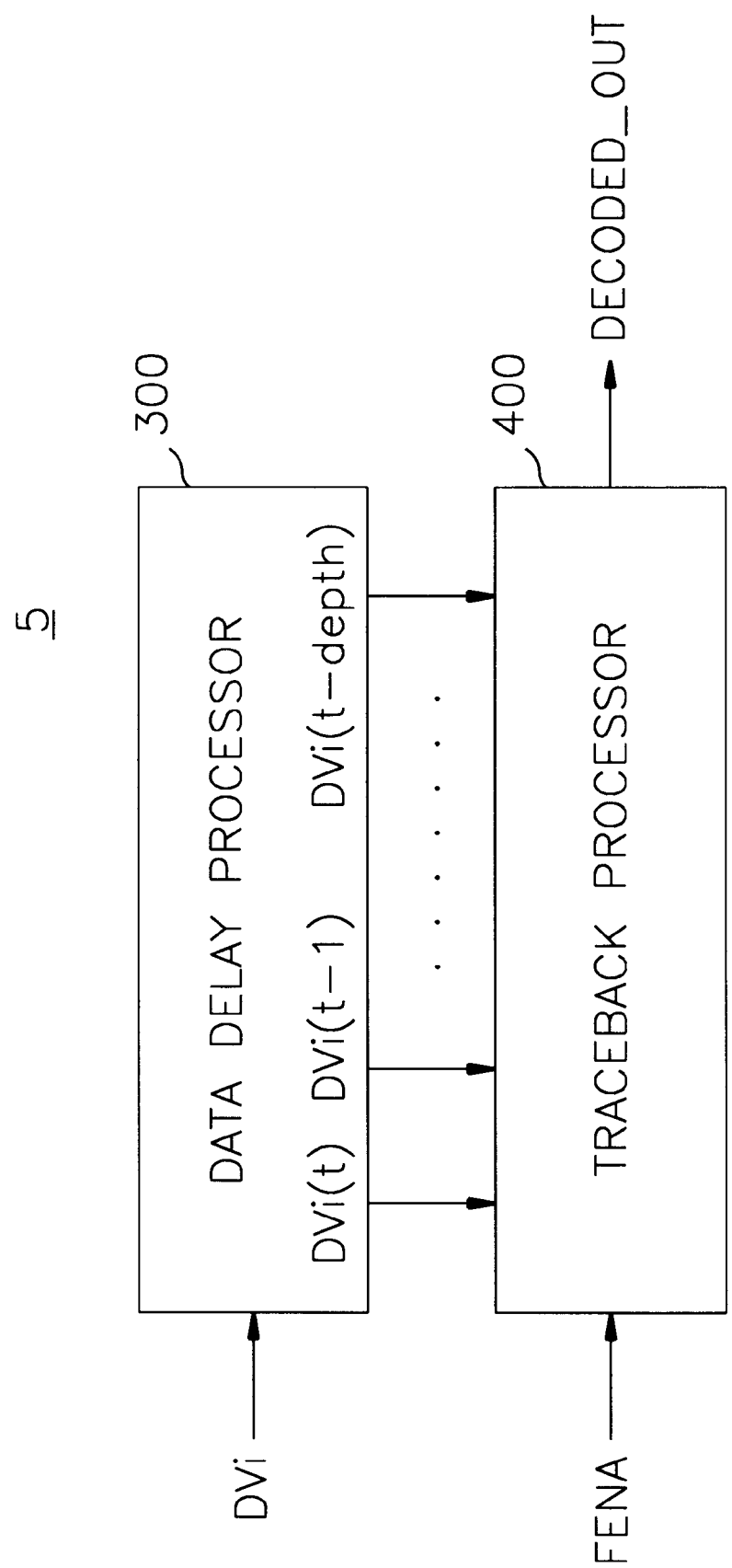
FIG. 17 describes a block diagram of a survivor memory unit (SMU) shown in FIG. 7.

Referring to FIG. 17, there is illustrated a block diagram of the survivor memory unit SMU 5, which includes a data delay processor 300 and a traceback processor 400 for receiving the determination vector DVi of the survivor path from the ACS 3 and carrying out a traceback algorithm to calculate the decoded symbol DECODED_OUT. The data delay processor 300 receives the determination vector DVi of the survivor path for each state from the ACS 3 to store therein and, after a delay for predetermined clocks, provides the determination vectors DVi's with the same index among the saved determination vectors at the same time, wherein an index i is equal to an index of intra-segment interleaved data di. The traceback processor 400 carries out both an optical response traceback, i.e., a maximum likelihood response traceback algorithm for the 8 state mode and a partial response traceback algorithm for the 16 state mode by the use of the determination vectors DVi's fed from the data delay processor 300 so as to obtain maximum likelihood response decoded symbol and partial response decoded symbol and provides either maximum likelihood response decoded symbol or partial response decoded symbol based on the FENA.

The number of determination vectors for survivor paths in the SMU 5 must maintain at least the number of states multiplied by a decoding depth number.

GA 16 VSB mode: The number of registers for storing 2 bit determination vector DV(=(X1,S'0)) for each state in the 16 state mode through a partial response channel depends directly on the decoding depth for each state. Also, since 12 symbol intra-segment interleaving is carried out for encoding of the input data, all the transmitted data must be delayed by just as long as 12 symbols to be decoded in the unit of 12 symbols. Accordingly, the total number of registers for delaying the transmitted data in case of a decoding depth 15 in the 16 state mode amounts to at least 5760 bits (=16 state number×2 bits for each determination vector×15 decoding depth×12 delay number).

GA 8 VSB mode: The number of registers for storing 2 bit determination vector DV(=(X1,X0)) for each state in the 8 state mode through a Gaussian channel depends directly on the decoding depth for each state. Also, since 12 symbol intra-segment interleaving is carried out for encoding of the input data, all the transmitted data must be delayed by just as much as 12 symbols to be decoded in the unit of 12 symbols. Accordingly, the total number of registers for delaying the transmitted data in case of a decoding depth 10 in the 8 state mode amounts to at least 1920 bits (=8 state number×2 bits for each determination vector×10 decoding depth×12 delay number).

However, the last 12 symbol delay register for a last decoding depth is preferable to store bits required for only one symbol according to the characteristics of the traceback algorithm. Also, S'0 of the last determination vector in the traceback algorithm for the 16 state mode meed not be stored, because X0 in the final decoded symbol (X1,X0) calculated by tracing back as far as 'the decoding depth' corresponds to S'0 in the previous state (S'3,S'2,S'1,S'0) obtained by tracing back as far as 'the decoding depth-1'. Accordingly, the total number of registers in the 16 state mode amounts to at least the sum of 2704 bits (=16 state mode×14 'decoding depth-1'×12 delay number+16 state mode) for storing a higher bit X1 of each determination vector and 2512 bits (=16 state mode×13 'decoding depth-2'×12 delay number+16 state mode) for storing a lower bit S'0 of each determination vector. So the total volume of registers required is equal to 5216 bits. In the 8 state mode, 1744 bits of registers (=8 state mode×2 bits for determination vector×9 'decoding depth-1'×12 delay number+8 state mode×2 bits for determination vector) are required.

Accordingly, a practical hardware in accordance with the present invention has 5216 registers enough for decoding in the 16 state mode, among which only 1744 registers are used for decoding in the 8 state mode.

Figure 18:
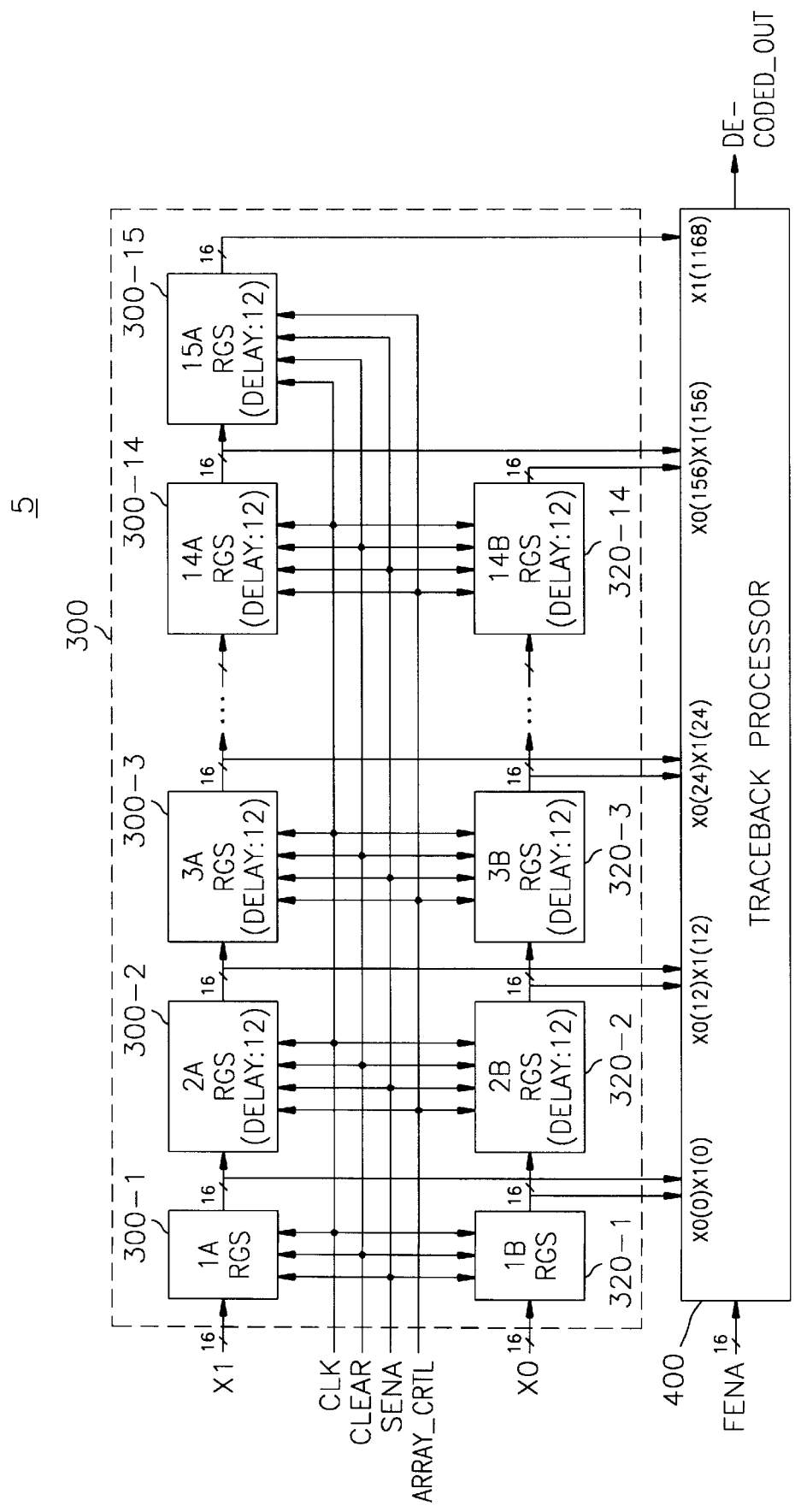
FIG. 18 portrays a data delay processor shown in FIG. 17.

Referring to FIG. 18, there is illustrated a detailed circuit for the data delay processor 300 shown in FIG. 17, wherein the data delay processor 300 contains an X1 register group having 15 registers 300-1 to 300-15, each of which stores a higher bit X1 of each determination vector DV(=(X1,X0)) fed from the ACS 3 sequentially, and an X0 register group having 14 registers 320-1 to 320-14, each of which stores a lower bit X0 thereof sequentially. The X1 register group has 15 registers, a 1A register 1A RGS 300-1 to a 15A register 15A RGS 300-15, connected in series, wherein the 1A RGS 300-1 is for delaying the higher bit X1 for one clock; a 2A register 2A RGS 300-2 is for delaying the one clock delayed higher bit X1(0) for 12 clocks; a 3A register 3A RGS 300-3 is for delaying the 13 clock delayed higher bit X1(12) for 12 clocks; and so on. The X0 register group has 14 registers, a 1B register 1B RGS 320-1 to a 14B register 14B RGS 320-14, connected in series, wherein the 1B RGS 320-1 is for delaying the lower bit X0 for one clock; a 2B register 2B RGS 320-2 is for delaying the one clock delayed lower bit X0(0) for 12 clocks; a 3A register 3B RGS 320-3 is for delaying the 13 clock delayed higher bit X0(12) for 12 clocks; and so on. The higher or the lower bit from each register is provided to both a next register connected in series and the traceback processor 400 at the same time.

All the determination vectors provided in parallel from all the registers to the traceback processor 400 must be classified into determination vectors $DV_k$'s for each of 12 trellis encoders E1 to E12. All the 12 symbol delay registers 300-2 to 300-15 and 320-2 to 320-14, therefore, must remove the influence of the segment synchronization signal, because the intra-segment interleaver goes on switching for 4 clocks, i.e., during which the segment synchronization signal is received, while the TCM decoder turns to be disabled for the 4 clocks. The data stream, therefore, fed from the trellis decoder just after the receipt of the segment synchronization signal varies with a period of 3 segments. Accordingly, if the determination vectors from all the 12 symbol delay registers of the SMU 5 are provided in parallel after delaying by 12 symbols in the input sequence, it is impossible to obtain the determination vectors for data fed from the same encoder. Each 12 symbol delay register need be adjusted in order to catch a determination vector for data encoded in the same trellis encoder at every 12th clock.

Figure 19:
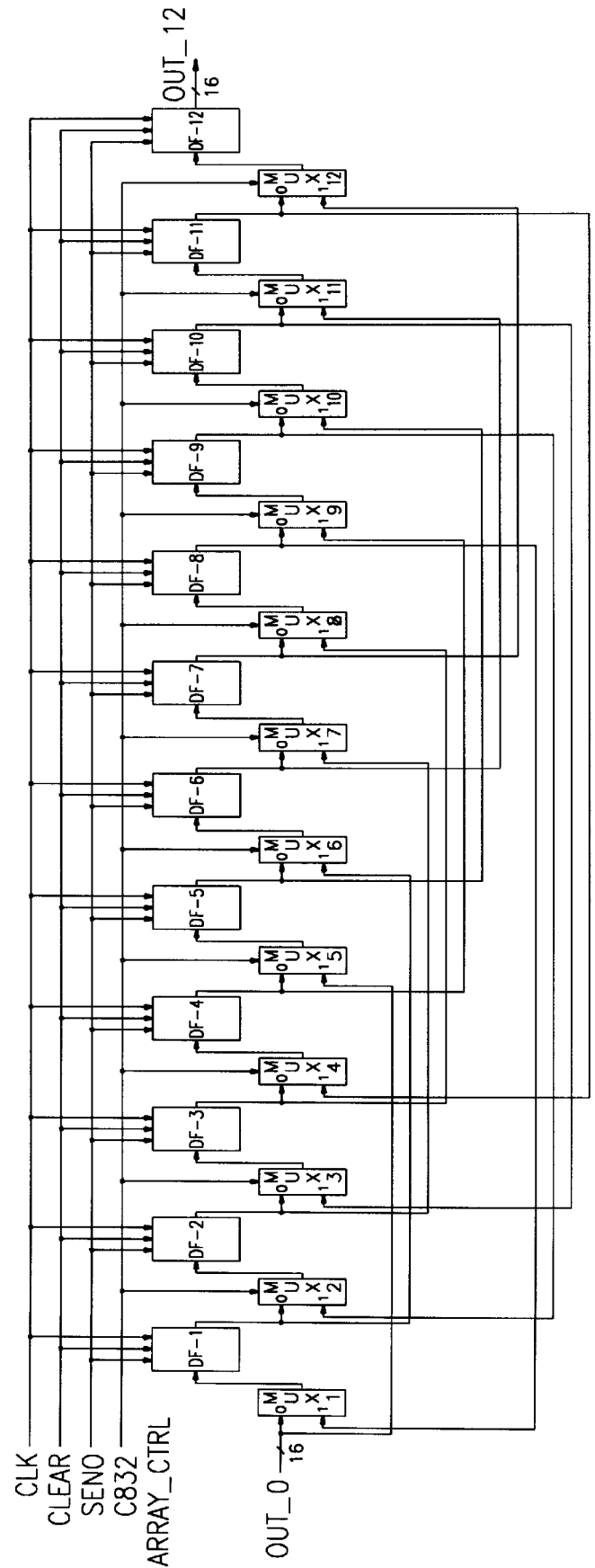
FIG. 19 delineates a detailed circuit of a 12-symbol delay register module shown in FIG. 18.

Referring to FIG. 19, there is illustrated a detailed circuit for each of delay registers 300-2 to 300-15 and 320-2 to 320-14, each of which contains 12 registers(DF_1 to DF_12) and 12 multiplexors(MUX1 to MUX12) for selecting either input or output of the 12 registers. The 12 registers(DF_1 to DF_12) turns to be enabled based on the SENA and synchronizes to the CLK to be operated; and the 12 multiplexors(MUX1 to MUX12) select data to be stored in the 12 registers(DF_1 to DF_12) based on a array control signal ARRAY_CTRL. The ARRAY_CTRL is generated by the use of the c832 counting signal generated by counting the number of symbols in order to identify a segment. That is, in order to remove the influence of the segment synchronization signal, during 1 clock from the receipt of all 4 symbols of segment synchronization signal, each determination vector $DV_k$ of data encoded in the same trellis encoder is rearranged so as to correspond to a content of each register aparted every 12th clock, wherein k represents an index for identifying the trellis encoder. The input and the output ends of the 12 registers are connected as follows:

$$(i) \text{IN}(k+1) \leftarrow \text{OUT}(k) \text{(normal)}$$

$$(ii) \text{IN}(k+1) \leftarrow \text{OUT}((k+(12-4))\%12) \text{(sync rejection)} \quad \text{Eq. 5}$$

wherein IN(k+1) is the input end of the (k+1)st register among the 12 registers and OUT(k) is the output end of the kth register. (i) the output end of each register is connected to the input end of the next register in normal operation so that each data is shifted one by one to the right in the input sequence and (ii) all data stored in the registers are rearranged only during 1 clock from the receipt of all 4 symbols of segment synchronization signal in order to reject the influence of the segment synchronization signal.

As shown in FIG. 19, based on the ARRAY_CTRL (i) the input ends and the output ends of the 12 registers(DF_1 to DF_12) for the normal operation are connected as follows: IN(1)←OUT(0), IN(2)←OUT(1), IN(3)←OUT(2), IN(4)←OUT(3), IN(5)←OUT(4), IN(6)←OUT(5), IN(7)←OUT(6), IN(8)←OUT(7), IN(9)←OUT(10), IN(10)←OUT(9), IN(11)←OUT(10) and IN(12)←OUT(11); and (ii) the input ends and the output ends of the 12 registers(DF_1 to DF_12) for rejecting the segment synchronization signal are connected as follows: IN(1)←OUT(8), IN(2)←OUT(9), IN(3)←OUT(10), IN(4)←OUT(11), IN(5)←OUT(0), IN(6)←OUT(1), IN(7)←OUT(2), IN(8)←OUT(3), IN(9)←OUT(4), IN(10)←OUT(5), IN(11)←OUT(6) and IN(12)←OUT(7).

Figure 20:
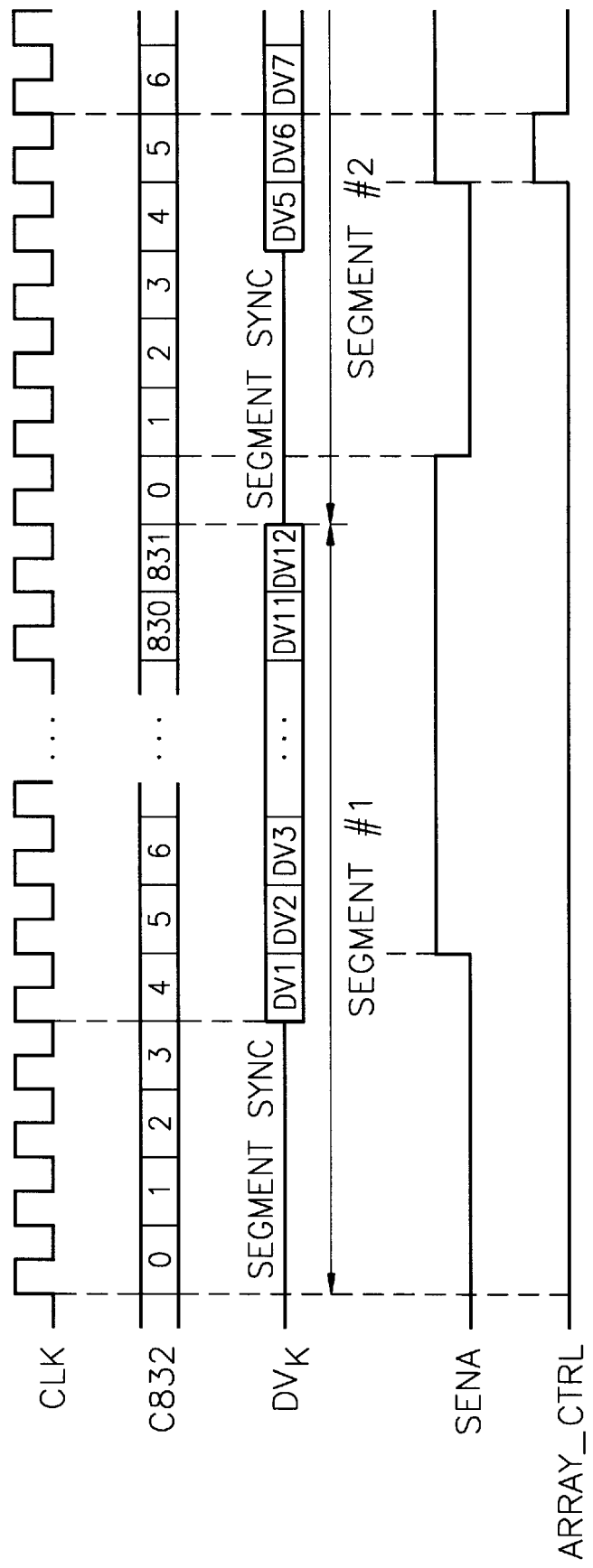
FIG. 20 pictures a timing diagram of several control signals for illustrating an operation of the delay register shown in FIG. 18.
Figure 21:
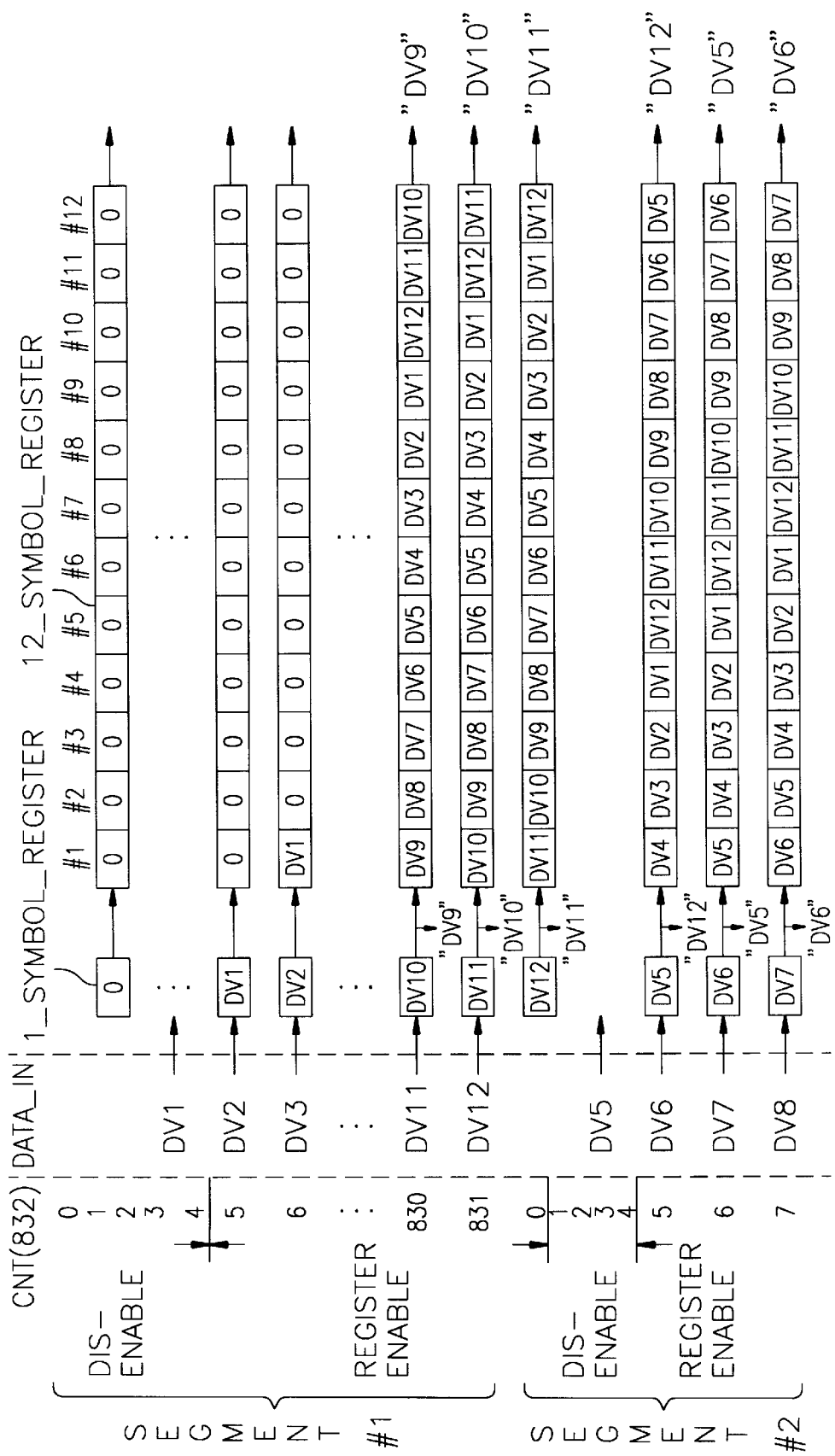
FIG. 21 shows a state diagram of input signals, saved data and output signals of each 12-symbol delay register for illustrating an operation of the 12-symbol delay register shown in FIG. 19.

FIG. 20 presents a timing diagram of several control signals for delaying data and FIG. 21 presents a state diagram for representing the input and the output of the 12 symbol delay register.

As shown in FIG. 20, the c832 counting signal of the 832 counter 75 in the control unit 7 counts 832 symbols for each segment. $DV_k$ is a stream of determination vectors fed from the ACS 3. The first 4 clocks CNT(0) to CNT (3) of each segment are for receiving the segment synchronization signal and the remaining 828 clocks CNT(4) to CNT(831) are for receiving the determination vectors $DV_k$'s of each segment. The SENA, which is an enable signal of the SMU 5, maintains 'high' from the clock CNT(5) for receiving the second determination vector of each segment to the clock CNT(0) for receiving the first synchronization signal of the next segment and turns to 'low' during the remaining 4 clocks CNT(1) to CNT(4). The array control signal ARRAY_CTRL maintains '0' until the receipt of both the first segment #1 (not the synchronization signal but the first segment with valid data) of each field and the first determination vector of the next segment and turns to '1' during one clock CNT(5) for receiving the second determination vector of each segment.

Referring to FIG. 21, there is illustrated a state diagram in which the register receives, stores and transmits the determination vector stream $DV_k$ based on the timing diagram shown in FIG. 20, wherein 1 symbol register corresponds to the 1A or 1B register 300-1 or 320-1 of the data delay processor 300 shown in FIG. 18 and 12 symbol register corresponds to the 2A or 2B register 300-2 or 320-2.

(1) period for receiving the segment #1: The SENA maintains 'low' until the 4th clock CNT(4) for receiving the first determination vector DV1 among the determination vectors for valid data of the segment #1 so that the register may be in a disable state. During the 5th clock CNT(5) for receiving the 2nd determination vector DV2, the SENA turns to 'high' and maintains 'high' until the 0th clock CNT(0) for receiving the first segment synchronization signal SYNC1 of the segment #2 so that the register may be in an enable state.

The determination vector stream $DV_k$ of the segment #1 is shifted to the right in the input sequence based on the SENA and the ARRAY_CTRL for the normal operation ((IN(k+1)←OUT(k)) as shown in Eq. 5 so as to be stored in the registers. For example, the last determination vector DV12 of the segment #1 fed during the 831th clock CNT (832) is synchronized with the 0th clock CNT(0) so as to be stored in the 1 symbol register and, therefore, the 12 symbol register stores DV11, DV10, DV9, DV8, DV7, DV6, DV5, DV4, DV3, DV2, DV1 and DV12 in sequence. The 11th determination vectors DV11's are only transmitted from 1 symbol register and 12 symbol register, respectively.

(2) period for receiving the segment #2: The SENA turns to 'low' at the 1st clock CNT(1) for receiving the 2nd segment synchronization signal SYNC2 of the segment #2 and maintains 'low' until the 4th clock CNT(4) for receiving the first determination vector DV1 among the determination vectors for valid data of the segment #2 so that the register may be in a disable state to maintain a previous content. During the 5th clock CNT(5) for receiving the 2nd determination vector DV6, the SENA turns to 'high' and maintains 'high' until the 0th clock CNT(0) for receiving the first segment synchronization signal SYNC1 of the segment #3 so that the register may be in an enable state.

The ARRAY_CTRL with '0' normally turns to '1' at the 5th clock CNT(5) for receiving the 2nd determination vector DV6 of the segment #2 so that the input and the output sequences may be varied.

Based on the SENA and the ARRAY_CTRL, the registers maintain a disable state until the 4th clock CNT(4) for receiving the 1st determination vector DV5 and returns to an enable state at the 5th clock CNT(5) for receiving the 2nd determination vector DV6.

Accordingly, the 1st determination vector DV5 synchronized at the 5th clock CNT(5) is stored in the 1 symbol register. In the meantime, the contents of the 12 symbol register are rearranged based on the ARRAY_CTRL. The input and the output sequences of the 12 symbol register follow the rule (ii) (IN(k+1)←OUT((k+(12-4))%12)) for the segment synchronization rejection in Eq. 5. In the result, the 12 symbol register at the 5th clock CNT(5) stores DV4, DV3, DV2, DV1, DV12, DV11, DV10, DV9, DV8, DV7, DV6 and DV5 in sequence, wherein the 12th determination vectors DV12's are only transmitted from 1 symbol register and 12 symbol register, respectively.

At the 6th clock CNT(6), the 2nd determination vector DV6 synchronized with the 6th clock CNT(6) is stored in the 1 symbol register and the 12 symbol register is shifted to the right according to the rule (ii) of the Eq. 5 so as to store DV5, DV4, DV3, DV2, DV1, DV12, DV11, DV10, DV9, DV8, DV7 and DV6 in sequence, wherein only the 5th determination vectors DV5's are transmitted from 1 symbol register and 12 symbol register in parallel.

As illustrated above, the data delay processor receives the segment synchronization signals of each segment at first and, then, sets the determination vectors related to each other at every 12th clock by rearranging the input and the output sequences of the 12 symbol register during the next one clock. Accordingly, the determination vectors $DV_k$'s with the same index k in the final output ends of all the registers at each clock will be provided in parallel to the traceback processor 400.

Figure 22:
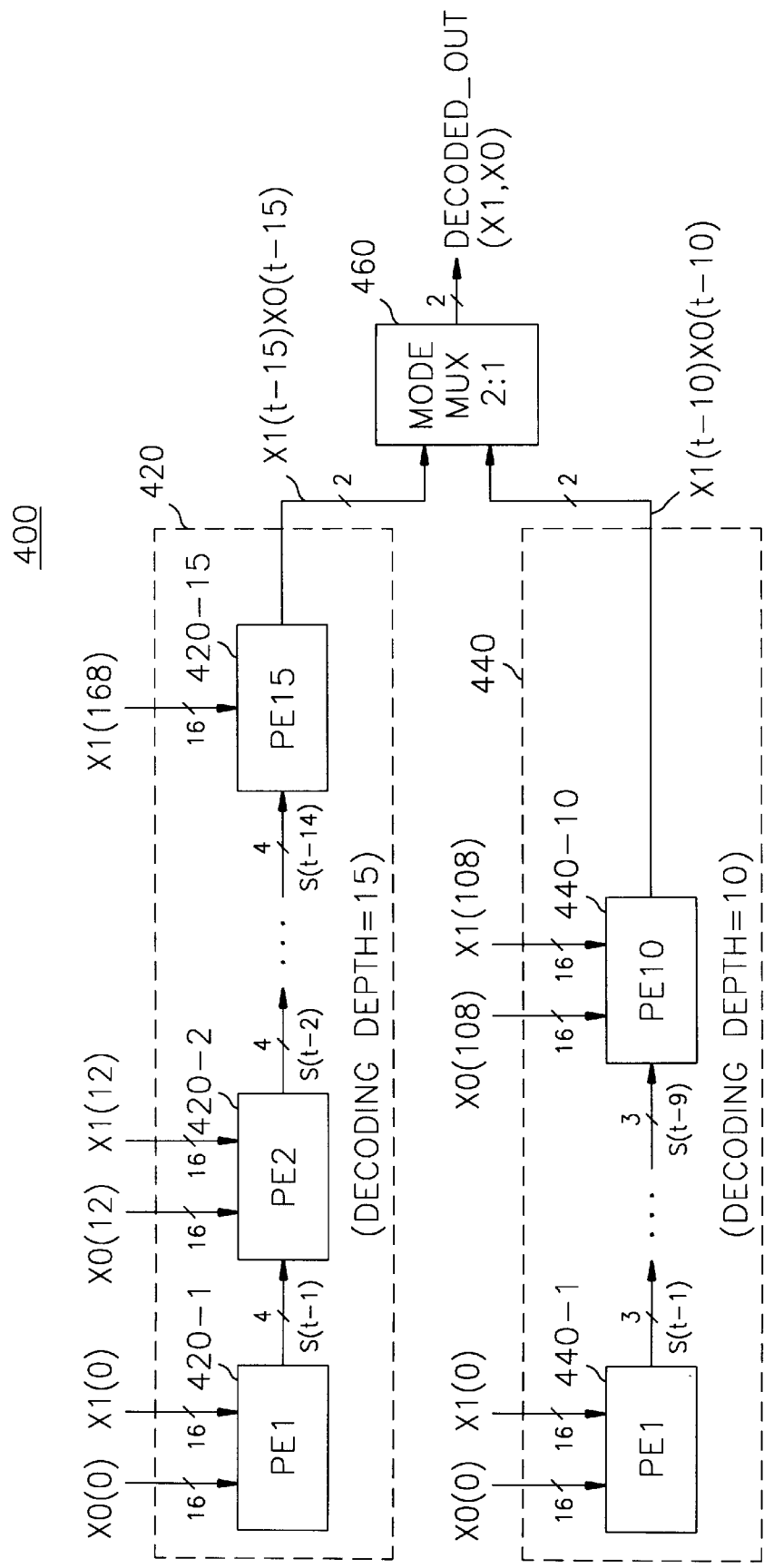
FIG. 22 presents a traceback processor shown in FIG. 18.

Referring to FIG. 22, there is illustrated a block diagram of the traceback processor 400 shown in FIG. 18, which contains a first and a second operation modules 420 and 440 and a mode multiplexor MODE MUX 460. The first operation module 420 has a plurality of processing elements 420-1 to 420-15 for calculating the partial response decoded symbol by tracing back a determination vector of the 16 state mode for the partial response channel as far as the decoding depth thereof. The second operation module 440 has a multiplicity of processing elements 440-1 to 440-10 for calculating the maximum likelihood decoded symbol by tracing back a determination vector of the 8 state mode for the maximum likelihood response channel as far as the decoding depth thereof. The MODE MUX provides either the partial response decoded symbol fed from the 1st operation module 420 or the maximum likelihood decoded symbol fed from the 2nd operation module 440 based on the FENA.

The 1st operation module 420 with a decoding depth 15 for the 16 state mode has 15 processing elements 420-1 to 420-15 in serial. Each of the processing elements 420-1 to 420-15 receives a determination vector (X1(12n), X0(12n)) and a lower bits X0(12×14) fed in parallel from each pair of the X1 and X0 registers 300-1 to 300-15 and 320-1 to 320-14 of the data delay processor 300 and calculates a previous state S(t−(n+1)) to be provided to the next processing element, wherein n is an integer between 0 and 13. The last processing element 420-15 calculates the partial response decoded symbol X1(t−15) X0(t−15) by the use of the previous state and the determination vector.

According to the traceback algorithm in the 16 state mode, the previous state (S'3, S'2, S'1, S'0) may be determined by a logical operation of the current state (S3, S2, S1, S0) and the determination vector (X1, S'0) as follows:

$$S'3, S'2, S'1, S'0) = (S3 \oplus X1, S1 \oplus S0, S2, S'0) \quad \text{Eq. 6}$$

The 2nd operation module 440 with a decoding depth 10 for the 8 state mode has 10 processing elements 440-1 to 440-10 in serial. Each of the processing elements 440-1 to 440-10 receives a determination vector (X1(12n), X0(12n)) fed in parallel from each pair of the X1 and X0 registers 300-1 to 300-10 and 320-1 to 320-10 of the data delay processor 300 and calculates a previous state S(t−(n+1)) to be provided to the next processing element, wherein n is an integer between 0 and 9. The last, i.e., the 10th processing element 440-10 calculates the maximum likelihood response decoded symbol X1(t−10)X0(t−10) by the use of the previous state and the determination vector.

According to the traceback algorithm in the 8 state mode, the previous state (S'2, S'1, S'0) may be determined by a logical operation of the current state (S2, S1, S0) and the determination vector (X1, X0) as follows:

$$(S'2, S'1, S'0) = (S2 \oplus X1, X0 \oplus S0, S1) \quad \text{Eq. 7}$$

Referring to FIGS. 23 and 24, there are illustrated detailed blocks of processing elements for tracing back the determination vector in the 16 state mode according to Eqs. 6 and 7. FIGS. 23 and 24 show detailed circuits for the processing elements of the first and the second operation modules 420 and 440 shown in FIG. 22, respectively.

Figure 23A:
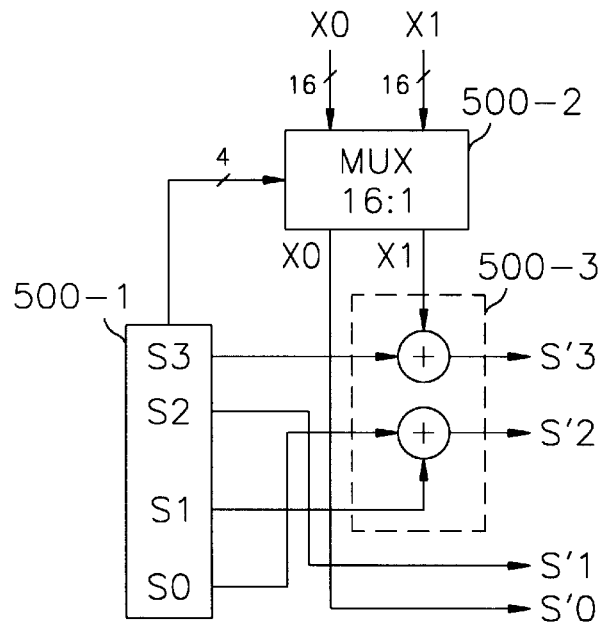
FIGS. 23A and 23B provide detailed circuits of the processing elements in the first operation module shown in FIG. 21.
Figure 23B:
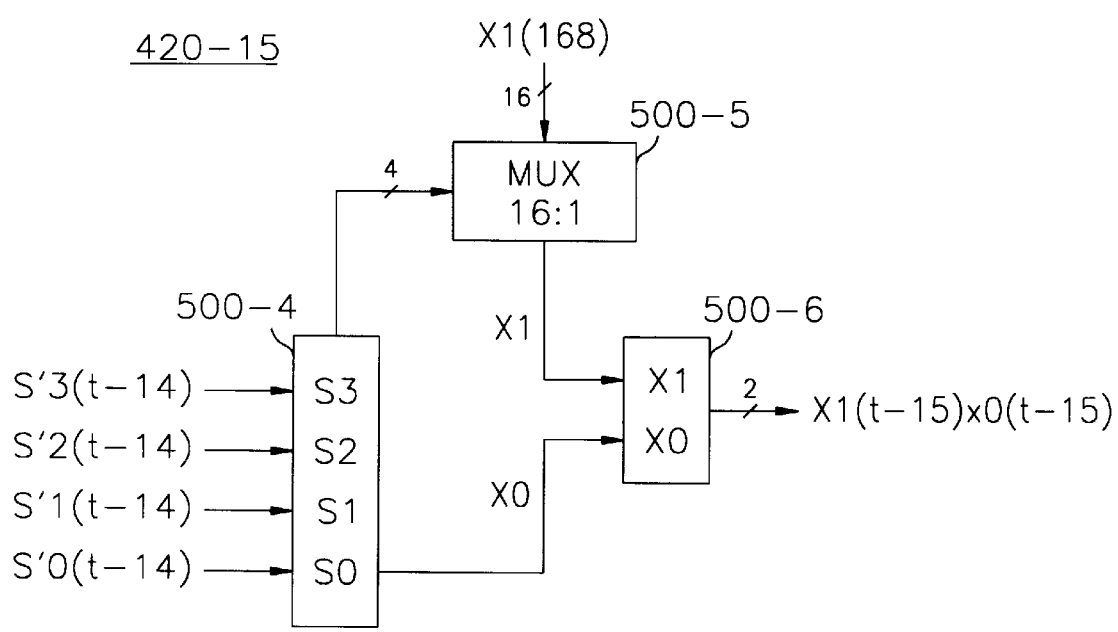

FIG. 23A shows each of a 1st to a 14th processing elements 420-1 to 420-14 of the 1st operation module and FIG. 23B shows a 15th processing element 420-15. As shown in FIG. 23A, the processing element PE has a 4-bit memory 500-1 for storing the current state(S3, S2, S1, S0); 16 input multiplexor 500-2 for selecting one of 16 determination vectors (X1, X0(=S'0))'s fed from the data delay processor 300 based on the current state(S3, S2, S1, S0) from the 4-bit memory 500-1; and a previous state calculator 500-3 for calculating a previous state (S'3, S'2, S'1, S'0)= (S3⊕X1, S1⊕S0, S2, S'0) according to the Eq. 6 based on the current state(S3, S2, S1, S0) from the 4-bit memory and the determination vector (X1, S'0) selected at the 16 input multiplexor 500-2.

The 1st to the 14th processing elements 420-1 to 420-14 have the same elements as shown in FIG. 23A, respectively. Since all states converge on a state by tracing back themselves as far as the decoding depth according to a traceback algorithm, it does not matter from which state the traceback is started. A starting state for the traceback, i.e., the 4-bit memory 500-1 of the 1st processing element 420-1 is preferable to be assigned as "0000".

The 1st processing element 420-1 selects one determination vector, which corresponds to the starting state "0000", among 16×2 bits of 16 determination vectors (X1 (0) S'0 (0))'s fed from the 1A and the 1B registers 300-1 and 320-1; and calculates a previous state (S'3(t−1), S'2(t−1), S'1(t−1), S'0(t−1)) to be provided to the 2nd processing element 420-2 according to Eq. 6. The 2nd processing element 420-2 stores the previous state from the 1st processing element 420-1 in the 4-bit memory; selects one determination vector, which corresponds to the previous state stored in the 4-bit memory, among 16×2 bits of 16 determination vectors (X1(12), S'0(12))'s fed from the 2A and the 2B registers 300-2 and 320-2; and calculates a previous state(S'3(t−2), S'2(t−2), S1(t−2), S'0(t−2)) to be provided to the 3rd processing element 420-3 according to Eq. 6.

As described above, each processing element selects a determination vector which corresponds to the current state; obtains a previous state based on the determination vector; and provides the previous state to the next processing element, wherein the next processing element repeats the above traceback procedure, regarding the previous state as a current state thereof. A plurality of processing elements connected in series repeat the above traceback procedure as far as the decoding depth until the last processing element generates the decoded symbol (X1,X0).

Referring to FIG. 23B, there is illustrated a detailed block diagram of the last, i.e., the 15th processing element 420-15, which has a 4-bit memory 500-4 for storing a current state(S3, S2, S1, S0); 16 input multiplexor 500-5 for selecting one determination bit X1 of 16-bit determination vector X1(168) fed from the data delay processor 300 based on the current state from the 4-bit memory 500-4; and a 2-bit memory 500-6 for storing a lowest bit S0 of the current state and the selected determination bit X1 fed from the multiplexor 500-5.

The 15th processing element 420-15 stores the previous state (S'3(t−14), S'2(t−14), S'1(t−14), S'0(t−14)) fed from the 14th processing element 420-14 as a current state in the 4-bit memory 500-4; and selects one-bit determination vector, which corresponds to the current state stored in the 4-bit memory 500-4, among 16-bit of determination vector X1(168) fed from the 15A register 300-15, wherein the selected one bit X1 and a lowest bit S0(=X0) of the current state from the 4-bit memory 500-4 just correspond to the last decoded symbol (X1(t−15), X0(t−15)).

There will be illustrated detailed diagrams of processing elements of the 2nd operation module 440 for tracing back the determination vector in the 8 state mode.

Figure 24A:
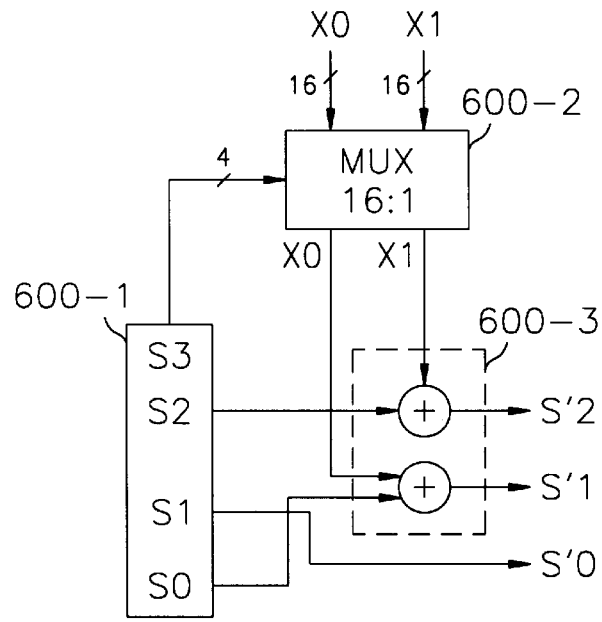
FIGS. 24A and 24B depict detailed circuit of the processing elements in the second operation module shown in FIG. 21.
Figure 24B:
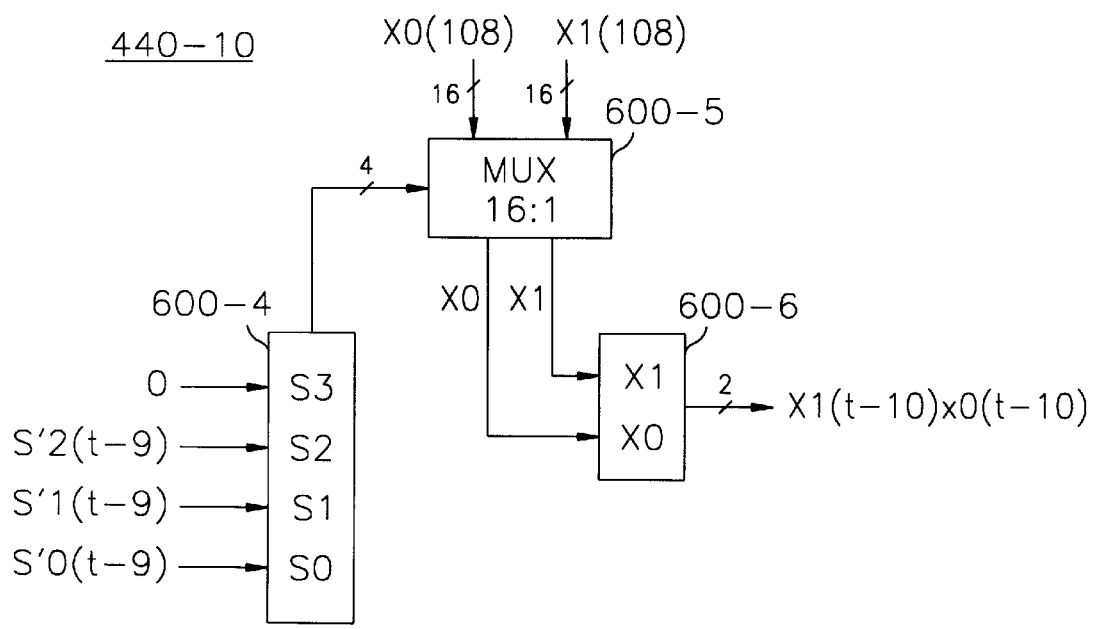

FIG. 24A shows each of a 1st to a 9th processing elements 440-1 to 440-9 of the 2nd operation module 440 and FIG. 24B shows a 10th processing element 440-10. As shown in FIG. 24A, each processing element has a 4-bit memory 600-1, 16 input multiplexor 600-2 and a previous state calculator 600-3, whose components and operation are similar to those of the processing element of the 1st operation module shown FIG. 23A, respectively. Since each state in the 8 state mode can be defined by 3 bits, a highest bit S3 of the 4-bit memory for storing the current state is always fixed with '0' and the previous state calculator 600-3 calculates a previous state(S'2, S'1, S'0)=(S2⊕X1, X0⊕S0, S1) according to Eq. 7 based on the current state(S3, S2, S1, S0) from the 4-bit memory and provides the previous state to a next processing element.

The 1st to the 9th processing elements 440-1 to 440-9 have the same elements as shown in FIG. 24A, respectively. Since all states converge on a state by tracing back themselves as far as the decoding depth according to a traceback algorithm, it does not matter from which state the traceback is started. A starting state for the traceback, i.e., the 4-bit memory 600-1 of the 1st processing element 440-1 is preferable to be assigned as "000".

The 1st processing element 440-1 selects a 2-bit determination vector, which corresponds to the starting state "000", among 16×2 bits of 16 determination vectors (X1(0), X0(0))'s fed from the 1A and the 1B registers 300-1 and 320-1; and calculates a previous state (S'2, S'1, S'0) to be provided to a 2nd processing element 440-2 according to Eq. 7.

The 2nd processing element 440-2 stores the previous state from the 1st processing element 440-1 in the 4-bit memory; selects one determination vector, which corresponds to the previous state stored in the 4-bit memory, among 16×2 bits of 16 determination vectors (X1(12), X0(12))'s fed from the 2A and the 2B registers 300-2 and 320-2; and calculates a previous state(S'2(t−2), S'1(t−2), S'0(t−2)) to be provided to a 3rd processing element 440-3 according to Eq. 7. As described above, each processing element selects a determination vector which corresponds to the current state; obtains a previous state based on the determination vector; and provides the previous state to the next processing element, wherein the next processing element repeats the above traceback procedure, regarding the previous state as a current state thereof.

The 10th processing element 440-10 as shown in FIG. 24B stores the previous state (S'2(t−9), S'1(t−9), S'0(t−9)) fed from the 9th processing element 440-9 as a current state in the 4-bit memory 600-4; and selects on e determination vector (X1, X0), which corresponds to the current state stored in the 4-bit memory 600-4, among 8×2 bits of 8 determination vectors (X1(108), X0(108)) fed from the 10A and 10B registers 300-10 and 320-10, wherein the selected determination vector just corresponds to the maximum likelihood response decoded symbol (X1(t−10), X0(t−10)).

Accordingly, the SMU 5 does not carry out only one step traceback at each clock, but carries out all tracebacks just during one lock after accumulating trellis encoded data as far as a decoding depth, so that an amount of calculation at each clock can be increased while the area required for memories, control logic and connections can be reduced.

Therefore, 14 previous states and 14 determination vectors (X1, S'0)'s thereof must be calculated for the 16 state mode and 9 previous states and 9 determination vectors (X1, X0)'s thereof must be extracted for the 8 state mode. As a result, only a half of area and a half of output time through the SMU are required.

Referring back to FIG. 7, the DOUT is for carrying out the intra-segment deinterleaving. That is, at a receiving end, received data containing a plurality of symbols should be decoded and, at the same time, intra-segment deinterleaved by a trellis decoder. Since the trellis decoder processes the received data on a symbol-by-symbol basis, each symbol containing two bits, and an external deinterleaver processes data on the byte-by-byte basis, one byte consisting of 8 bits, the trellis decoder receives decoded symbols from the survivor memory unit on the symbol-by-symbol basis; intra-segment deinterleaves the received symbols; and outputs the deinterleaved data on the byte-by-byte basis. To be more specific, one byte data is outputted at every 4 clocks and the intra-segment deinterleaving is accomplished in an inverse manner of the intra-segment interleaving.

While the present invention has been described with respect to the particular embodiments, it will be apparent to those skilled in the art that various changes and modifications may be made without departing from the spirit and scope of the invention as defined in the following claims.

What is claimed is:

1. A method for decoding a trellis encoded stream $d_k$ by the use of either an 8 state maximum likelihood response decoding mode, in short, an 8 state mode, through a Gaussian channel or a 16 state partial response decoding mode, in short, a 16 state mode, through a partial response channel, wherein the trellis encoded stream $d_k$ is obtained by an M symbol intra-segment interleaving technique using M number of trellis encoders and an index k for identifying a trellis encoded stream generated from a kth trellis encoder among total M trellis encoders is equal to or greater than 1 and equal to or smaller than M, M being a positive integer representing the number of the trellis encoders, the method comprising the steps of:

(a) in response to a mode selection signal FENA, passing off the trellis encoded stream for the 8 state mode and removing the influence of a segment synchronization signal from the trellis encoded stream for the 16 state mode;

(b) calculating branch metrics with different values in parallel for either the 8 or the 16 state mode determined based on the FENA;

(c) selecting a predetermined number of branch metrics required for each state among the branch metrics of either the 8 or the 16 state mode determined based on the FENA, thereby finding a predetermined number of candidate path metrics and determining a survivor metric and a determination vector thereof, wherein the survivor metric represents a candidate path metric with a maximum likelihood among all the candidate path metrics;

(d) providing the survivor metric for said each state determined in step (c) as a previous path metric for a previous state;

(e) tracing back for a decoding depth of the 8 or the 16 state mode in response to the FENA based on the determination vector of said each state determined in step (c), thereby finding a decoded symbol; and (f) intra-segment deinterleaving the decoded symbol and converting the intra-segment deinterleaved decoded symbol in the unit of a predetermined size of packet.

2. The method as recited in claim 1, wherein said removing step (a) includes the steps of;

(a1) delaying the trellis encoded stream for M clocks to generate an M-clock delayed previous trellis encoded stream;

(a2) adding a current trellis encoded stream to the M-clock delayed previous trellis encoded stream to generate an adding result; and (a3) providing the adding result if the current trellis encoded stream has the segment synchronization signal and the current trellis encoded stream if otherwise.

3. The method as recited in claim 1, wherein said calculating step (b) includes the steps:

(b1) selecting reference levels with different values for each branch in either the 8 or the 16 state mode determined based on the FENA; and (b2) obtaining absolute differences between the trellis encoded stream and the reference levels to provide the absolute differences as branch metrics in parallel.

4. The method as recited in claim 1, wherein said selecting step (c) includes the steps of:

(c1) adding said branch metrics for each state to previous path metrics for said each state to generate candidate path metrics;

(c2) comparing the candidate path metrics with each other to determine a smallest candidate path metric as a maximum likelihood path metric;

(c3) searching the maximum likelihood path metric to thereby generate an overflow indicator indicating whether there exists an overflow in the maximum likelihood path metric or not;

(c4) adjusting the maximum likelihood path metric based on the overflow indication signal to eliminate the overflow in the maximum likelihood path metric, thereby providing the adjusted maximum likelihood path metric as said survivor metric; and (c5) extracting a determination vector for the survivor metric.

5. The method as recited in claim 1, wherein said providing step (d) includes the steps of:

(d1) delaying the survivor metric for M clocks; and (d2) rearranging data of the survivor metric while receiving the segment synchronization signal.

6. The method as recited in claim 1, wherein said tracing back step (e) includes the steps of:

(e1) storing the determination vector stream for said each state;

(e2) classifying all determination vector streams according to their trellis encoders, thereby providing determination vectors of trellis encoded streams for each trellis encoder in parallel;

(e3) pursuing a first previous state for a decoding depth of the maximum likelihood response channel based on the determination vectors for each trellis encoder and a first current state so as to obtain a maximum likelihood response decoded symbol from the first previous state and pursuing a second previous state for a decoding depth of the partial response channel based on the determination vectors for each trellis encoder and a second current state so as to obtain a partial response decoded symbol from the second previous state; and (e4) selecting either the maximum likelihood response decoded symbol or the partial response decoded symbol based on the FENA.

7. The method as recited in claim 6, wherein the determination vector streams in said storing step (e1) are shifted sequentially to be stored in a receiving order thereof and rearranging the determination vector streams during a next one clock from the receipt of the segment synchronization signal so as to locate determination vector streams fed from the same encoder at each Mth symbol.

8. The method as recited in claim 6, wherein the second previous state (S'3, S'2, S'1, S'0) in the 16 state partial response mode is calculated as (S3⊕X1, S1⊕S0, S2, S'0) based on the second current state (S3, S2, S1, S0) and the determination vector (X1, S'0).

9. The method as recited in claim 6, wherein the first previous state (S'2, S'1, S'0) in the 8 state maximum likelihood response mode is calculated as (S2⊕X1, X0⊕S0, S1) based on the first current state (S2, S1, S0) and the determination vector (X1, X0).

10. The method as recited in claim 7, wherein said pursuing step (e3) is carried out simultaneously for each of M determination vector streams each clock.

11. An apparatus for decoding a trellis encoded stream $d_k$ by the use of either an 8 state maximum likelihood response decoding mode, in short, an 8 state mode, through a Gaussian channel or a 16 state partial response decoding mode, in short, a 16 state mode, through a partial response channel, wherein the trellis encoded stream $d_k$ is obtained by an M symbol intra-segment interleaving technique using M number of trellis encoders and an index k for identifying a trellis encoded stream generated from a kth trellis encoder among total M trellis encoders is equal to or greater than 1 and equal to or smaller than M, M being a positive integer representing the number of trellis encoders, the apparatus comprising:

a segment synchronization signal rejection filter, in response to a mode selection signal FENA, for passing off the trellis encoded stream for the 8 state mode and removing the influence of a segment synchronization signal from the trellis encoded stream for the 16 state mode, thereby generating a filtered trellis encoded stream FILTER_OUT;

a branch metric unit BMU for calculating branch metrics based on the FILTER_OUT for either the 8 or the 16 state mode in response to the FENA;

an add-compare-select ACS for selecting a predetermined number of branch metrics required for each state of either the 8 or the 16 state mode determined based on the FENA among the branch metrics fed from the BMU; and adding the selected branch metrics to a predetermined number of previous path metrics to find candidate path metric for each branch metric; and determining a survivor metric and a determination vector thereof, wherein the survivor metric represents a candidate path metric with a maximum likelihood among all candidate path metrics;

a path metric network PMN for storing the survivor metric from the ACS for each state and providing the stored survivor metric as a previous path metric for a next previous state to the ACS;

a survivor memory unit SMU for storing the determination vector of said each state and tracing back for a decoding depth in response to the FENA based on all determination vectors of all states, thereby finding a decoded symbol;

a deinterleaving and output processing unit DOUT for intra-segment deinterleaving the decoded symbol fed from the SMU and converting the intra-segment deinterleaved decoded symbol in the unit of a predetermined size of packet; and a control unit for controlling the segment synchronization rejection filter, the BMU, the ACS, the PMN, the SMU and the DOUT.

12. The apparatus as recited in claim 11, wherein said control unit includes:
- a PENA generator for generating a PMN enable signal PENA, which allows to activate the PMN;
- a SENA generator for generating a SMU enable signal SENA, which allows to activate the SMU;
- an OUTENA generator for generating a DOUT enable signal OUTENA, which allows to activate the DOUT;
- a BEENA generator for generating a BEENA signal, which notifies whether or not decoded data from the DOUT is valid;
- a combination logic circuit for generating a START UP signal, which notifies whether or not the trellis decoder can be started up;
- an 832 counter for generating a c832 signal, which represents the number of symbols in each segment;
- a 313 counter for generating a c313 signal, which represents the number of segments in each field.

13. The apparatus as recited in claim 11, wherein said segment synchronization signal rejection filter includes:
- delay means for delaying trellis encoded stream DATA_IN for M clocks to generate a delayed data;
- an adder for adding the DATA_IN to the delayed data to generate an adding result; and
- a multiplexor for selecting either the DATA_IN or the adding result.

14. The apparatus as recited in claim 13, wherein said delay means has M flip-flops connected in series to delay the DATA_IN for M clocks.

15. The apparatus as recited in claim 13, wherein said multiplexor selects the DATA_IN for the 8 state mode while either the DATA_IN or the adding result for the 16 state mode.

16. The apparatus as recited in claim 13, wherein said multiplexor begins to count from the time receiving a first segment synchronization signal among L segment synchronization signals for the 16 state mode and selects either the adding result during L clocks after counting M clocks or the DATA_IN during the remaining clocks except the L clocks.

17. The apparatus as recited in claim 13, wherein said multiplexor is controlled based on a control signal generated by an adding operation of both the FENA for identifying either the 8 or the 16 state mode and the c832 signal for counting the symbols of each segment to identify where the segment synchronization signal is.

18. The apparatus as recited in claim 11, wherein said BMU includes:
- a reference level selection module for selecting to provide in parallel reference levels for branches of either the 8 or the 16 state mode in response to the FENA;
- an adding module for providing in parallel differences between the reference levels and the FILTER_OUT;
- a branch selection module for selecting to provide in parallel either the differences or '0' in response to the FENA as branch outputs; and
- an absolute value calculation module for providing in parallel absolute values on the branch outputs as the branch metrics for said each state.

19. The apparatus as recited in claim 18, wherein said reference level selection module has:
- a first memory group for storing a plurality of reference levels based on either the 8 or the 16 state mode; and
- multiplexors for selecting to provide the reference levels stored in the first memory group in response to the FENA.

20. The apparatus as recited in claim 18, wherein said reference level selection module provides in parallel 7 reference levels of a 2nd to an 8th branches either among 8 level branches for the 8 state mode or 15 level branches for the 16 state mode, wherein 7 reference levels of the 2nd and the 8th branches represent '3', '5', '1', '−5', '−5', '−3', '−7' for the 8 state mode '4', '8', '12', '−2', '2', '6' and '10' for the 16 state mode, respectively.

21. The apparatus as recited in claim 19, wherein said adding module has:
- a memory group for storing a plurality of reference levels based on either the 8 or the 16 state mode; and
- a multiplicity of adders, some adders for providing differences between the FILTER_OUT from the synchronization rejection filter and the reference levels from the reference level selection module, respectively, and the other adders for providing differences between the FILTER_OUT and the reference levels from the second memory group, respectively.

22. The apparatus as recited in claim 21, said adding module receives a 1st reference level '7' of the 8 state mode, the 2nd to the 8th reference levels from the reference level selection module and a 9th to a 15th reference levels '14', '−4', '−6', '−8', '−10', '−12' and '−14' of the 16 state mode, respectively.

23. The apparatus as recited in claim 18, wherein, in response to the FENA, a 1st to an 8th branch metrics for the 8 state mode are calculated as |FILTER_OUT+7|, |FILTER_OUT+3|, |FILTER_OUT+5|, |FILTER_OUT+1|, |FILTER_OUT−1|, |FILTER_OUT−5|, |FILTER_OUT−3| and |FILTER_OUT−7|, respectively.

24. The apparatus as recited in claim 18, wherein, in response to the FENA, a 1st to a 15th branch metrics for the 16 state mode are calculated as |FILTER_OUT|, |FILTER_OUT+4|, |FILTER_OUT+8|, |FILTER_OUT+12|, |FILTER_OUT−2|, |FILTER_OUT+2|, |FILTER_OUT+6|, |FILTER_OUT+10|, |FILTER_OUT+14|, |FILTER_OUT−4|, |FILTER_OUT−6|, |FILTER_OUT−8|, |FILTER_OUT−10|, |FILTER_OUT−12| and |FILTER_OUT−14|, respectively.

25. The apparatus as recited in claim 11, wherein said ACS includes:
- a maximum likelihood path calculation module for receiving 4 branch metrics and 4 previous path metrics for each state in response to the FENA to provide a maximum likelihood path metric (PM_OUT) and a determination vector thereof;
- an overflow control module for generating an overflow indicator in response to the FENA, wherein the overflow indicator represents whether or not the PM_OUT is in an overflow state based on a most significant bit (MSB) of the PM_OUT; and
- an output module for adjusting the PM_OUT based on the overflow indicator, thereby providing the adjusted PM_OUT as the survivor metric for said each state.

26. The apparatus as recited in claim 25, wherein said maximum likelihood path calculation module has a plurality of processing elements connected in parallel.

27. The apparatus as recited in claim 26, wherein each processing element selects 4 branch metrics and 4 path metrics for each state among all the branch metrics from the ACS and all the path metrics from PMN, respectively, based on the FENA; adds the branch metrics to the path metrics for said each state, respectively, to obtain 4 candidate path metrics; compares the candidate path metrics with each other; selects a candidate path metric with a minimum distance as the PM_OUT; and determinates input bits (X1, X0) of the PM_OUT as the determination vector thereof, wherein the minimum distance corresponds to the maximum likelihood.

28. The apparatus as recited in claim 25, wherein, for the 16 state mode in response to the FENA, 4 candidate path metrics ($ADD_{i,j}$) for each state i are calculated as follows:

$ADD_{0,1}$=BM1+PM0, $ADD_{0,2}$=M2+PM1, $ADD_{0,3}$=BM3+PM8 and $ADD_{0,4}$=BM4+PM9 for a 0th state;

$ADD_{1,1}$=BM5+PM4, $ADD_{1,2}$=BM6+PM5, $ADD_{1,3}$=BM7+PM12 and $ADD_{1,4}$=BM8+PM13 for a 1st state;

$ADD_{2,1}$=BM6+PM4, $ADD_{2,2}$=BM7+PM5, $ADD_{2,3}$=BM8+PM12 and $ADD_{2,4}$=BM9+pM13 for a 2nd state;

$ADD_{3,1}$=BM10+PM0, $ADD_{3,2}$=BM1+PM1, $ADD_{3,3}$=BM2+PM8 and $ADD_{3,4}$=BM3+PM9 for a 3rd state;

$ADD_{4,1}$=BM5+PM2, $ADD_{4,2}$=BM6+PM3, $ADD_{4,3}$=BM7+PM10 and $ADD_{4,4}$=BM8+PM11 for a 4th state;

$ADD_{5,1}$=BM10+PM6, $ADD_{5,2}$=BM1+PM7, $ADD_{5,3}$=BM2+PM14 and $ADD_{5,4}$=BM3+PM15 for a 5th state;

$ADD_{6,1}$=BM1+PM6, $ADD_{6,2}$=BM2+PM7, $ADD_{6,3}$=BM3+PM14 and $ADD_{6,4}$=BM4+PM15 for a 6th state;

$ADD_{7,1}$=BM11+PM2, $ADD_{7,2}$=BM5+PM3, $ADD_{7,3}$=BM6+PM10 and $ADD_{7,4}$=BM7+PM11 for a 7th state;

$ADD_{8,1}$=BM12+PM0, $ADD_{8,2}$=BM10+PM1, $ADD_{8,3}$=BM1+PM8 and $ADD_{8,4}$=BM2+PM9 for an 8th state;

$ADD_{9,1}$=BM13+PM4, $ADD_{9,2}$=BM11+PM5, $ADD_{9,3}$=BM5+PM12 and $ADD_{9,4}$=BM6+PM13 for a 9th state;

$ADD_{a,1}$=BM11+PM4, $ADD_{a,2}$=BM5+PM5, $ADD_{a,3}$=BM6+PM12 and $ADD_{a,4}$=BM7+PM13 for a 10th state;

$ADD_{b,1}$=BM14+PM0, $ADD_{b,2}$=BM12+PM1, $ADD_{b,3}$=BM10+PM8 and $ADD_{b,4}$=BM1+PM9 for an 11th state;

$ADD_{c,1}$=BM13+PM2, $ADD_{c,2}$=BM11+PM3, $ADD_{c,3}$=BM5+PM10 and $ADD_{c,4}$=BM6+PM11 for a 12th state;

$ADD_{d,1}$=BM14+PM6, $ADD_{d,2}$=BM12+PM7, $ADD_{d,3}$=BM10+PM14 and $ADD_{d,4}$=BM1+PM15 for a 13th state;

$ADD_{e,1}$=BM12+PM6, $ADD_{e,2}$=BM10+PM7, $ADD_{e,3}$=BM1+PM14 and $ADD_{e,4}$=BM2+PM15 for a 14th state;

$ADD_{f,1}$=BM15+PM2, $ADD_{f,2}$=BM13+PM3, $ADD_{f,3}$=BM11+PM10 and $ADD_{f,4}$=BM5+PM11 for a 15th state; and wherein BMj represents a branch metric for each state j and PMi represents a path metric for each state i.

29. The apparatus as recited in claim 25, wherein the determination vector for each PM_OUT in the 16 state mode is calculated as follows:

for the higher 0 to 7 states of the 16 state mode, a first candidate path metric $ADD_{i,1}$ corresponds to the determination vector (X1, S0)=(0, 0); a second candidate metric $ADD_{i,2}$ to the determination vector (X1, S0)=(0, 1); a third candidate metric $ADD_{i,3}$ to the determination vector (X1, S0)=(1, 0); and a fourth candidate metric $ADD_{i,4}$ to the determination vector (X1, S0)=(1, 1) and for the lower 8 to 15 states of the 16 state mode, a first candidate metric $ADD_{i,1}$ corresponds to the determination vector (X1, S0)=(1, 0); a second candidate metric $ADD_{i,2}$ to the determination vector (X1, S0)=(1, 1); a third candidate metric $ADD_{i,3}$ to the determination vector (X0, S0)=(1, 0); and a fourth candidate metric $ADD_{1,4}$ to the determination vector (X1, S0)=(0, 1).

30. The apparatus as recited in claim 25, for the 8 state mode in response to the FENA, 4 candidate path metrics ($ADD_{i,j}$) for each state i are calculated as follows:

$AD_{0,1}$=BM1+PM0, $ADD_{0,2}$=BM2+PM2, $ADD_{0,3}$=BM1+PM4 and $ADD_{0,4}$=BM2+PM6 for a 0th state;

$ADD_{1,1}$=BM2+PM0, $ADD_{1,2}$=BM1+PM2, $ADD_{1,3}$=BM2+PM4 and $ADD_{1,4}$=BM1+PM6 for a 1st state;

$ADD_{2,1}$=BM3+PM1, $ADD_{2,2}$=BM4+PM3, $ADD_{2,3}$=BM3+PM5 and $ADD_{2,4}$=BM4+PM7 for a 2nd state;

$ADD_{3,1}$=BM4+PM1, $ADD_{3,2}$=BM3+PM3, $ADD_{3,3}$=BM4+PM5 and $ADD_{3,4}$=BM3+PM7 for a 3rd state;

$ADD_{4,1}$=BM5+PM0, $ADD_{4,2}$=BM6+PM2, $ADD_{4,3}$=BM5+PM4 and $ADD_{4,4}$=BM6+PM6 for a 4th state:

$ADD_{5,1}$=BM6+PM0, $ADD_{5,2}$=BM5+PM2, $ADD_{5,3}$=BM6+PM4 and $ADD_{5,4}$=BM5+PM6 for a 5th state;

$ADD_{6,1}$=BM7+PM1, $ADD_{6,2}$=BM8+PM3, $ADD_{6,3}$=BM7+PM5 and $ADD_{6,4}$=BM8+PM7 for a 6th state;

$ADD_{7,1}$=BM8+PM1, $ADD_{7,2}$=BM7+PM3, $ADD_{7,3}$=BM8+PM5 and $ADD_{7,4}$=BM7+PM7 for a 7th state; and wherein BMj represents a branch metric for each state j and PMi represents a path metric for each state i.

31. The apparatus as recited in claim 25, wherein the determination vector for each PM_OUT in the 8 state mode is calculated as follows:

for a 0th state (000) and a 2nd state (010), a 1st candidate path metric $ADD_{i,1}$ corresponds to a determination vector (X1, X0)=(0, 0); a 2nd candidate path metric $ADD_{i,2}$ to a determination vector (X1, X0)=(0, 1); a 3rd candidate path metric $ADD_{i,3}$ to the determination vector (X1, X0)=(1, 0) ; and a 4th candidate path metric $ADD_{i,4}$ to the determination vector (X1, X0)=(1, 1);

for a 1st state (001) and a 3rd state (011), a 1st candidate path metric $ADD_{i,1}$ corresponds to a determination vector (X1, X0)=(0, 1); a 2nd candidate path metric $ADD_{i,2}$ to a determination vector (X1, X0)=(0, 0); a 3rd candidate path metric $ADD_{i,3}$ to the determination vector (X1, X0)=(1, 1); and a 4th candidate path metric $ADD_{i,4}$ to the determination vector (X1, X0)=(1, 0);

for a 4th state (100) and a 6th state (110), a 1st candidate path metric $ADD_{i,1}$ corresponds to a determination vector (X1, X0)=(1, 0); a 2nd candidate path metric $ADD_{i,2}$ to a determination vector (X1, X0)=(1, 1); a 3rd candidate path metric $ADD_{i,3}$ to the determination vector (X1, X0)=(0, 0); and a 4th candidate path metric $ADD_{i,4}$ to the determination vector (X1, X0)=(0, 1); and for the 5th state (101) and the 7th state (111), a 1st candidate path metric $ADD_{i,1}$ corresponds to a determination vector (X1, X0)=(1, 1); a 2nd candidate path metric $ADD_{i,2}$ to a determination vector (X1, X0)=(1, 0); a 3rd candidate path metric $ADD_{i,3}$ to the determination vector (X1, X0)=(0, 1); and a 4th candidate path metric $ADD_{i,4}$ to the determination vector (X1, X0)=(0, 0).

32. The apparatus as recited in claim 26, wherein said each processing element has:

a plurality of multiplexors, each multiplexor for selecting either a branch metric BMu or a previous path metric PMi in response to the FENA, thereby generating 4 branch metrics and 4 previous path metrics for each state;

a multiplicity of adders for adding the 4 branch metrics BMu's to corresponding previous path metric PMi's, respectively, thereby providing 4 candidate path metrics $ADD_{i,j}$'s; and a number of compare-select means for comparing the 4 candidate path metrics with each other, thereby providing a candidate path metric with a minimum distance as the maximum likelihood path metric PM_OUT, and extracting input bits (X1, X0) for the PM_OUT as determination vector thereof.

33. The apparatus as recited in claim 25, wherein said overflow indicator is generated by an adding operation for all MSB's of all PM_OUT's.

34. The apparatus as recited in claim 25, wherein said output module provides either '0' for a overflow of the PM_OUT or the MSB of the PM_OUT for a non-overflow of the PM_OUT based on the overflow indicator.

35. The apparatus as recited in claim 25, wherein said overflow indicator indicates that the PM_OUT is in an overflow state only if MSB's of all PM_OUT's are equal to '1'.

36. The apparatus as recited in claim 25, wherein said output module has a number of multiplexors connected in parallel, each multiplexor selecting either '0' or the MSB's of the PM_OUT based on the overflow indicator.

37. The apparatus as recited in claim 11, wherein said PMN includes:
a delay memory module for delaying the survivor metric $SM_i(t)$ of each state for M symbol clocks, thereby providing the delayed survivor metric as a previous path metric $PM_j(t)$ of a next state; and
selection module for selecting either a survivor metric fed in response to a rearray signal RE_ARRAY or another survivor metric directly fed back from the delay memory module, thereby returning the selected survivor metric to the delay memory module, wherein the RE_ARRAY is for rearranging the sequence of the data in the delay memory module.

38. The apparatus as recited in claim 37, wherein said delay memory module has a plurality of delay registers connected in parallel, each delay register for delaying the survivor metric SMi for M symbol clocks.

39. The apparatus as recited in claim 38, wherein said each register contains M serial-input serial-output shift registers.

40. The apparatus as recited in claim 38, wherein said selection module has a number of multiplexors connected in parallel, each multiplexor for returning the output of the delay register to the input thereof for L clocks during which the segment synchronization signal is received, while providing the survivor metric $SM_i$ from the ACS to the input end of the delay register for the remaining clocks.

41. The apparatus as recited in claim 11, wherein said SMU includes:
a data delay processor for storing the determination vectors of the survivor path metrics from the ACS and for classifying the determination vectors delayed for a predetermined clocks into a set of determination vectors for each trellis encoder, thereby providing each set of the determination vectors in parallel; and
a traceback processor for obtaining maximum likelihood response decoded symbols and partial response decoded symbols by a maximum likelihood response traceback algorithm and a partial response traceback algorithm based on each set of determination vectors, respectively, and for selecting either the maximum likelihood response decoded symbols or the partial response decoded symbols in response to the FENA.

42. The apparatus as recited in claim 41, wherein said data delay processor has N delay registers, connected in serial, for tracing back as far as a decoding depth N, N being a positive integer representing the number of the registers,
a 1st delay register for delaying the determination vector from said each state for a predetermined clocks, thereby providing the delayed determination vector to a 2nd delay register and the traceback processor; and
a (k+1)st delay register for delaying the determination vector from kth delay register for M symbol clocks, thereby providing the delayed determination vector to a next delay register and the traceback processor, k is an integer equal to or greater than 0 and equal to or smaller than N−1.

43. The apparatus as recited in claim 42, wherein said 2nd to said Nth registers contain:
M registers for storing the determination vectors; and
M multiplexors for selecting input data of M registers in response to an array control signal ARRAY_CTRL, whereby the determination vectors of encoded data from the same trellis encoder are stored in every Mth register store.

44. The apparatus as recited in claim 43, wherein said ARRAY_CTRL maintains a first level during 1 clock from the receipt of the segment synchronization signal and turns to be a second level for the remaining clocks, whereby input data for M registers are rearranged based on the ARRAY_CTRL.

45. The apparatus as recited in claim 44, wherein the input data of a (k+1)st register among the M registers is selected as either the output of a ((k+(M−L))% M)th register (IN(k+1)←OUT((k+(M−L)) % M)) for the first level of the ARRAY_CTRL or the output of a kth register (IN(k+1)←OUT(k)) for the second level of the ARRAY_CTRL, wherein L is the number of symbols of the segment synchronization signal.

46. The apparatus as recited in claim 41, wherein said traceback processor has:
a first operation module containing N processing elements, whereby a partial response decoded symbol is calculated by tracing back the determination vectors of the 16 state partial response channel mode for a 16 state decoding depth N;
a second operation module containing T processing elements, whereby a maximum likelihood response decoded symbol is calculated by tracing back the determination vectors of the 8 state maximum likelihood response channel mode for an 8 state decoding depth T; and
a mode selection module for selecting either the partial response decoded symbol or the maximum likelihood response decoded symbol based on the FENA.

47. The apparatus as recited in claim 46, wherein said 16 state decoding depth N is larger than said 8 state decoding depth.

48. The apparatus as recited in claim 46, wherein said first operation module contains N processing elements connected in series,
kth processing element among a 1st to an (N−1)st processing elements possessing:
a memory for storing a previous state fed from a previous (k−1)st processing element as a current state (S3, S2, S1, S0);
a multiplexor for selecting one (X1, S'0) of determination vectors fed from a kth delay register of the data delay processor based on the current state (S3, S2, S1, S0); and
a previous state calculator for calculating a previous state (S'3, S'2, S'1, S'0)=(S3⊕X1, S1⊕S0, S2, S'0)

based on the current state (S3, S2, S1, S0) and the determination vector (X1, S'0), thereby providing the previous state to a next (k+1)th processing element, and an Nth processing element possessing:
  a memory for storing a previous state fed from the (N−1)st processing element as a current state (S3, S2, S1, S0);
  a multiplexor for selecting one (X1, S'0) of determination vectors fed from an Nth delay register of the data delay processor based on the current state (S3, S2, S1, S0); and
  a memory for storing a lowest bit S0 of the current state (S3, S2, S1, S0) and a higher bit X1 of the determination vector (X1, S'0) as the partial response decoded symbol.

49. The apparatus as recited in claim 46, wherein said 2nd operation module contains T processing elements connected in series, a kth processing element among a 1st to an (N−1)st processing elements possessing:
    a memory for storing a previous state fed from a previous (k−1)st processing element as a current state (S2, S1, S0);
    a multiplexor for selecting one (X1, X0) of determination vectors fed from a kth delay register of the data delay processor based on the current state (S3, S2, S1, S0); and
    a previous state calculator for calculating a previous state (S'2, S'1, S'0)=(S2⊕X1, X0⊕S0, S1) based on the current state (S2, S1, S0) and the determination vector (X1, X0), thereby providing the previous state to a next (k+1)st processing element, and Tth processing element possessing:
    a memory for storing a previous state fed from the (T−1)th processing element as a current state (S2, S1, S0);
    a multiplexor for selecting one (X1, X0) of determination vectors fed from an Nth delay register of the data delay processor based on the current state (S2, S1, S0); and
    a memory for storing the determination vector (X1, X0) from the multiplexor as the maximum likelihood response decoded symbol.

* * * * *